US008351982B2

(12) United States Patent
Rofougaran

(10) Patent No.: US 8,351,982 B2
(45) Date of Patent: Jan. 8, 2013

(54) FULLY INTEGRATED RF TRANSCEIVER INTEGRATED CIRCUIT

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 1630 days.

(21) Appl. No.: 11/805,563

(22) Filed: May 23, 2007

(65) Prior Publication Data

US 2008/0293446 A1    Nov. 27, 2008

(51) Int. Cl.
*H04M 1/00* (2006.01)
(52) U.S. Cl. .................. 455/552.1; 455/334; 343/700 R
(58) Field of Classification Search ................ 455/552.1, 455/333–341, 120–125; 361/748–750, 760–764
See application file for complete search history.

(56) References Cited

U.S. PATENT DOCUMENTS

| | | | | |
|---|---|---|---|---|
| 5,159,465 A | * | 10/1992 | Maemura et al. | ............. 358/405 |
| 6,377,464 B1 | * | 4/2002 | Hashemi et al. | ............. 361/760 |
| 2004/0218683 A1 | * | 11/2004 | Batra et al. | .................... 375/261 |
| 2005/0026647 A1 | * | 2/2005 | Li et al. | ........................ 455/552.1 |
| 2005/0059377 A1 | * | 3/2005 | Schucker et al. | ............ 455/334 |
| 2006/0158378 A1 | * | 7/2006 | Pons et al. | ............ 343/700 MS |

* cited by examiner

*Primary Examiner* — Kamran Afshar
*Assistant Examiner* — Kashif Siddiqui
(74) *Attorney, Agent, or Firm* — Garlick & Markison; Bruce E. Stuckman

(57) ABSTRACT

A radio transceiver device includes circuitry for radiating electromagnetic signals at a very high radio frequency both through space, as well as through wave guides that are formed within a substrate material. In one embodiment, the substrate comprises a dielectric substrate formed within a board, for example, a printed circuit board. In another embodiment of the invention, the wave guide is formed within a die of an integrated circuit radio transceiver. A plurality of transceivers with different functionality is defined. Substrate transceivers are operable to transmit through the wave guides, while local transceivers are operable to produce very short range wireless transmissions through space. A third and final transceiver is a typical wireless transceiver for communication with remote (non-local to the device) transceivers. Additionally, a multi-mode transceiver is operable to configure transmit and receive circuitry based upon transmission path.

31 Claims, 61 Drawing Sheets

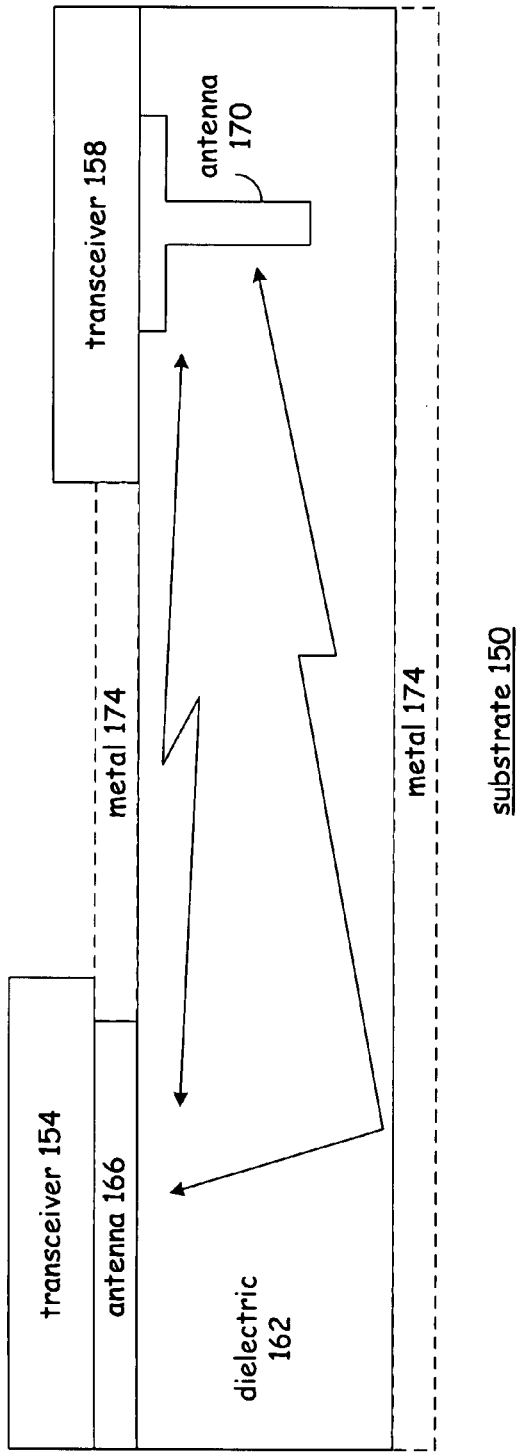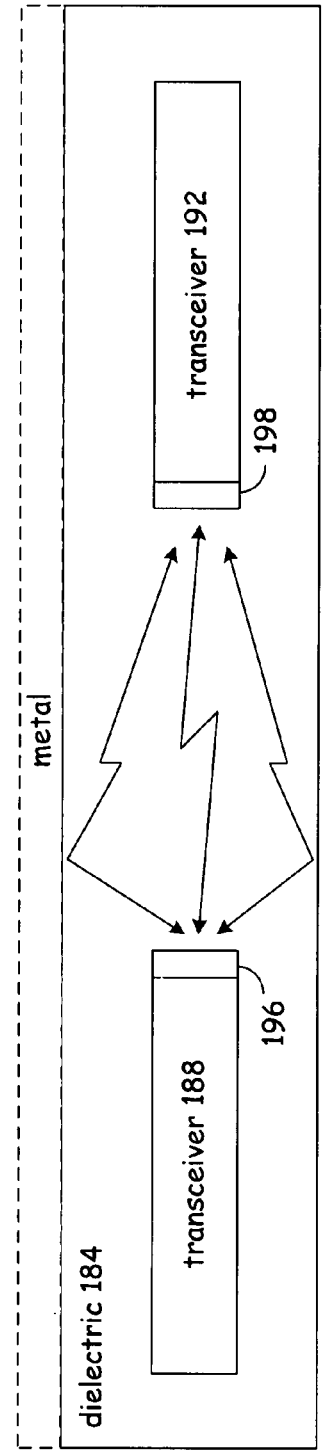
FIG. 3
FIG. 4

FIG. 16

| transceiver ID | transceiver ID | assigned subcarrier | frequency modulation type |
|---|---|---|---|
| A | B | $f_1$ | 128 QAM |
| A | C | $f_2$ | 128 QAM |
| B | C | $f_3$ | 64 QAM |
| B | D | $f_4$ | 64 QAM |
| D | E | $f_5$ | 64 QAM |
| B | E | $f_6$ | 64 QAM |
| C | E | $f_1$ | 64 QAM |
| E | F | $f_8$ | 64 QAM |
| C | F | $f_7$ | 64 QAM |
| F | G | $f_2$ | 64 QAM |
| G | D | $f_8$ | 8 QAM |
| H | remote device | $f_{12}$ | QPSK |
| substrate $_M$ | substrate $_N$ | $f_{10}$ | 256 QAM |
| substrate $_M$ | substrate $_O$ | $f_{11}$ | 256 QAM |

| target antenna | micro-filter 1 tap point | micro-filter 2 tap point | transmission frequency | voltage setting for elect. field |
|---|---|---|---|---|
| receiver a | 2 | 3 | N.P GHz | 2.20 VDC |
| receiver b | 1 | 4 | N.Q GHz | 2.30 VDC |
| receiver c | 4 | 4 | N.T GHz | 0.00 VDC |

3450 — generate a very high frequency radio frequency (RF) signal having a specified frequency of at least 20 GHz 3454 — produce the very high RF signal as a multi-component signal having first and second components to a dual input micro-filter module 3458 — selecting a tap point of the micro-filter module that corresponds to a desired filter response 3462 — transmitting the very high RF electromagnetic signals from a plurality of antenna components to create a beam formed signal aimed to a target receiver antenna 3466 — creating a standing wave within a wave guide at a substrate antenna operably coupled to a receiver for which a signal is being transmitted

FIG. 58

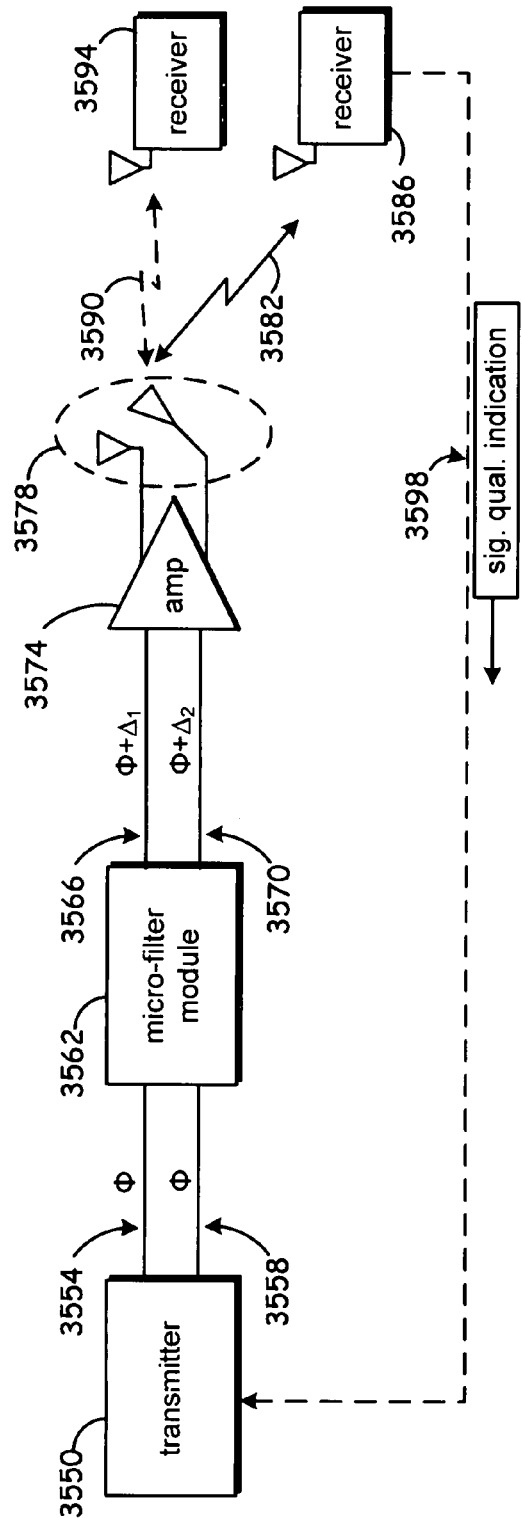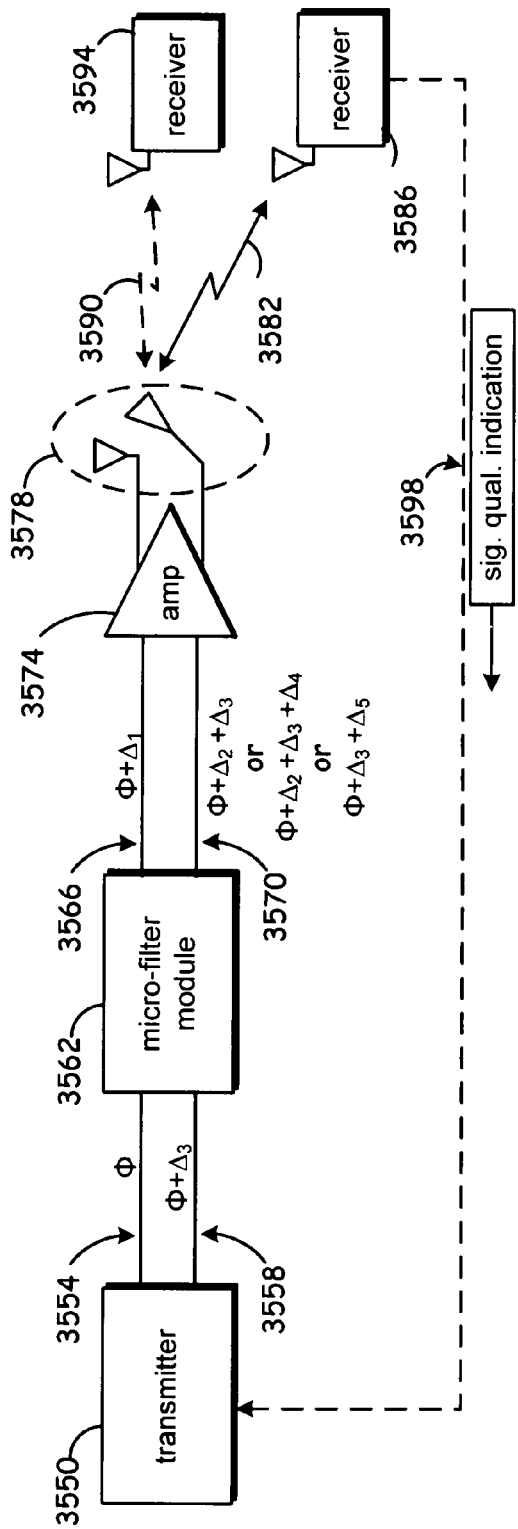

Multi-mode transmission module 4020

US 8,351,982 B2

FULLY INTEGRATED RF TRANSCEIVER INTEGRATED CIRCUIT

BACKGROUND

1. Technical Field

The present invention relates to wireless communications and, more particularly, to circuitry for wireless communications.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

As integrated circuit die decrease in size while the number of circuit components increases, chip layout becomes increasingly difficult and challenging. Amongst other known problems, there is increasingly greater demand for output pins to a die even though the die size is decreasing. Similarly, within the die itself, the challenge of developing internal buses and traces to support high data rate communications becomes very challenging. A need exists, therefore, for solutions that support the high data rate communications and reduce the need for pin-outs and for circuit traces within the bare die. Moreover, advancements in communication between ICs collocated within a common device or upon a common printed circuit board is needed to adequately support the forth-coming improvements in IC fabrication. Therefore, a need exists for an integrated circuit antenna structure and wireless communication applications thereof.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 3 is a functional block diagram of a substrate configured according to one embodiment of the invention;

FIG. 4 is a functional block diagram of an alternate embodiment of a substrate that includes a plurality of embedded substrate transceivers;

FIG. 16 is a table illustrating an example of assignment static or permanent assignment of carrier frequencies to specified communications between intra-device local transceivers, substrate transceivers, and other transceivers within a specified device;

FIG. 57 is a table that illustrates operation according to one embodiment of the invention;

FIG. 58 is a flow chart that illustrates a method for transmitting a beam formed signal according to one embodiment of the invention;

FIGS. 61 and 62 are functional block diagrams of a transmitter operable to generate directional beam formed signals and that illustrate operation according to one embodiment of the invention;

DETAILED DESCRIPTION OF THE DRAWINGS

Figure 1:
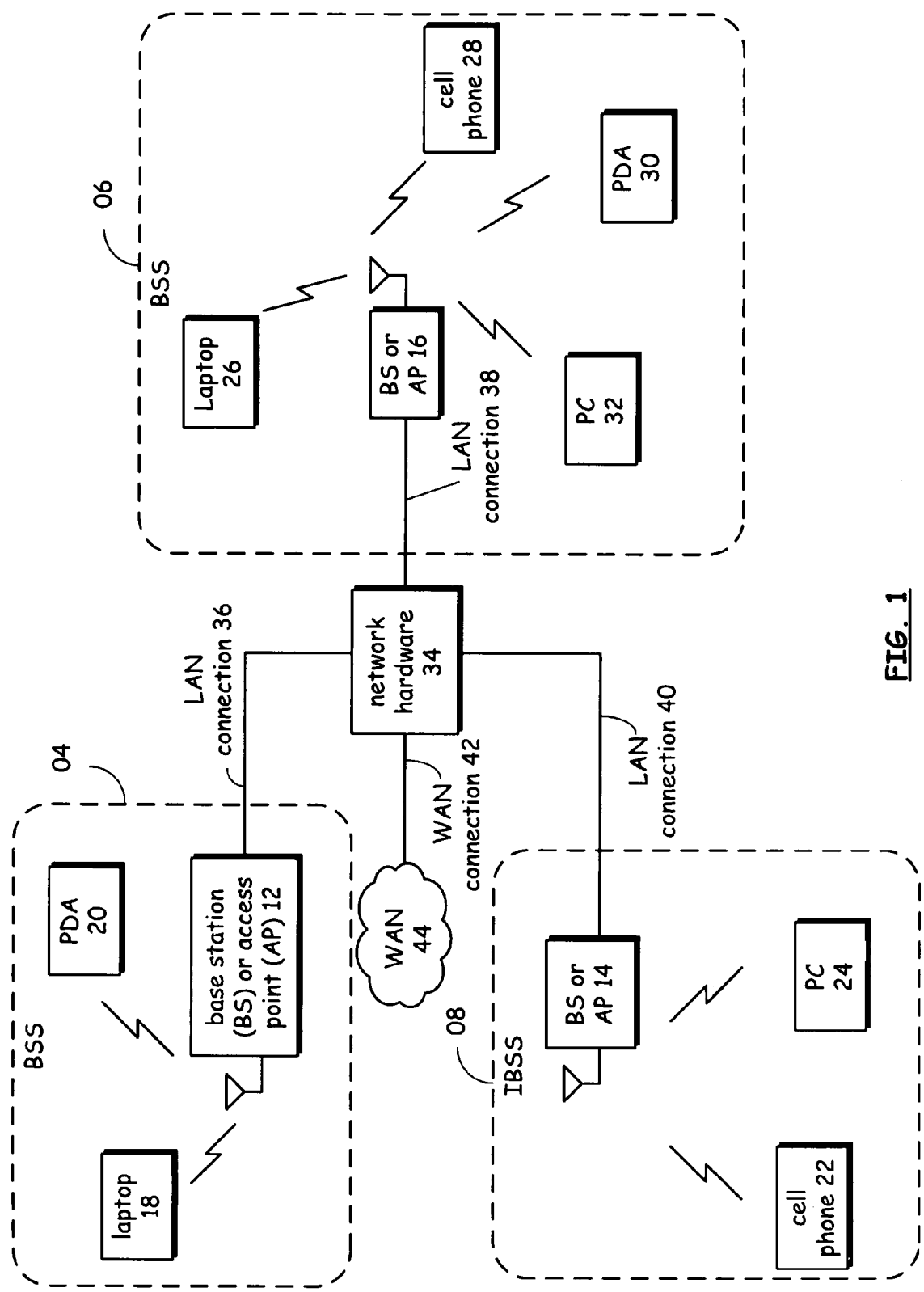
FIG. 1 is a schematic block diagram illustrating a wireless communication device that includes a host device and an associated radio.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-10.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. For purposes of the present specification, each wireless communication device of FIG. 1 including host devices 18-32, and base stations or APs 12-16, includes at least one associated radio transceiver for wireless communications with at least one other remote transceiver of a wireless communication device as exemplified in FIG. 1. More generally, a reference to a remote communication or a remote transceiver refers to a communication or transceiver that is external to a specified device or transceiver. As such, each device and communication made in reference to Figure one is a remote device or communication. The embodiments of the invention include devices that have a plurality of transceivers operable to communicate with each other. Such transceivers and communications are referenced here in this specification as local transceivers and communications.

Figure 2:
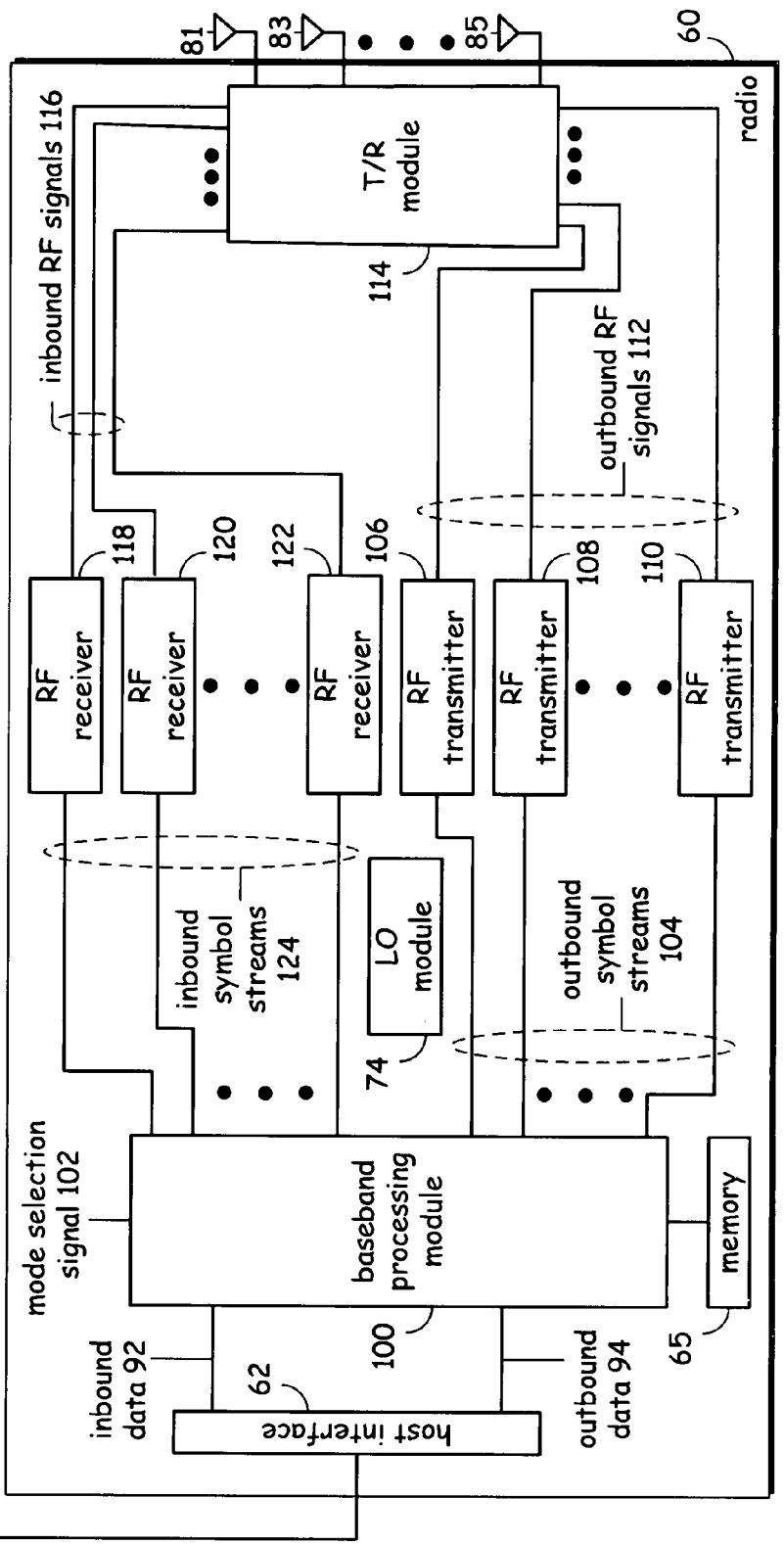
FIG. 2 is a schematic block diagram illustrating a wireless communication device that includes a host device and an associated radio.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 2 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

FIG. 2 generally illustrates a MIMO transceiver and is useful to understanding the fundamental blocks of a common transceiver. It should be understood that any connection shown in FIG. 2 may be implemented as a physical trace or as a wireless communication link. Such wireless communication links are supported by local transceivers (not shown in FIG. 2) that are operable to transmit through space or through an electromagnetic wave guide formed within a substrate of a printed circuit board housing the various die that comprise the MIMO transceiver or within a substrate of a die (e.g., a dielectric substrate). Illustrations of circuitry and substrate structures to support such operations are described in greater detail in the Figures that follow.

It is generally known that an inverse relationship exists between frequency and signal wavelength. Because antennas for radiating radio frequency signals are a function of a signal wavelength, increasing frequencies result in decreasing wavelengths which therefore result in decreasing antenna lengths to support such communications. In future generations of radio frequency transceivers, the carrier frequency will exceed or be equal to at least 10 GHz, thereby requiring a relatively small monopole antenna or dipole antenna. A monopole antenna will typically be equal to a size that is equal to a one-half wavelength, while a dipole antenna will be equal to a one-quarter wavelength in size. At 60 GHz, for example, a full wavelength is approximately 5 millimeters. Thus a monopole antenna size will be approximately equal to 2.5 millimeters and dipole antenna size will be approximately equal to 1.25 millimeters. With such a small size, the antenna may be implemented on the printed circuit board of the package and/or on the die itself. As such, the embodiments of the invention include utilizing such high frequency RF signals to allow the incorporation of such small antenna either on a die or on a printed circuit board.

Printed circuit boards and die often have different layers. With respect to printed circuit boards, the different layers have different thickness and different metallization. Within the layers, dielectric areas may be created for use as electromagnetic wave guides for high frequency RF signals. Use of such wave guides provides an added benefit that the signal is isolated from outside of the printed circuit board. Further, transmission power requirements are reduced since the radio frequency signals are conducted through the dielectric in the wave guide and not through air. Thus, the embodiments of the present invention include very high frequency RF circuitry, for example, 60 GHz RF circuitry, which are mounted either on the printed circuit board or on the die to facilitate corresponding communications.

FIG. 3 is a functional block diagram of a substrate configured according to one embodiment of the invention that includes a dielectric substrate operable as an electromagnetic wave guide according to one embodiment of the present invention. Referring to FIG. 3, it may be seen that a substrate 150 includes a transceiver 154 that is operably disposed to communicate with a transceiver 158. References herein to substrates generally refer to any supporting substrate and specifically include printed circuit boards and other boards that support integrated circuits and other circuitry. References to substrate also include semiconductor substrates that are part of integrated circuits and die that support circuit elements and blocks. Thus, unless specifically limited herein this specification to a particular application, the term substrate should be understood to include all such applications with their varying circuit blocks and elements. Thus, with reference to substrate 150 of FIG. 3, the substrate 150 may be a printed circuit board wherein the transceivers may be separate integrated circuits or die operably disposed thereon. Alternatively, substrate 150 may be a integrated circuit wherein the transceivers are transceiver modules that are a part of the integrated circuit die circuitry.

In the described embodiment of the invention, transceiver 154 is communicatively coupled to antenna 166, while transceiver 158 is communicatively coupled to antenna 170. The first and second substrate antennas 166 and 170, respectively, are operably disposed to transmit and receive radio frequency communication signals through the substrate region 162 which, in the described embodiment, is a dielectric substrate region. As may be seen, antenna 166 is operably disposed upon a top surface of dielectric substrate 162, while antenna 170 is operably disposed to penetrate into dielectric substrate 162. Each of these antenna configurations exemplifies different embodiments for substrate antennas that are for radiating and receiving radio frequency signals transmitted through dielectric substrate 162. As may further be seen from examining FIG. 3, an optional metal layer 174 may be disposed upon either or both of a top surface and a bottom surface of dielectric substrate 162. Metal layers 174 are operable to further isolate and shield the electromagnetic waves transmitted through dielectric substrate 162 as high frequency RF. The use of such metal layers 174 is especially applicable to embodiments of the invention in which the substrate comprises a printed circuit board but can include any structure having a deposited metal layer thereon.

In operation, transceiver 154 is a very high frequency transceiver that generates electromagnetic signals having a frequency that is greater than or equal to 10 GHz. In one specific embodiment of the invention, the electromagnetic signals are characterized by a 60 GHz (+/−5 GHz) radio frequency. One corresponding factor to using such high frequency electromagnetic signals is that short antenna lengths may be utilized that are sized small enough to be placed on or within a substrate whether that substrate is a printed circuit board or a bare die. Thus, transceiver 154 is operable to radiate through dielectric substrate 162 through antenna 166 for reception by antenna 170 for substrate transceiver 158. These transceivers are specifically named substrate transceivers herein to refer to transceivers that have been designed to communicate through a dielectric substrate, such as that shown in FIG. 3.

It should be noted that dielectric substrate 162 is defined by a bound volume, regardless of whether metal layers 174 are included, and is the equivalent of an electromagnetic wave guide and shall be referenced herein as such. In general terms, it is expected that dielectric substrate 162 will have a reasonably uniform fabrication in expected transmission areas to reduce interference within the dielectric substrate 162. For example, metal components, or other components within the dielectric substrate, will tend to create multi-path interference and/or absorb the electromagnetic signals thereby reducing the effectiveness of the transmission. With a reasonably uniform or consistent dielectric substrate, however, low power signal transmissions may be utilized for such short range communications.

FIG. 4 is a functional block diagram of an alternate embodiment of a substrate that includes a plurality of embedded substrate transceivers. As may be seen, a substrate 180 includes a dielectric substrate region 184 that includes embedded substrate transceivers 188 and 192 that are operable to communicate with each other. As may be seen, substrate transceiver 188 includes a substrate antenna 196, while substrate transceiver 192 includes a second substrate antenna 198.

Substrate transceivers 188 and 192 are operably disposed within the dielectric substrate 184, as is each of their antennas 196 and 198, respectively, and are operable to transmit the very high frequency electromagnetic signals through the wave guide, which is formed by dielectric substrate 184. As described in relation to FIG. 3, a metal layer is optional but not required.

Generally, while the metal layer is not required either on the top or bottom layer of the substrate, the metal is helpful to isolate the electromagnetic signals contained within the wave guide to reduce interference of those signals with external circuitry or the signals from external circuitry to interfere with the electromagnetic signals transmitted through the wave guide. The boundary of the dielectric substrate reflects the radio frequency of electromagnetic signals to keep the signals within the dielectric substrate 184 and therefore minimize interference with external circuitry and devices on top of or within the dielectric. The substrate antennas are sized and placed to radiate only through the dielectric substrate 184.

Figure 5:
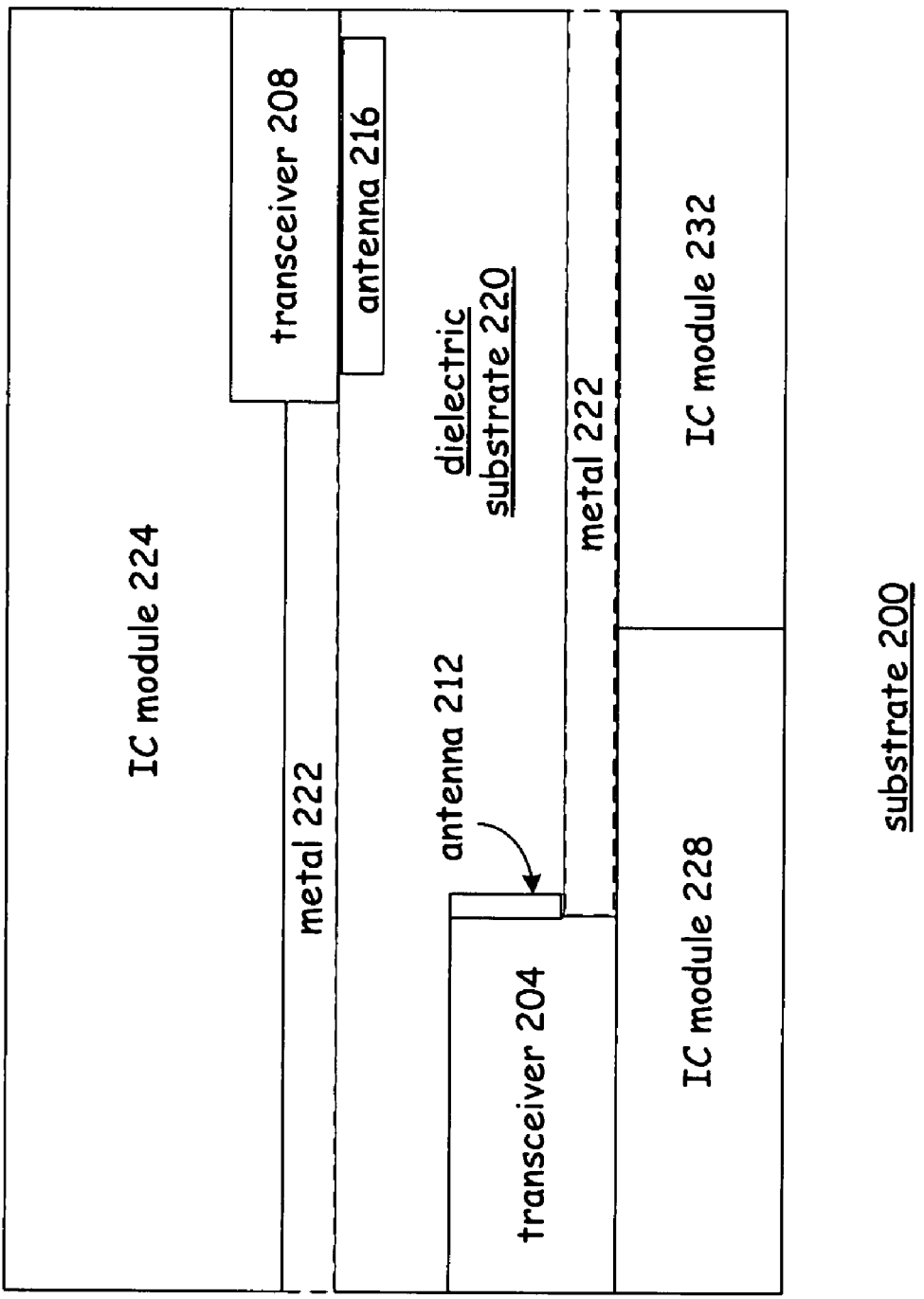
FIG. 5 is a functional block diagram of a substrate that includes a plurality of embedded substrate transceivers surrounded by integrated circuit modules and circuitry according to one embodiment of the present invention.

FIG. 5 is a functional block diagram of a substrate that includes a plurality of substrate transceivers surrounded by integrated circuit modules and circuitry according to one embodiment of the present invention. As may be seen, a substrate 200 includes an embedded substrate transceiver 204 that is operable to communicate with a substrate transceiver 208 by way of substrate antennas 212 and 216, respectively. While transceiver 204 is embedded in the dielectric substrate 220, transceiver 208 is operably disposed on a surface of dielectric substrate 220.

The electromagnetic signals are transmitted from transceivers 204 and 208 through the substrate antennas 212 and 216 to radiate through a dielectric substrate 220. In the embodiment shown, dielectric substrate 220 is bounded by metal layers 222 which further shield the electromagnetic signals transmitted through the wave guide that is formed by dielectric substrate 220. The dielectric substrate 220 is surrounded, as may be seen, by IC modules 224, 228 and 232. In the specific embodiment of substrate 200, one typical application would be a printed circuit board in which the dielectric substrate is formed within the printed circuit board which is then layered with metal layer 222 and operably supports ICs 224, 228 and 232. The metal layer 222 not only is operable as a shield, but may also be used to conduct signals in support of IC modules 224, 228 and 232. For exemplary purposes, transceiver 208 is operable to support communications for IC module 224 while transceiver 204 is operable to support communications for IC module 228.

Figure 6:
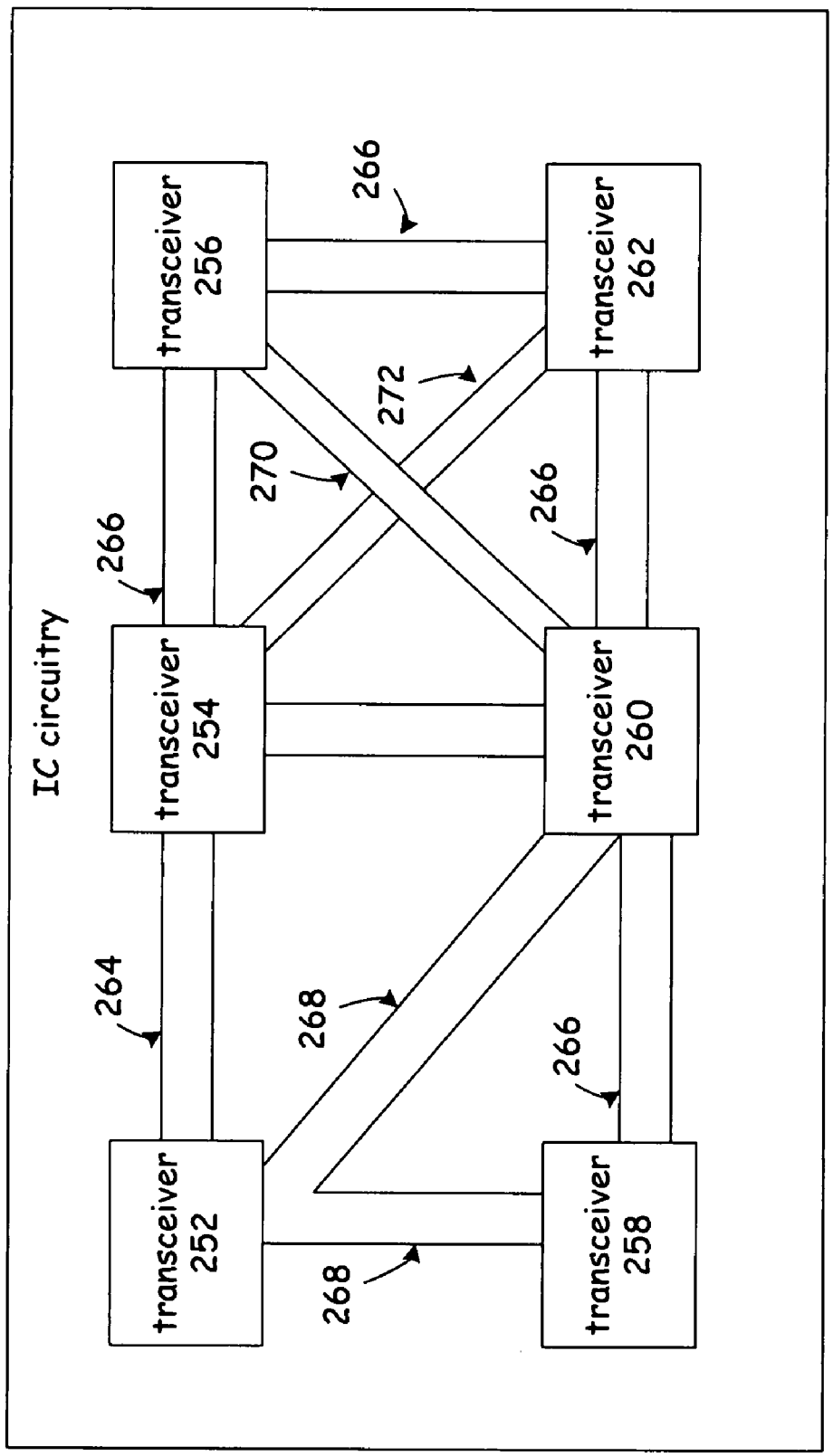
FIG. 6 is a functional block diagram of a substrate that includes a plurality of transceivers operably disposed to communicate through wave guides formed within the substrate according to one embodiment of the present invention.

FIG. 6 is a functional block diagram of a substrate that includes a plurality of transceivers operably disposed to communicate through wave guides formed within the substrate according to one embodiment of the present invention. As may be seen, a substrate 250 includes a plurality of transceivers 252, 254, 256, 258, 260, and 262. Each transceiver 252-262 has associated circuitry not shown here and can be operably disposed within the dielectric or on top of the dielectric with an associated antenna protruding into the dielectric. As may be seen, the substrate 250 includes a plurality of wave guides formed within for conducting specific communications between specified transceivers. For example, a wave guide 264 is operably disposed to support communications between transceivers 252 and 254. Similarly, wave guides 266 support communications between transceivers 254, 256, 262, 260, and 258, as shown.

Some other noteworthy configurations may also be noticed. For example, a wave guide 268 supports transmissions from transceiver 252 to transceivers 258 and 260. Alternatively, each of the transceivers 258 and 260 may transmit only to transmitter 252 through wave guide 268 because of the shape of wave guide 268. An additional configuration according to one embodiment of the invention may be seen with wave guides 270 and 272. As may be seen, wave guide 270 overlaps wave guide 272 wherein wave guide 270 supports communications between transceivers 260 and 256, while wave guide 272 supports communications between transceivers 254 and 262. At least in this example, the wave guides 270 and 272 are overlapping but isolated from each other to prevent the electromagnetic radiation therein from interfering with electromagnetic radiation of the other wave guide.

In general, it may be seen that the wave guides shown within substrate 250 support a plurality of directional communications between associated transceivers. In the embodiment of FIG. 6, the substrate may be either a board, such as a printed circuit board, or an integrated circuit wherein each transceiver is a transceiver block or module within the integrated circuit. In this embodiment of the invention, the wave guides are formed of a dielectric substrate material and are bounded to contain and isolate the electromagnetic signals transmitted therein. Further, as described in previous embodiments, the frequency of the electromagnetic signals is a very high radio frequency in the order of tens of GHz. In one specific embodiment, the frequency is equal to 60 GHz (+/−5 GHz). One aspect of this embodiment of the invention is that a transceiver may communicate to an intended transceiver by way of another transceiver. For example, if transceiver 252 seeks to deliver a communication to transceiver 256, transceiver 252 has the option of transmitting the communication signals by way of wave guides 264 and 266 through transceiver 254 or, alternatively, by wave guides 268 and 270 through transceiver 260.

Figure 7:
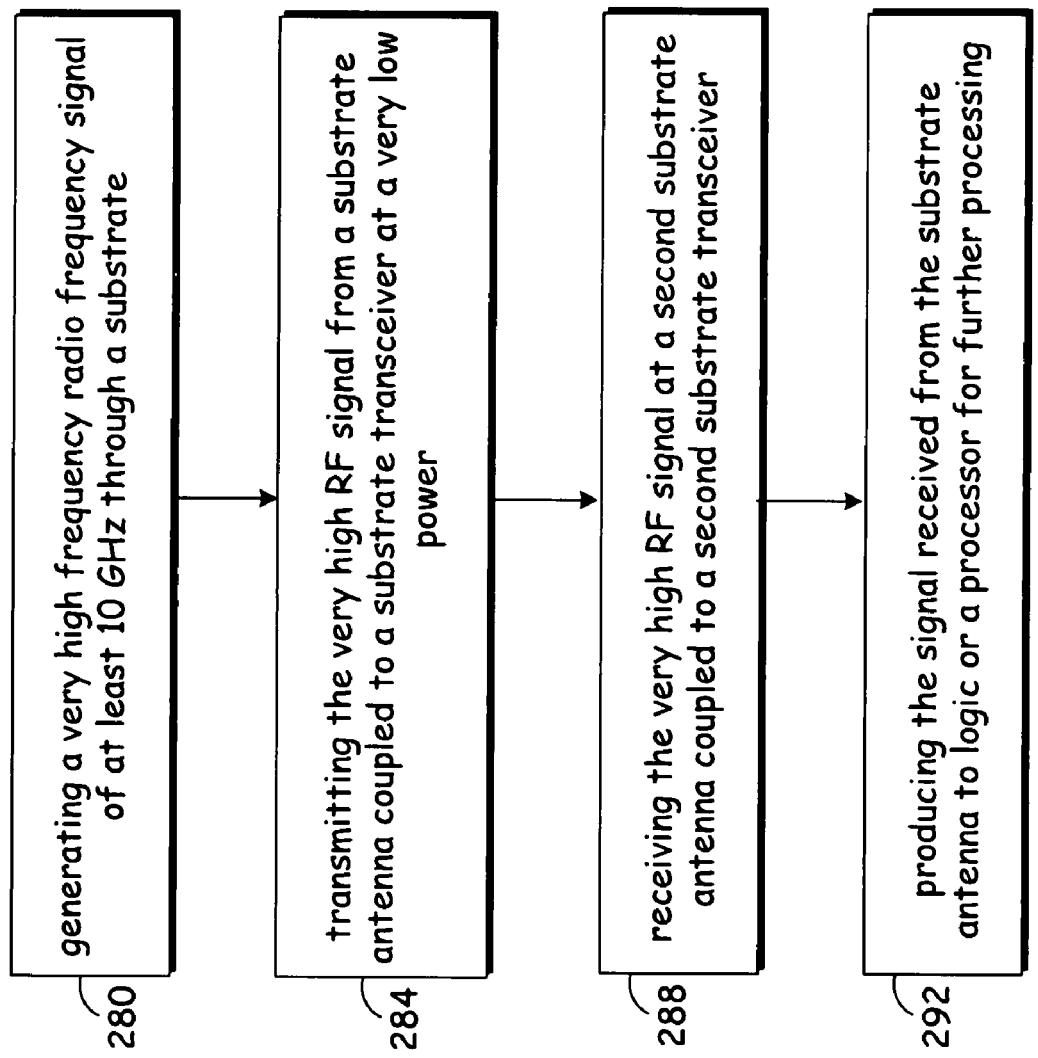
FIG. 7 is a flow chart of a method according to one embodiment of the present invention.

FIG. 7 is a flow chart of a method according to one embodiment of the present invention. The method includes initially generating a very high radio frequency signal of at least 10 GHz (step 280). In one embodiment of the invention, the very high radio frequency signal is a 60 GHz (+/−5 GHz) signal. Thereafter the method includes transmitting the very high radio frequency signal from a substrate antenna coupled to a substrate transceiver at a very low power (step 284). Because the electromagnetic radiation of the signal is being radiated through a substrate instead of through space, lower power is required. Moreover, because the substrate is operable as a wave guide with little or no interference, even less power is required because power is not required to overcome significant interference. Thereafter the method includes receiving the very high radio frequency signal at a second substrate antenna coupled to a second substrate transceiver (step 288). Finally, the method includes producing the signal received from the substrate antenna to logic or a processor for further processing (step 292). Generally, the method of FIG. 7 relates to the transmission of electromagnetic signals through a substrate of a printed circuit board, a board that houses integrated circuits or die, or even through an integrated circuit substrate material. In general, the substrate is formed of a dielectric material and is operable as a wave guide.

Figure 8:
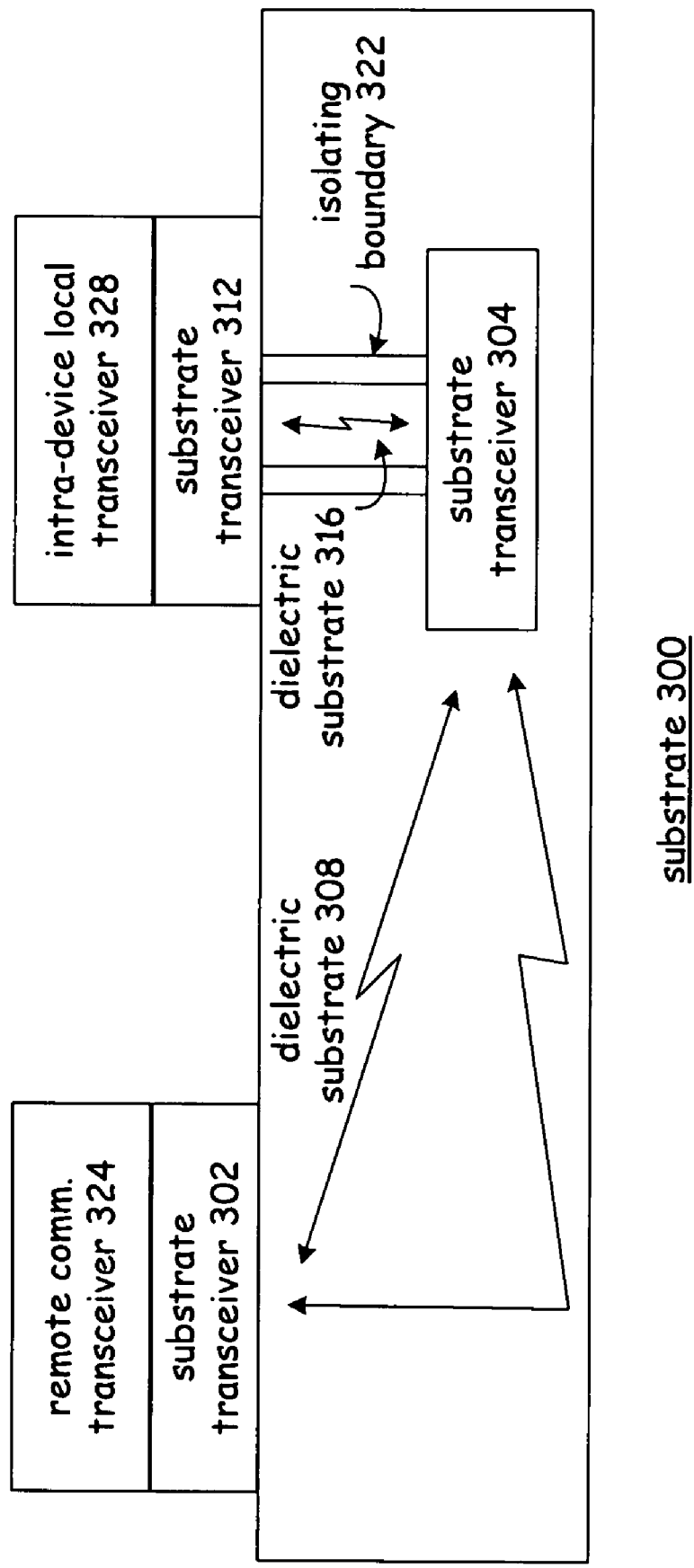
FIG. 8 is a functional block diagram of a substrate illustrating three levels of transceivers according to one embodiment of the present invention.

FIG. 8 is a functional block diagram of a substrate 300 illustrating three levels of transceivers according to one embodiment of the present invention. As may be seen, a substrate transceiver 302 is operably disposed upon a surface of a dielectric substrate to communicate with a substrate transceiver 304 through dielectric substrate 308. Substrate transceiver 304 is further operable to communicate with substrate transceiver 312 that also is operably disposed upon a surface of dielectric substrate 308. As may be seen, substrate transceiver 304 is embedded within dielectric substrate 308. To reduce or eliminate interference between communication signals between substrate transceivers 312 and 304, in relation to communications between substrate transceivers 302 and 304, a dielectric substrate 316 that is isolated by an isolating boundary 322 is used to conduct the communications between substrate transceiver 312 and substrate transceiver 304. In one embodiment of the invention, the isolating boundary is formed of metal.

In an alternate embodiment, the isolating boundary is merely a different type of dielectric or other material that generates a boundary to operably reflect electromagnetic radiation away from the dielectric substrate surface containing the electromagnetic signal. As such, the isolating boundaries within the dielectric, here within dielectric substrate 308, are used to define the volume of dielectric substrate illustrated as dielectric substrate 316 to create a wave guide between substrate transceiver 304 and substrate transceiver 312. In yet another alternate embodiment, rather than creating isolated wave guides within the primary dielectric substrate, here dielectric substrate 308, directional antennas may be used to reduce or eliminate interference between signals going to different substrate transceivers. For example, if each substrate transceiver shown utilized directional antennas, then, with proper placement and alignment of substrate antennas, interference may be substantially reduced thereby avoiding the need for the creation of isolating boundaries that define a plurality of wave guides within a dielectric substrate.

Continuing to examine FIG. 8, it may be seen that a remote communication transceiver 324 is operably disposed to communicate with substrate transceiver 302, while an intra-system local transceiver 328 is operably disposed to communicate with substrate transceiver 312. In the described embodiment of the invention, the intra-system or intra-device transceiver 328 is a local transceiver for short range local wireless communications through space with other local intra-device transceivers 328. References to "local" are made to indication a device that is operable to generate wireless transmissions that are not intended for transceivers external to the device that houses the local transceiver.

In one embodiment, a low efficiency antenna may be used for communications between local intra-device transceivers and between substrate transceivers. Because the required transmission distance is very minimal since the transmissions are to local transceivers located on the same board, integrated circuit or device, local low efficient antenna structures may be utilized. Moreover by using a very high radio frequency that is at least 10 GHz, and, in one embodiment, by utilizing a frequency band of approximately 55 GHz to 65 GHz, such low efficiency antenna structures have electromagnetic properties that support operation within the desired high frequency band.

Remote communication transceiver 324, on the other hand, is for communicating with remote transceivers external to the device that houses substrate 300. Thus, for example, if intra-device transceiver 328 were to receive a short range wireless communication from another local intra-device transceiver, intra-device transceiver 328 could operably conduct the received signals to substrate transceiver 312 which would then be operable to conduct the signals through dielectric substrate 316 to substrate transceiver 304 which, in turn, could radiate the signals to substrate transceiver 302 for delivery to remote communication transceiver 324. Network/Device transceiver 324 could then transmit the communication signals in the form of electromagnetic radiation to a remote wireless transceiver.

It should be understood that the described operation herein is but one exemplary embodiment that corresponds to the block diagram of FIG. 8. Alternatively, such communication signals may be relayed through more or less substrate transceivers to conduct the communication signals from one location to another. For example, in one alternate embodiment, only substrate transceivers 312 and 302 would be used for such communications to deliver signals from intra-device transceiver 328 to remote communication transceiver 324 or vice versa.

More generally, as may be seen, the block diagram of FIG. 8 illustrates three levels of transceivers. First, substrate transceivers are used for radiating electromagnetic signals at a very high frequency through a dielectric substrate which may be formed in a board that houses integrated circuits or die, in a printed circuit board, or even within a substrate of an integrated circuit. A second level of transceiver is the intra-device local transceiver, such as intra-device transceiver 328, for generating very short range wireless communication signals through space to other local intra-device transceivers. As described before, such local transceivers are for local communications all contained within a specified device. Finally, the third level of transceiver is the remote communication transceiver 324 which is a remote transceiver for wireless communications with remote devices external to the device housing substrate 300 in each of these transceivers.

Figure 9:
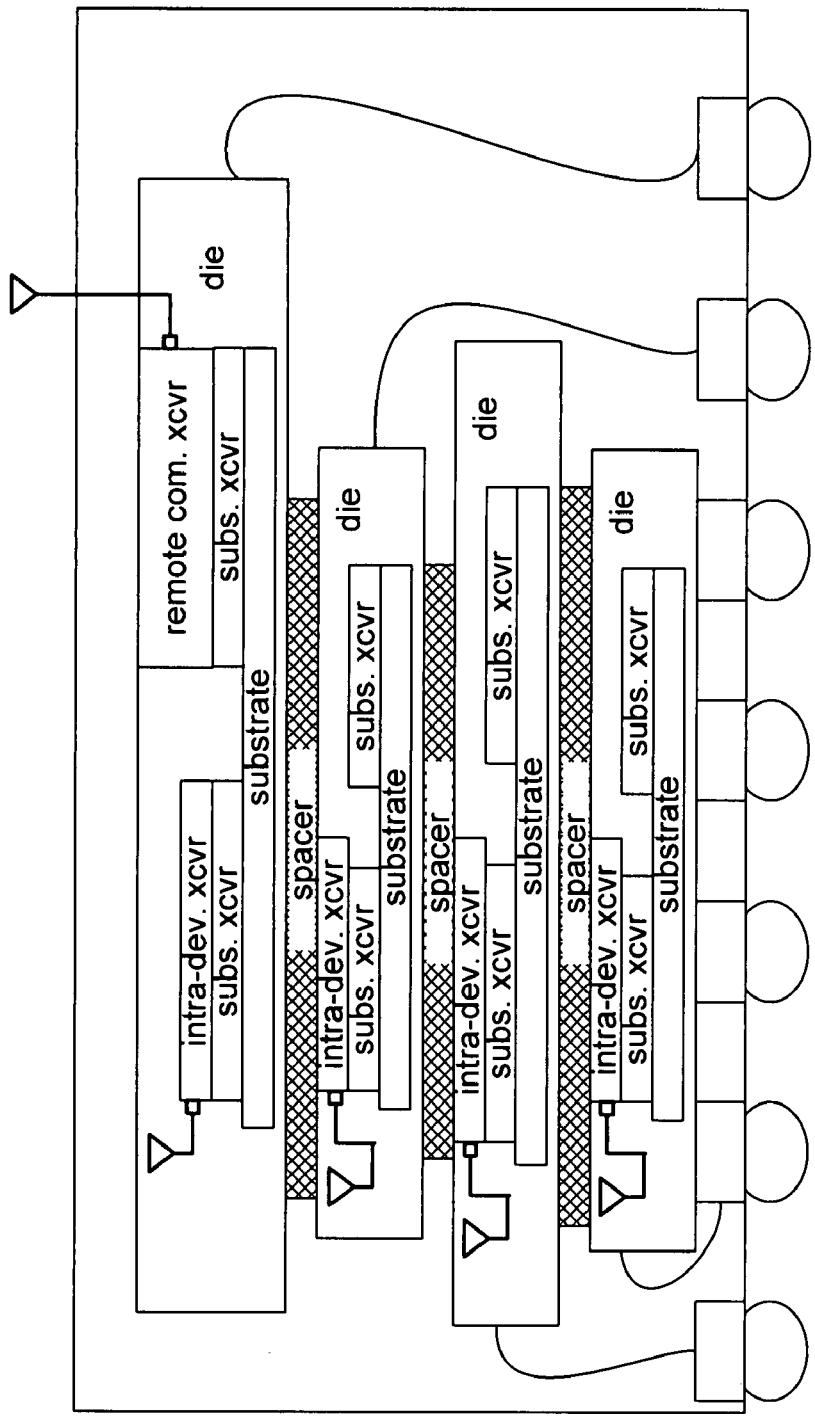
FIG. 9 is a functional block diagram of a multi-chip module formed according to one embodiment of the present invention.

FIG. 9 is a functional block diagram of a multi-chip module formed according to one embodiment of the present invention. As may be seen, a multi-chip module 330 includes a plurality of die that each includes a plurality of substrate transceivers, and at least one intra-device local transceiver. Moreover, at least one of the die includes a remote communication transceiver for communications with remote devices. While a multi-chip module is not required to include a remote communication transceiver for communications with other remote devices, the embodiment shown in FIG. 9 does include such a remote communication transceiver.

As may be seen, each die is separated from an adjacent die by a spacer. As such, in the illustrated embodiment, a plurality of four die are included, which four die are operably separated by three spacers. Each of the four die includes two substrate transceivers that are operable to communicate through a dielectric substrate operable as a wave guide. Additionally, at least one substrate transceiver is communicatively coupled to an intra-device transceiver for radiating wireless communication signals through space to another intra-device local transceiver within the multi-chip module of FIG. 9.

In one embodiment of the invention, at least one intra-device local transceiver is operable to generate transmission signals at a power level sufficient to reach another intra-device transceiver within a device, but not outside of the multi-chip module. The antennas for the substrate transceivers are not shown for simplicity but they may be formed as described elsewhere here in this specification.

As may further be seen, each of the intra-device local transceivers includes a shown antenna for the local wireless transmissions through space. In the described embodiment of the invention, the wireless communications within the multi-chip module of FIG. 9 are at least 10 GHz in frequency and, in one embodiment, are approximately equal to 60 GHz. The remote transceiver, as shown, may operate at approximately the same frequency or a different frequency according to design preferences and according to the intended remote devices with which the multi-chip module of FIG. 9 is to communicate.

Continuing to refer to FIG. 9, it should be understood that each of the embodiments shown previously for substrates and substrate transceivers may be utilized here in the multi-chip module of FIG. 9. Accordingly, a given substrate may have more than two substrate transceivers which substrate transceivers may be operably disposed on top of the substrate or within the substrate. Similarly, the antennas for such substrate transceivers, namely the substrate antennas, may be operably disposed upon a surfaces substrate or to at least partially, if not fully, penetrate the substrate for the radiation of electromagnetic signals therein. Moreover, a plurality of wave guides may be formed within the substrate to direct the electromagnetic signals therein from one desired substrate transceiver antenna to another desired substrate transceiver antenna.

In operation, for exemplary purposes, one substrate transceiver of a die may use the substrate to generate communication signals to another substrate transceiver for delivery to an intra-device local transceiver for subsequent radiation through space to yet another substrate and, more specifically, to an intra-device local transceiver operably disposed upon another substrate. As will be described in greater detail below, a specific addressing scheme may be used to direct communications to a specific intra-device local transceiver for further processing. For example, if a communication signal is intended to be transmitted to a remote device, such communication signal processing will occur to result in a remote transceiver receiving the communication signals by way of one or more substrates, substrate transceivers, and intra-device local transceivers.

Continuing to refer to FIG. 9, it should be noted that in addition to transmitting signals through a substrate at a lower power level, the power level for wireless transmissions between intra-device local transceivers may also be at a lower power level. Moreover, higher levels of modulation may be used based on the type of transmission. For example, for transmissions through a wave guide in a substrate, the highest orders of modulation may be used. For example, a signal may be modulated as a 128 QAM signal or as a 256 QAM signal. Alternatively, for intra-device local transceiver transmissions, the modulation may still be high, e.g., 64 QAM or 128 QAM, but not necessarily the highest levels of modulation. Finally, for transmissions from a remote transceiver to a remote device, more traditional modulation levels, such as QPSK or 8 PSK may be utilized according to expected interference conditions for the device.

In one embodiment of the invention, at least one die is a flash memory chip that is collocated within the same device that a processor. The intra-device transceivers are operable to establish a high data rate communication channel to function as a memory bus. As such, no traces or lines are required to be routed from the flash memory die to the processor die. Thus, the leads shown in FIG. 9 represent power lines to provide operating power for each of the die. At least some of the die, therefore, use wireless data links to reduce pin out and trace routing requirements. Continuing to refer to FIG. 9, other application specific devices may be included. For example, one die may include logic that is dedicated for other functions or purposes.

One aspect of the embodiment of FIGS. 8 and 9 is that a remote device may, by communicating through the remote communication transceiver and then through the intra-device and/or substrate transceivers within a device or integrated circuit, access any specified circuit module within the device to communicate with the device. Thus, in one embodiment, a remote tester is operable to communicate through the remote communication transceiver of the device housing the substrate of FIG. 8 or the multi-chip module of FIG. 9 and then through communicatively coupled intra-device transceivers to test any or all of the circuit modules within. Alternatively, a remote device may use the remote communication transceiver and intra-device and/or substrate local transceivers to access any resource within a device. For example, a remote device may access a memory device, a processor or a specialized application (e.g. a sensor) through such a series of communication links. A further explanation of these concepts may also be seen in reference to FIGS. 25 and 26.

Figure 10:
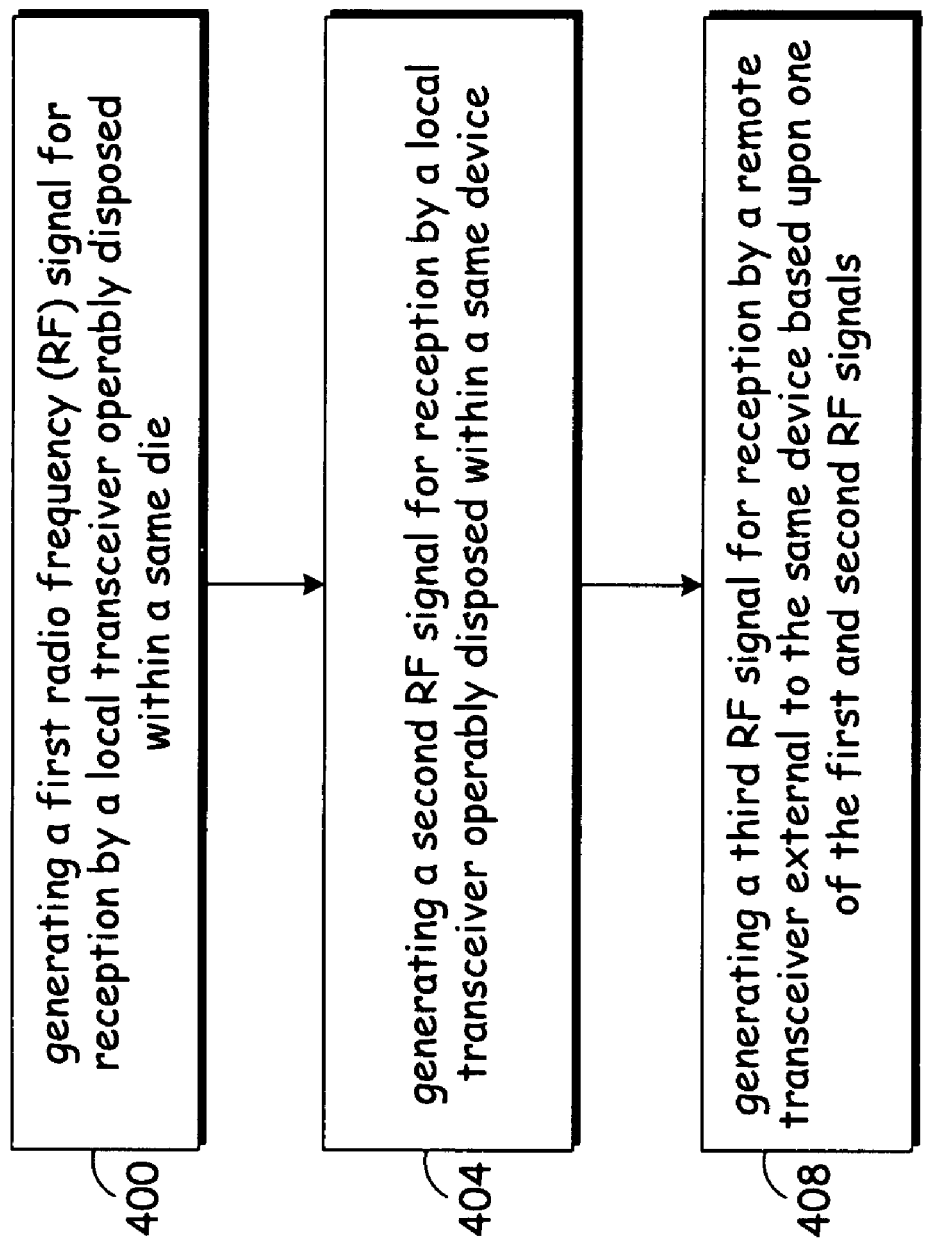
FIG. 10 is a flow chart of a method for communicating according to one embodiment of the present invention.

FIG. 10 is a flow chart of a method for communicating according to one embodiment of the present invention. The method includes generating a first radio frequency signal for reception by a local transceiver operably disposed within a same die (step 340). A second step includes generating a second RF signal for reception by a local transceiver operably disposed within a same device (step 344). Finally, the method includes generating a third RF signal for reception by a remote transceiver external to the same device based upon one of the first and second RF signals (step 348).

In one embodiment of the present invention, the first, second and third RF signals are generated at different frequency ranges. For example, the first radio frequency signals may be generated at 60 GHz, while the second RF signals are generated at 30 GHz, while the third RF signals are generated at 2.4 GHz. Alternatively, in one embodiment of the invention, the first, second and third RF signals are all generated at a very high and substantially similar frequency. For example, each might be generated as a 60 GHz (+/−5 GHz) signal. It is understood that these frequencies refer to the carrier frequency and may be adjusted slightly to define specific channels of communication using frequency division multiple access-type techniques. More generally, however, at least the first and second RF signals are generated at a frequency that is at least as high as 10 GHz.

Figure 11:
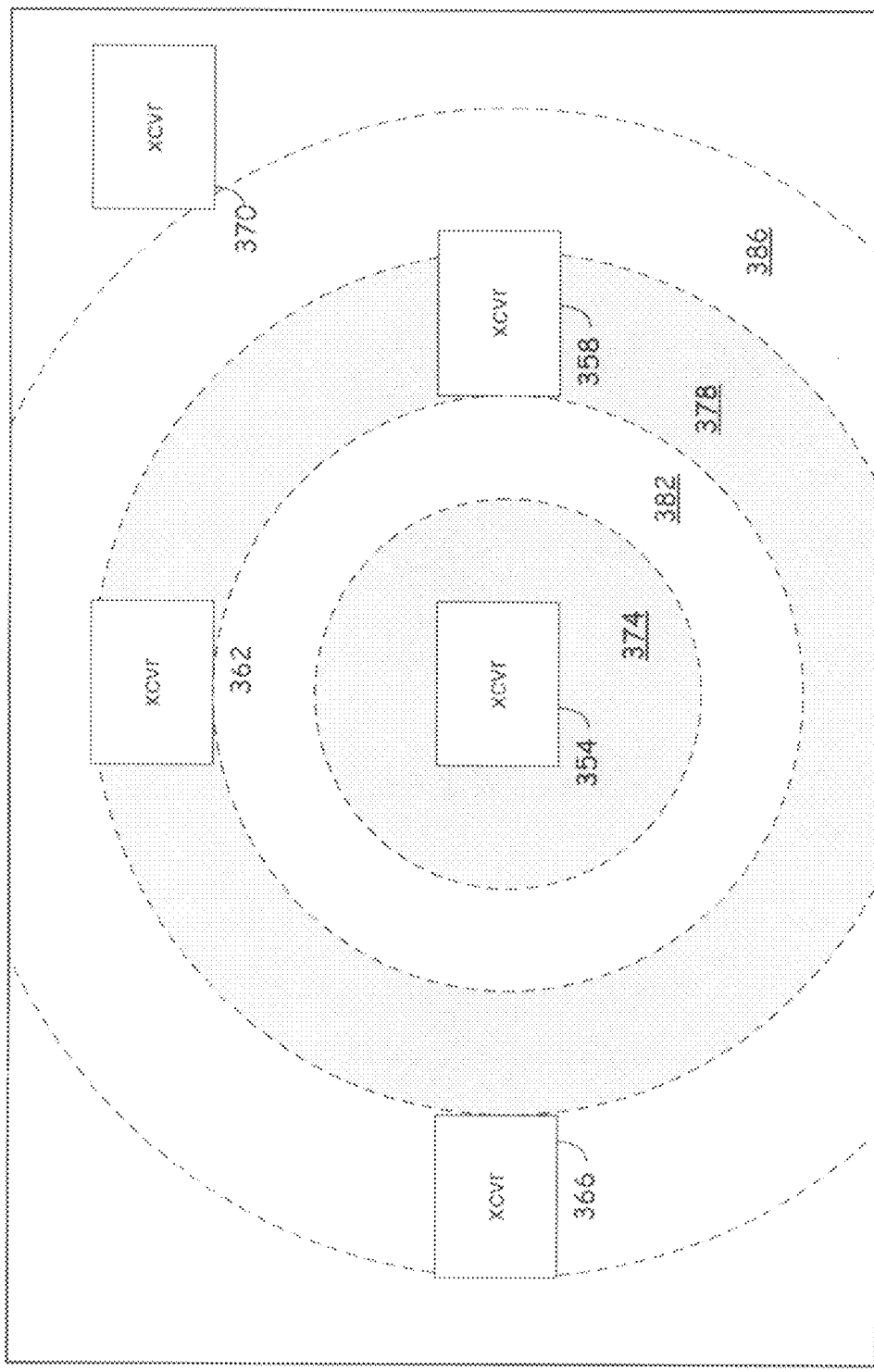
FIG. 11 is a diagram that illustrates transceiver placement within a substrate according to one embodiment of the present invention.

FIG. 11 is a diagram that illustrates transceiver placement within a substrate according to one embodiment of the present invention. As may be seen, a substrate 350 includes a plurality of transceivers 354, 358, 362, 366 and 370, that are operably disposed in specified locations in relation to each other to support intended communications there between. More specifically, the transceivers 354-370 are placed within peak areas and null areas according to whether communication links are desired between the respective transceivers. The white areas within the concentric areas illustrate subtractive signal components operable to form a signal null, while the shaded areas illustrate additive signal components operable to form a signal peak.

More specifically, it may be seen that transceiver 354 is within a peak area of its own transmissions, which peak area is shown generally at 374. Additionally, a peak area may be seen at 378. Null areas are shown at 382 and 386. Peak areas 374 and 378 and null areas 382 and 386 are in relation to transceiver 354. Each transceiver, of course, has its own relative peak and null areas that form about its transmission antenna. One aspect of the illustration of FIG. 11 is that transceivers are placed within peak and null areas in relation to each other according to whether communication links are desired between the respective transceivers.

One aspect of the embodiment of FIG. 11 is that a device may change frequencies to obtain a corresponding null and peak pattern to communicate with specified transceivers. Thus, if transceiver 354 wishes to communicate with transceiver 366 (which is in a null region for the frequency that generates the null and peak patterns shown in FIG. 11), transceiver 354 is operable to change to a new frequency that produces a peak pattern at the location of transceiver 366. As such, if a dynamic frequency assignment scheme is used, frequencies may desirably be changed to support desired communications.

Figure 12:
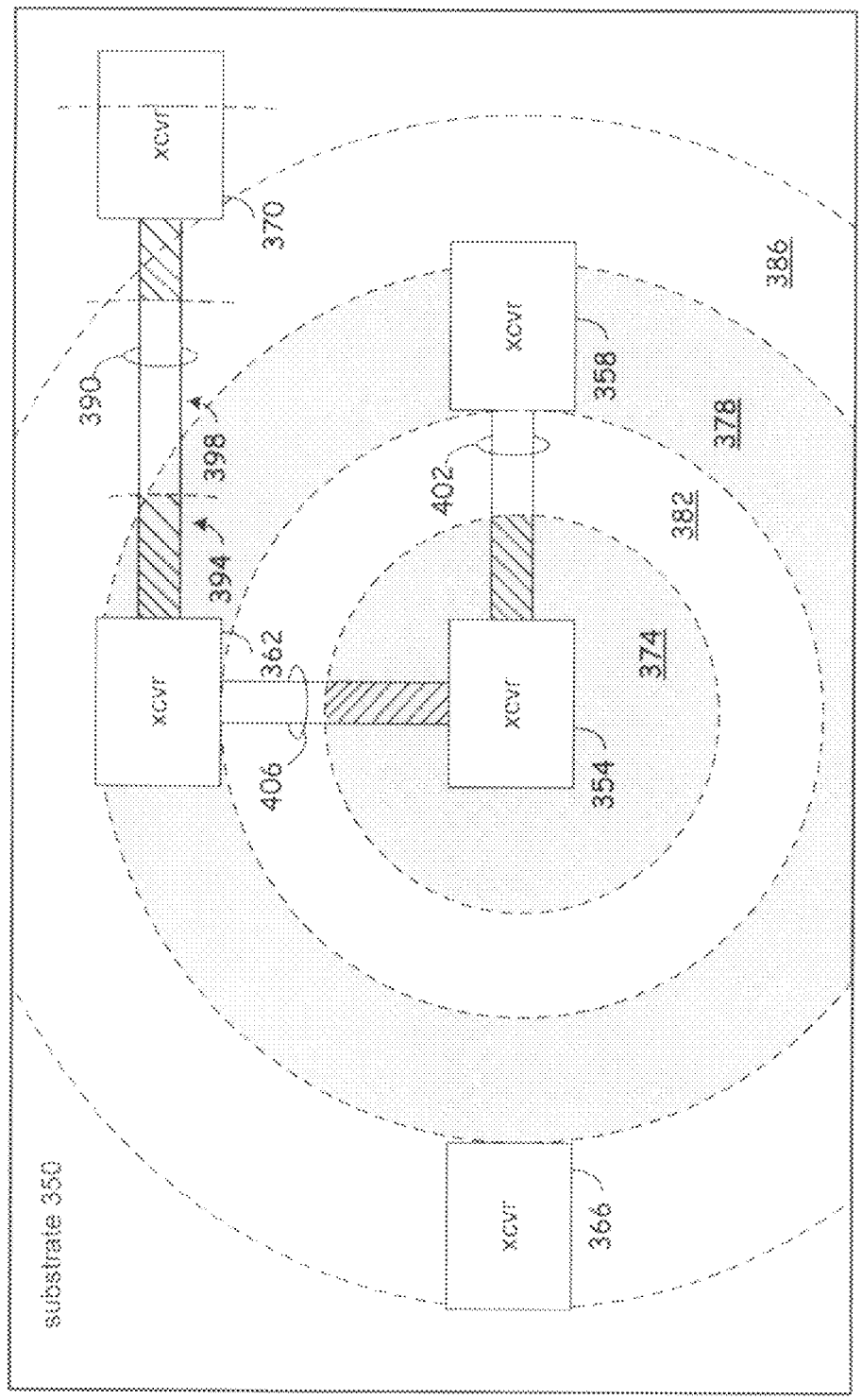
FIG. 12 is an illustration of an alternate embodiment of a substrate.

FIG. 12 is an illustration of an alternate embodiment of a substrate 350 that includes the same circuit elements as in FIG. 11 but also includes a plurality of embedded wave guides between each of the transceivers to conduct specific communications there between. As may be seen, transceiver 354 is operable to communicate with transceiver 358 over a dedicated wave guide 402. Similarly, transceiver 354 is operable to communicate with transceiver 362 over a dedicated wave guide 406. Thus, with respect to transceiver 362, peak area 394 and null area 398 are shown within isolated substrate 390.

Wave guide 390 couples communications between transceivers 362 and 370. While the corresponding multi-path peaks and nulls of FIG. 11 are duplicated here in FIG. 12 for transceiver 354, it should be understood that the electromagnetic signals are being conducted between the transceivers through the corresponding wave guides in one embodiment of the invention. Also, it should be observed that the actual peak and null regions within the contained wave guides are probably different than that for the general substrate 350 but, absent more specific information, are shown to correspond herein. One of average skill in the art may determine what the corresponding peak and null regions of the isolated wave guides 402, 406 and 390 will be for purposes of communications that take advantage of such wave guide operational characteristics.

Figure 13:
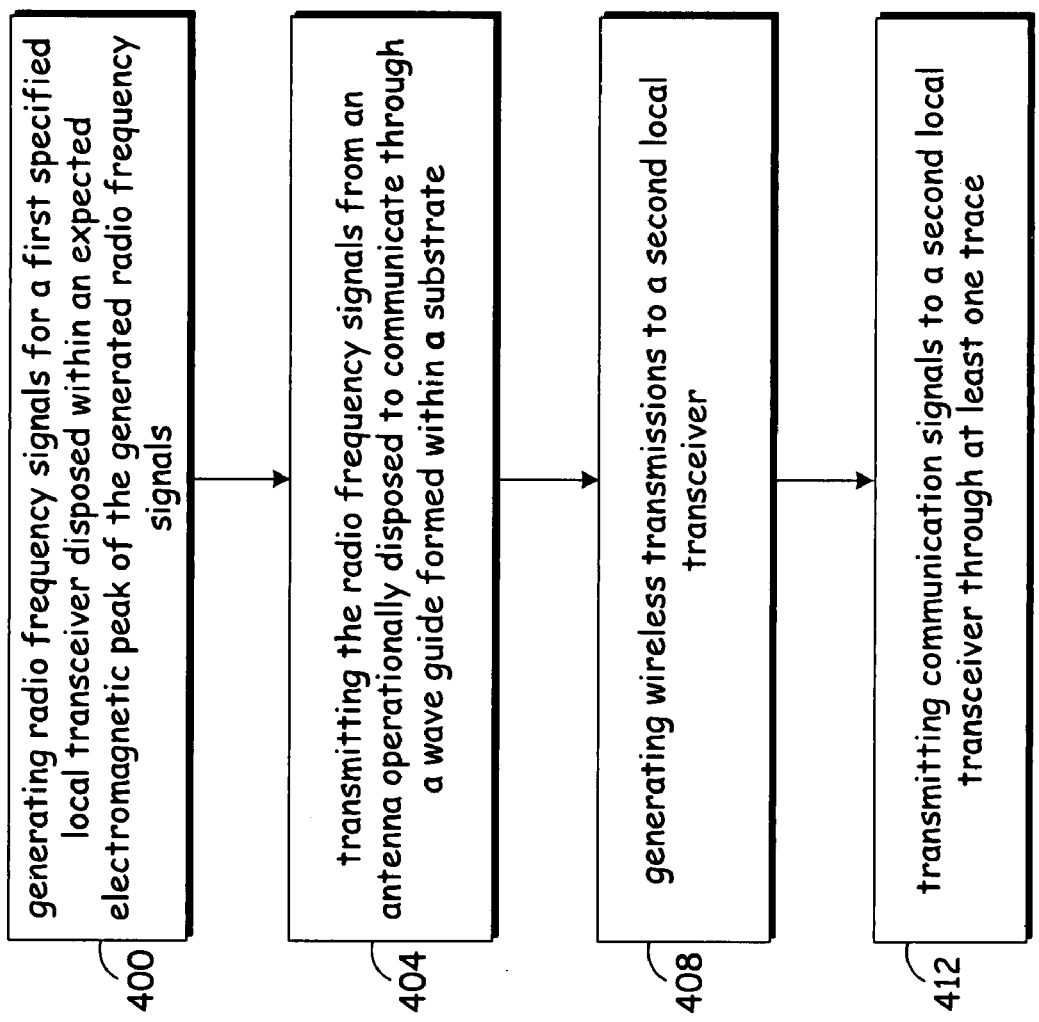
FIG. 13 is a flow chart that illustrates a method according to one embodiment of the present invention.

FIG. 13 is a flow chart that illustrates a method according to one embodiment of the present invention. The method includes initially generating radio frequency signals for a first specified local transceiver disposed within an expected electromagnetic peak of the generated radio frequency signals (step 400). The expected electromagnetic peak is a multi-path peak where multi-path signals are additive. The signals that are generated are then transmitted from an antenna that is operationally disposed to communicate through a wave guide formed within a substrate (step 404). The substrate may be that of a board, such as a printed circuit board, or of a die, such as an integrated circuit die.

The method also includes generating wireless transmissions to a second local transceiver through either the same or a different and isolated wave guide (step 408). Optionally, the method of FIG. 13 includes transmitting communication signals to a second local transceiver through at least one trace (step 412). As may be seen, transmissions are not specifically limited to electromagnetic signal radiations through space or a wave guide or, more generally, through a substrate material such as a dielectric substrate.

Figure 14:
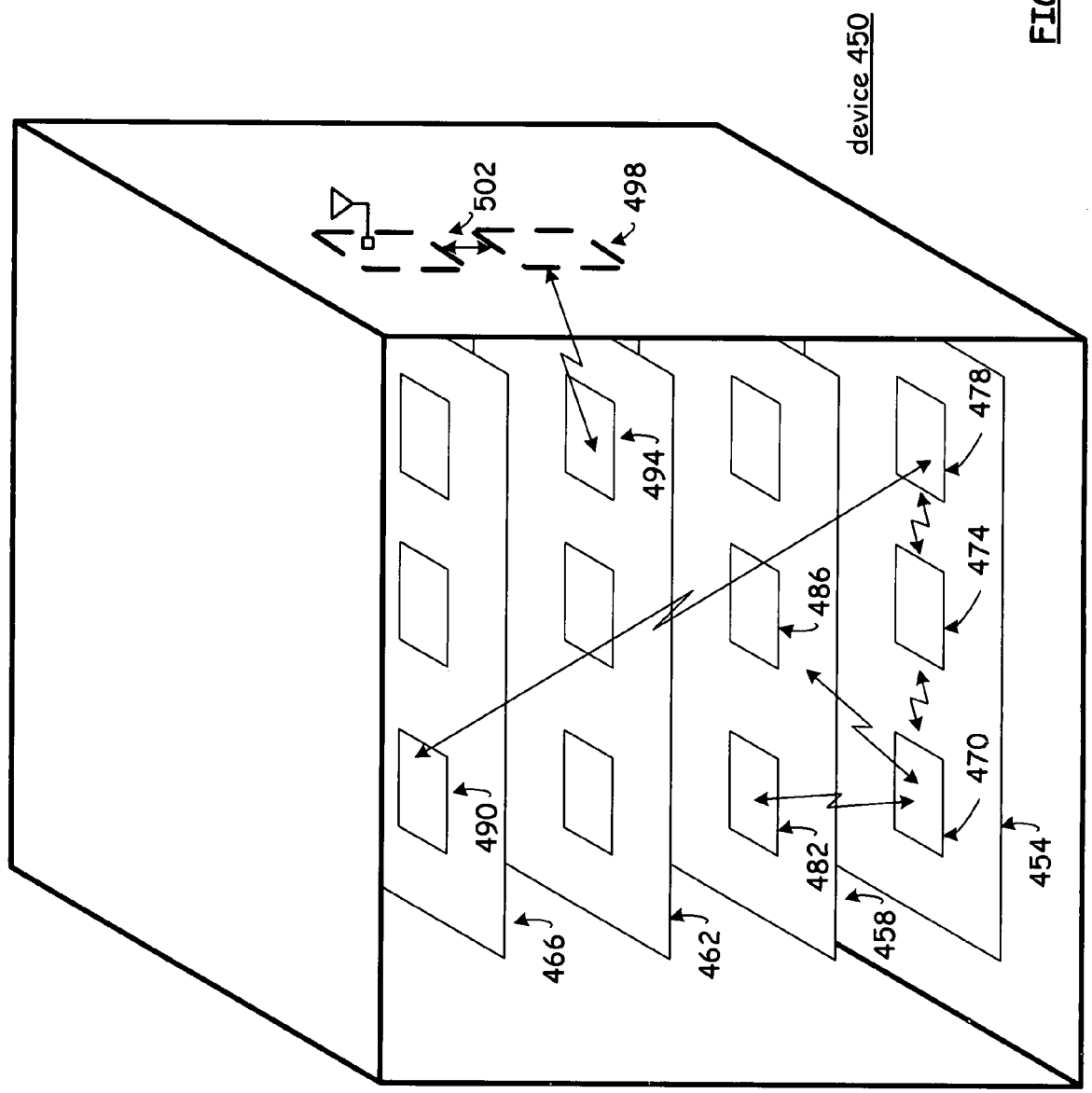
FIG. 14 is a functional block diagram of an integrated circuit multi-chip device and associated communications according to one embodiment of the present invention.

FIG. 14 is a functional block diagram of an integrated circuit multi-chip device and associated communications according to one embodiment of the present invention. As may be seen, a device 450 includes a plurality of circuit boards 454, 458, 462 and 466, that each houses a plurality of die. The die may be packaged or integrated thereon. The device of FIG. 14 may represent a device having a plurality of printed circuit boards, or alternatively, a multi-chip module having a plurality of integrated circuit die separated by spacers. As may be seen, board 454 includes transceivers 470, 474, and 478 that are operable to communicate with each other by way of local transceivers. In one embodiment of the invention, the local transceivers are substrate transceivers that generate electromagnetic radiations through wave guides within board 454.

As stated before, board 454 may be a board such as a printed circuit board that includes a dielectric substrate operable as a wave guide, or may be an integrated circuit that includes a dielectric wave guide for conducting the electromagnetic radiation. Alternatively, the transceivers 470, 474, and 478, may communicate by way of intra-device local transceivers that transmit through space but only for short distances. In one embodiment of the invention, the local intra-device transceivers are 60 GHz transceivers having very short wavelength and very short range, especially when a low power is used for the transmission. In the embodiment shown, power would be selected that would be adequate for the electromagnetic radiation to cover the desired distances but not necessarily to expand a significant distance beyond.

As may also be seen, transceiver 470 is operable to communicate with a transceiver 482 that is operably disposed on board 458 and with a transceiver 486 that is operably disposed on board 458. In this case, local intra-device wireless transceivers for transmitting through space are required since transceivers 482 and 486 are placed on a different or integrated circuit die. Similarly, transceiver 478 is operable to communicate with transceiver 490 that is operably disposed on board 466. As before, transceiver 478 and transceiver 490 communicate utilizing local intra-device wireless transceivers. As may also be seen, a local intra-device transceiver 494 on board 462 is operable to communicate with a local intra-device transceiver 498 that further includes an associated remote transceiver 502 for communicating with remote devices. As may be seen, remote transceiver 502 and local transceiver 498 are operatively coupled. Thus, it is through transceiver 502 that device 450 communicates with external remote devices.

In one embodiment of the present invention, each of the boards 454, 458, 462, and 466, are substantially leadless boards that primarily provide structural support for bare die and integrated circuits. In this embodiment, the chip-to-chip communications occur through wave guides that are operably disposed between the various integrated circuit or bare die, or through space through local wireless intra-device transceivers. Alternatively, if each board 454-466 represents a printed circuit board, then the wireless communications, whether through a substrate or through space, augment and supplement any communications that occur through traces and lead lines on the printed circuit board.

One aspect of the embodiment of device 450 shown in FIG. 14 is that of interference occurring between each of the wireless transceivers. While transmissions through a wave guide by way of a dielectric substrate may isolate such transmissions from other wireless transmissions, there still exist a substantial number of wireless transmissions through space that could interfere with other wireless transmissions all within device 450. Accordingly, one aspect of the present invention includes a device that uses frequency division multiple access for reducing interference within device 450.

Figure 15:
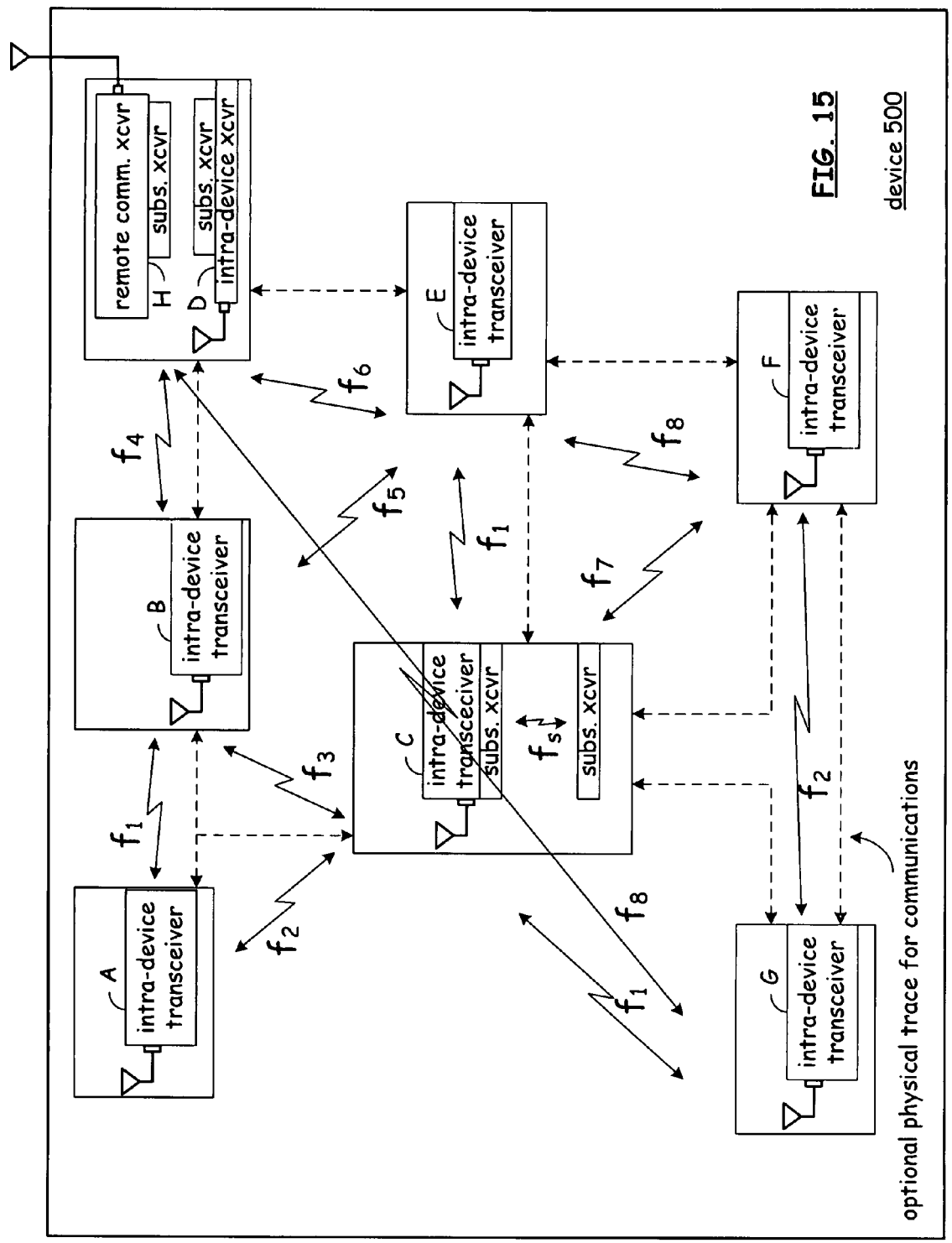
FIG. 15 is a functional block diagram that illustrates operation of one embodiment of the present invention utilizing frequency division multiple access.

FIG. 15 is a functional block diagram that illustrates operation of one embodiment of the present invention utilizing frequency division multiple access for communication within a device. As may be seen in the embodiment of FIG. 15, a device 500 includes intra-device local transceiver A is operable to communicate with intra-device local transceiver B and C utilizing $f_1$ and $f_2$ carrier frequencies. Similarly, intra-device local transceivers B and C communicate using $f_3$ carrier frequency. Intra-device local transceiver B also communicates with intra-device local transceiver D and E utilizing $f_4$ and $f_5$ carrier frequencies. Intra-device local transceiver D communicates with intra-device local transceiver E using $f_6$ carrier frequency. Because of space diversity (including range differentiation), some of these frequencies may be reused as determined by a designer. Accordingly, as may be seen, $f_1$ carrier frequency may be used between intra-device local transceivers C and E, as well as C and G. While $f_7$ carrier frequency is used for communications between intra-device local transceivers C and F, $f_8$ carrier frequency may be used for communications between intra-device local transceivers E and F, as well as D and G. Finally, intra-device local transceivers F and G are operable to communicate using $f_2$ carrier frequency. As may be seen, therefore, $f_1$, $f_2$, and $f_8$ carrier frequency signals have been reused in the frequency plan of the embodiment of FIG. 15.

Another aspect of the topology of FIG. 15 is that within the various die or transceivers, according to application, substrate transceivers exist that also use a specified carrier frequency for transmissions through the dielectric substrate wave guides. Here in FIG. 15, such carrier frequency is referred to simply as $f_s$. It should be understood that $f_s$ can be any one of $f_1$ through $f_8$ in addition to being yet a different carrier frequency $f_9$ (not shown in FIG. 15).

As described before in this specification, the substrate transceivers are operable to conduct wireless transmissions through a substrate forming a wave guide to couple to circuit portions. Thus, referring back to FIG. 15, for transmissions that are delivered to intra-device local transceiver D for delivery to remote transceiver H, a pair of local substrate transceivers are utilized to deliver the communication signals received by intra-device local transceiver D to remote transceiver H for propagation as electromagnetic signals through space to another remote transceiver.

Generally, in the frequency plan that is utilized for the embodiment of FIG. 15, the transceivers are statically arranged in relation to each other. As such, concepts of roaming and other such known problems do not exist. Therefore, the carrier frequencies, in one embodiment, are permanently or statically assigned for specific communications between named transceivers. Thus, referring to FIG. 16 now, a table is shown that provides an example of the assignment static or permanent assignment of carrier frequencies to specified communications between intra-device local transceivers, substrate transceivers, and other transceivers within a specified device. For example, $f_1$ carrier frequency is assigned to communications between transceivers A and B.

A carrier frequency is assigned for each communication link between a specified pair of transceivers. As described in relation to FIG. 15, space diversity will dictate what carrier frequencies may be reused if desired in one embodiment of the invention. As may also be seen, the embodiment of FIG. 16 provides for specific and new carrier frequency assignments for communications between specific substrate transceivers, such as substrate transceiver$_M$ and substrate transceiver$_N$ and substrate transceiver$_M$ with substrate transceiver$_O$. This specific example is beneficial, for example, in an embodiment having three or more substrate transceivers within a single substrate, whether that single substrate is an integrated circuit or a printed circuit board. As such, instead of using isolated wave guides as described in previous embodiments, frequency diversity is used to reduce interference.

Referring back to FIG. 15, it may be seen that a plurality of dashed lines are shown operatively coupling the plurality of intra-device local transceivers. For example, one common set of dashed lines couples transceivers A, B and C. On the other hand, dashed lines are used to couple transceivers C and G, C and F, and G and F. Each of these dashed lines shown in FIG. 15 represents a potential lead or trace that is used for carrying low bandwidth data and supporting signaling and power. Thus, the wireless transmissions are used to augment or add to communications that may be had by physical traces. This is especially relevant for those embodiments in which the multiple transceivers are operably disposed on one or more printed circuit boards.

One aspect of such a system design is that the wireless transmissions may be utilized for higher bandwidth communications within a device. For example, for such short range wireless transmissions where interference is less of a problem, higher order modulation techniques and types may be utilized. Thus, referring back to FIG. 16, exemplary assignments of frequency modulation types may be had for the specified communications. For example, for wireless communication links between transceivers A, B, C, D, E, F and G, either 128 QAM or 64 QAM is specified for the corresponding communication link as the frequency modulation type. However, for the communication link between intra-device local transceivers G and D, 8 QAM is specified as the frequency modulation type to reflect a greater distance and, potentially, more interference in the signal path. On the other hand, for the wireless communication links between substrate transceivers, the highest order modulation known, namely 256 QAM, is shown as being assigned since the wireless transmissions are through a substrate wave guide that has little to no interference and is power efficient. It should be understood that the assigned frequency modulation types for the various communication links are exemplary and may be modified according to actual expected circuit conditions and as is identified by test. One aspect that is noteworthy, however, of this embodiment, is that frequency subcarriers and frequency modulation types, optionally, may be statically assigned for specified wireless communication links.

Figure 17:
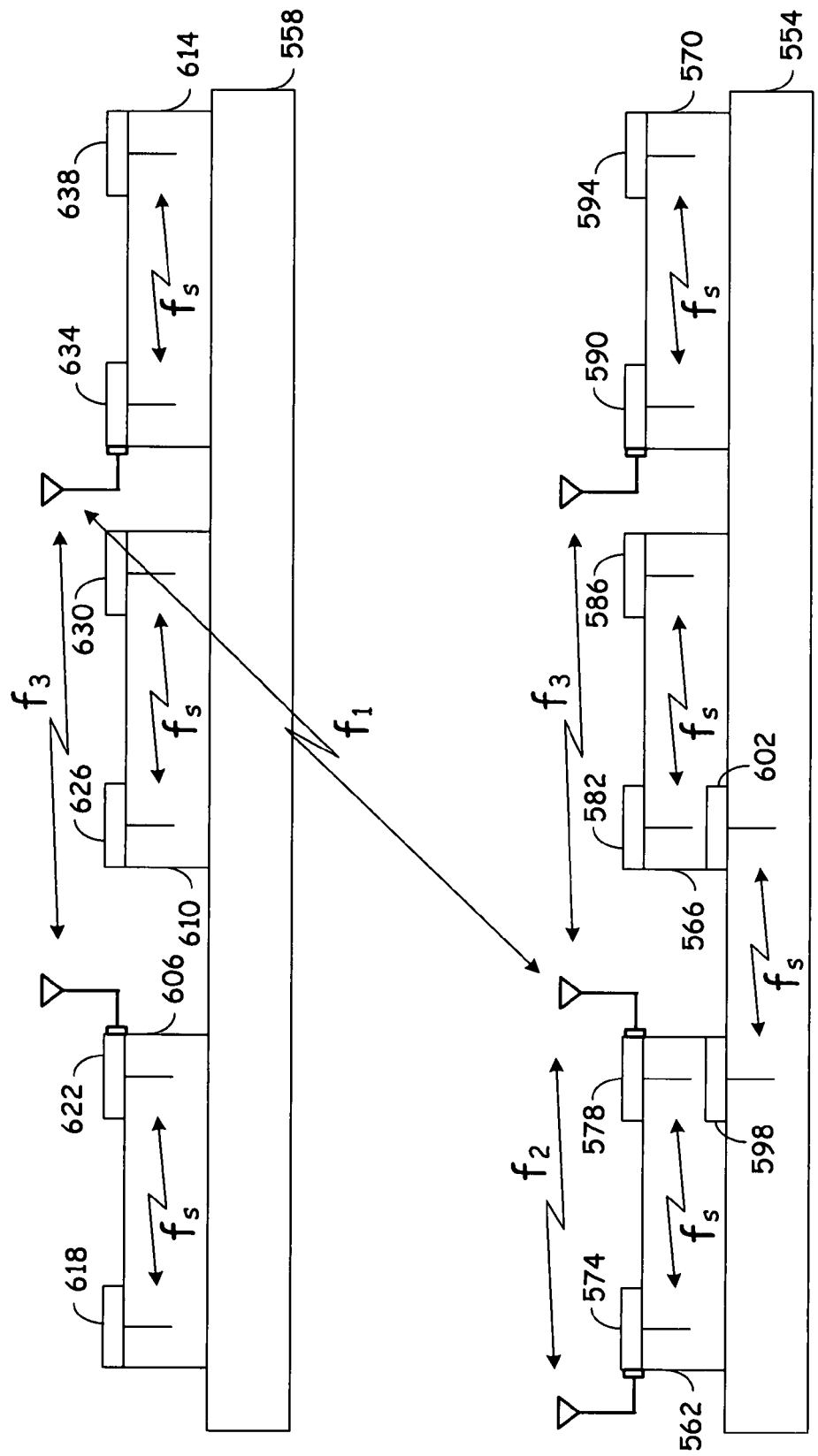
FIG. 17 is a functional block diagram of a device housing a plurality of transceivers and operating according to one embodiment of the present invention.

FIG. 17 is a functional block diagram of a device 550 housing a plurality of transceivers and operating according to one embodiment of the present invention. Referring to FIG. 17, a pair of substrates 554 and 558 are shown which each include a plurality of substrates disposed thereon, which substrates further include a plurality of transceivers disposed thereon. More specifically, substrate 554 includes substrates 562, 566 and 570, disposed thereon. Substrate 562 includes transceivers 574 and 578 disposed thereon, while substrate 566 includes transceivers 582 and 586 disposed thereon. Finally, substrate 570 includes transceivers 590 and 594 disposed thereon. Similarly, substrate 558 includes substrates 606, 610 and 614.

Substrate 606 includes transceivers 618 and 622, while substrate 610 includes transceivers 626 and 630 disposed thereon. Finally, substrate 614 includes transceivers 634 and 638 disposed thereon. Operationally, there are many aspects that are noteworthy in the embodiments of FIG. 17. First of all, transceivers 574 and 578 are operable to communicate through substrate 562 or through space utilizing assigned carrier frequency $f_2$. While not specifically shown, transceivers 574 and 578 may comprise stacked transceivers, as described before, or may merely include a plurality of transceiver circuit components that support wireless communications through space, as well as through the substrate 562. Similarly, substrate 566 includes substrate transceivers 582 and 586 that are operable to communicate through substrate 566 using carrier frequency $f_3$, while substrate 570 includes transceivers 590 and 594 that are operable to communicate through substrate 570 using carrier frequency $f_s$.

As may also be seen, transceiver 590 of substrate 570 and transceiver 578 of substrate 562 are operable to communicate over a wireless communication link radiated through space (as opposed to through a substrate). On the other hand, substrate 562 and substrate 566 each include substrate transceivers 598 and 602 that are operable to communicate through substrate 554. As such, layered substrate communications may be seen in addition to wireless localized communications through space. As may also be seen, transceiver 578 of substrate 562 is operable to communicate with transceiver 634 of substrate 614 which is disposed on top of substrate 558. Similarly, transceiver 634 is operable to wirelessly communicate by radiating electromagnetic signals through space with transceiver 622 which is operably disposed on substrate 606. Transceivers 622 and 618 are operable to communicate through substrate 606, while transceivers 626 and 630 are operable to communicate through substrate 610. Finally, transceiver 634 is operable to communicate through substrate 614 with transceiver 638.

While not shown herein, it is understood that any one of these transceivers may communicate with the other transceivers and may include or be replaced by a remote transceiver for communicating with other remote devices through traditional wireless communication links. With respect to a frequency plan, as may be seen, a frequency $f_1$ is assigned for the communication link between transceivers 578 and 634, while carrier frequency $f_2$ is assigned for transmissions between transceivers 574 and 578. Carrier frequency $f_3$ is assigned for transmissions between transceivers 578 and 590, as well as

622 and 634. Here, space diversity, as well as assigned power levels, is used to keep the two assignments of carrier frequency $f_3$ from interfering with each other and creating collisions.

As another aspect of the present embodiment of the invention, the carrier frequencies may also be assigned dynamically. Such a dynamic assignment may be done by evaluating and detecting existing carrier frequencies and then assigning new and unused carrier frequencies. Such an approach may include, for example, frequency detection reporting amongst the various transceivers to enable the logic for any associated transceiver to determine what frequency to dynamically assign for a pending communication. The considerations associated with making such dynamic frequency assignments includes the power level of the transmission, whether the transmission is with a local intra-device transceiver or with a remote transceiver, and whether the detected signal is from another local intra-device transceiver or from a remote transceiver.

Figure 18:
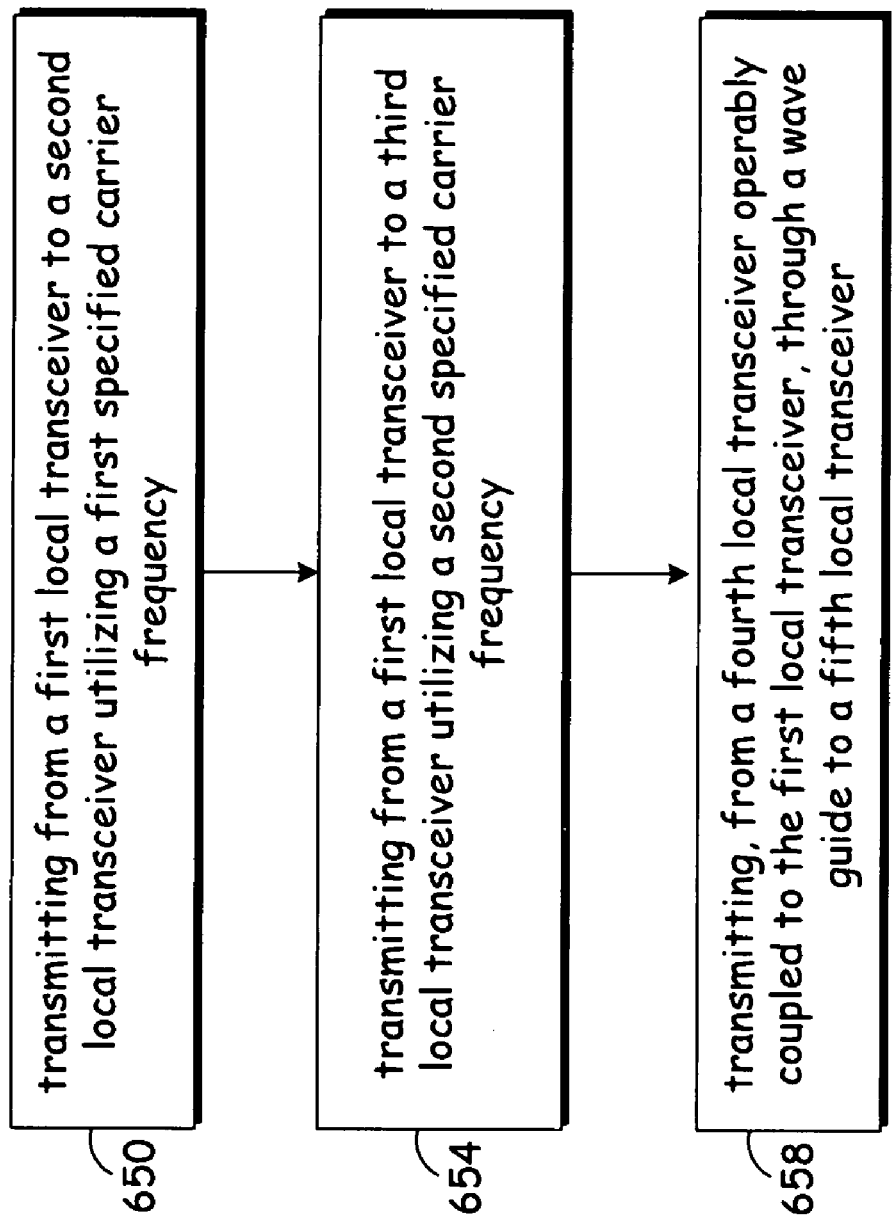
FIG. 18 is a flow chart that illustrates a method for wireless transmissions in an integrated circuit utilizing frequency division multiple access according to one embodiment of the invention.

FIG. 18 is a flow chart that illustrates a method for wireless transmissions in an integrated circuit utilizing frequency division multiple access according to one embodiment of the invention. The method includes, in a first local transceiver, generating and transmitting communication signals to a second local transceiver utilizing a first specified carrier frequency (step 650). The method further includes, in the first local transceiver, transmitting to a third local transceiver utilizing a second specified carrier frequency wherein the second local transceiver is operably disposed either within the integrated circuit or within a device housing the integrated circuit (step 654).

References to local transceivers are specifically to transceivers that are operably disposed within the same integrated circuit, printed circuit board or device. As such, the communication signals utilizing the frequency diversity are signals that are specifically intended for local transceivers and are, in most embodiments, low power high frequency radio frequency signals. Typical frequencies for these local communications are at least 10 GHz. In one specific embodiment, the signals are characterized by a 60 GHz carrier frequency.

These high frequency wireless transmissions may comprise electromagnetic radiations through space or through a substrate, and more particularly, through a wave guide formed by a dielectric substrate formed within a die of an integrated circuit or within a board (including but not limited to printed circuit boards). Thus, the method further includes transmitting from a fourth local transceiver operably coupled to the first local transceiver through a wave guide formed within the substrate to a fifth local transceiver operably disposed to communicate through the substrate (step 658).

In one embodiment of the invention, the fourth local transceiver utilizes a permanently assigned carrier frequency for the transmissions through the wave guide. In a different embodiment of the invention, the fourth local transceiver utilizes a determined carrier frequency for the transmissions through the wave guide, wherein the determined carrier frequency is chosen to match a carrier frequency being transmitted by the first local transceiver. This approach advantageously reduces a frequency conversion step.

With respect to the carrier frequencies for the electromagnetic radiations to other local transceivers through space, the first and second carrier frequencies are statically and permanently assigned in one embodiment. In an alternate embodiment, the first and second carrier frequencies are dynamically assigned based upon detected carrier frequencies. Utilizing dynamically assigned carrier frequencies is advantageous in that interference may further be reduced or eliminated by using frequency diversity to reduce the likelihood of collisions or interference. A disadvantage, however, is that more overhead is required in that this embodiment includes logic for the transmission of identified carrier frequencies or channels amongst the local transceivers to coordinate frequency selection.

Figure 19:
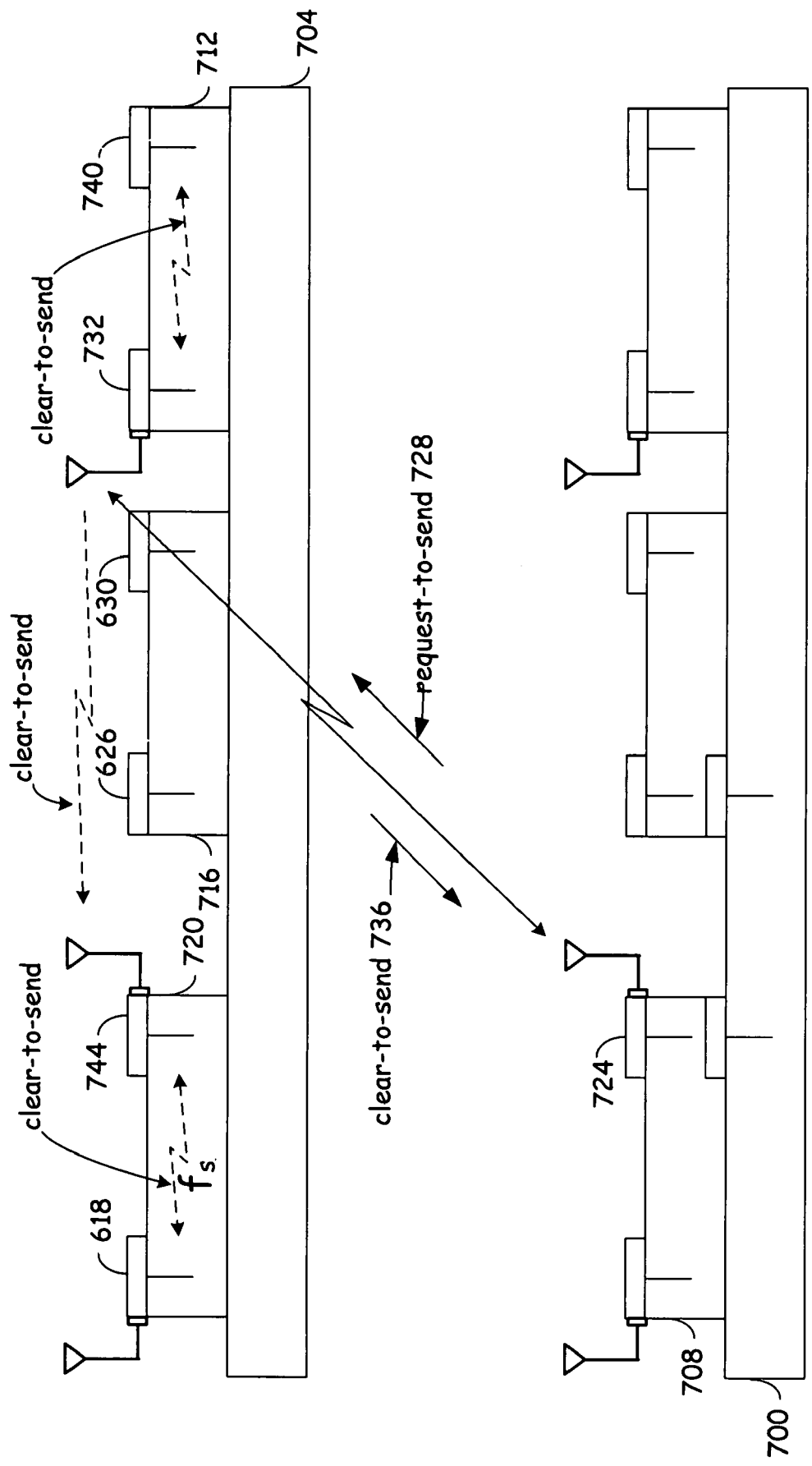
FIG. 19 is a functional block diagram that illustrates an apparatus and corresponding method of wireless communications within the apparatus for operably avoiding collisions and interference utilizing a collision avoidance scheme to coordinate communications according to one embodiment of the invention.

FIG. 19 is a functional block diagram that illustrates an apparatus and corresponding method of wireless communications within the apparatus for operably avoiding collisions and interference utilizing a collision avoidance scheme to coordinate communications according to one embodiment of the invention. More specifically, a plurality of local transceivers for local communications and at least one remote transceiver for remote communications operably installed on an integrated circuit or device board having a plurality of integrated circuit local transceivers are shown.

The collision avoidance scheme is utilized for communications comprising very high radio frequency signals equal to or greater than 10 GHz in frequency for local transceiver communications amongst local transceivers operably disposed within the same device and even within the same supporting substrate. Referring to FIG. 19, a plurality of local transceivers are shown that are operable to generate wireless communication signals to other local transceivers located on the same board or integrated circuit or with local transceivers on a proximate board (not shown here in FIG. 19) within the same device.

In addition to the example of FIG. 19, one may refer to other Figures of the present specification for support therefor. For example, FIGS. 9, 14 and 17 illustrate a plurality of boards/integrated circuits (collectively "supporting substrates") that each contain local transceivers operable to wirelessly communicate with other local wireless transceivers. In one embodiment, at least one supporting substrate (board, printed circuit board or integrated circuit die) is operable to support transceiver circuitry that includes one or more transceivers thereon. For the embodiments of the invention, at least three local transceivers are operably disposed across one or more supporting substrates, which supporting substrates may be boards that merely hold and provide power to integrated circuits, printed circuit boards that support the integrated circuits as well as additional circuitry, or integrated circuits that include radio transceivers.

For exemplary purposes, the embodiment of FIG. 19 includes first and second supporting substrates 700 and 704 for supporting circuitry including transceiver circuitry. A first radio transceiver integrated circuit 708 is supported by substrate 700, while a second, third and fourth radio transceiver integrated circuit die 712, 716 and 720, respectively, are operably disposed upon and supported by the second supporting substrate 704.

At least one intra-device local transceiver is formed upon each of the first, second, third and fourth radio transceiver integrated circuit die 708-720 and is operable to support wireless communications with at least one other of the intra-device local transceivers formed upon the first, second, third and fourth radio transceiver integrated circuit die 708-720.

The first and second intra-device local transceivers are operable to wirelessly communicate with intra-device local transceivers utilizing a specified collision avoidance scheme. More specifically, in the embodiment of FIG. 19, the collision avoidance scheme comprises a carrier sense multiple access scheme wherein each of the first and second intra-device local transceivers is operable to transmit a request-to-send signal and does not transmit until it receives a clear-to-send response from the intended receiver. Thus, each local transceiver, in this embodiment, is operable to transmit a request-to-send signal to a specific local transceiver that is a target of a pending communication (the receiver of the communication) prior to initiating a data transmission or communication.

For example, the embodiment of FIG. 19 shows a first local transceiver 724 transmitting a request-to-send signal 728 to a second local transceiver 732. Additionally, each local transceiver is further operable to respond to a received request-to-send signal by transmitting a clear-to-send signal if there is no indication that a channel is in use. Thus, in the example of FIG. 19, local transceiver 732 generates a clear-to-send signal 736 to local transceiver 724.

As another aspect of the embodiment of FIG. 19, each local transceiver that receives the clear-to-send signal 736 is operable to set a timer to inhibit transmissions for a specified period. Thus, even though clear-to-send signal 736 was transmitted by local transceiver 732 to local transceiver 724, each local transceiver that detects clear-to-send signal 736 is operable to inhibit or delay future transmissions for a specified period.

In the example of FIG. 19, local transceiver 732 is further operable to broadcast the clear-to-send signal 736 to all local transceivers in range to reduce the likelihood of collisions. Thus, local transceiver 732 transmits (by way of associate substrate transceivers) the clear-to-send signal 736 to a local transceiver 740 that is also formed upon die 712.

As may also be seen, a local transceiver 744 is operable to detect clear-to-send signal 736 and to, forward the clear-to-send signal 736 to each local transceiver on the same die 720 by way of local transceivers. In the example shown, local transceiver 744 sends clear-to-send signal 736 to a transceiver 748 by way of substrate transceivers within die 720.

In one embodiment, the request-to-send signal is only generated for data packets that exceed a specified size. As another aspect of the embodiments of the present invention, any local transceiver that detects a clear-to-send signal response sets a timer and delays any transmissions on the channel used to transmit the clear-to-send signal for a specified period. In yet another embodiment of the invention, a local transceiver merely listens for activity on a specified channel and transmits if no communications are detected.

The collision avoidance scheme in a different embodiment is a master/slave scheme similar to that used in personal area networks including Bluetooth™ protocol or standard devices. As such, a local transceiver is operable to control a communication as a master or to participate as directed in the role of a slave in the master/slave protocol communications. Further, the local transceiver is operable to operate as a master for one communication while operating as a slave in a different but concurrent communication.

Figure 20:
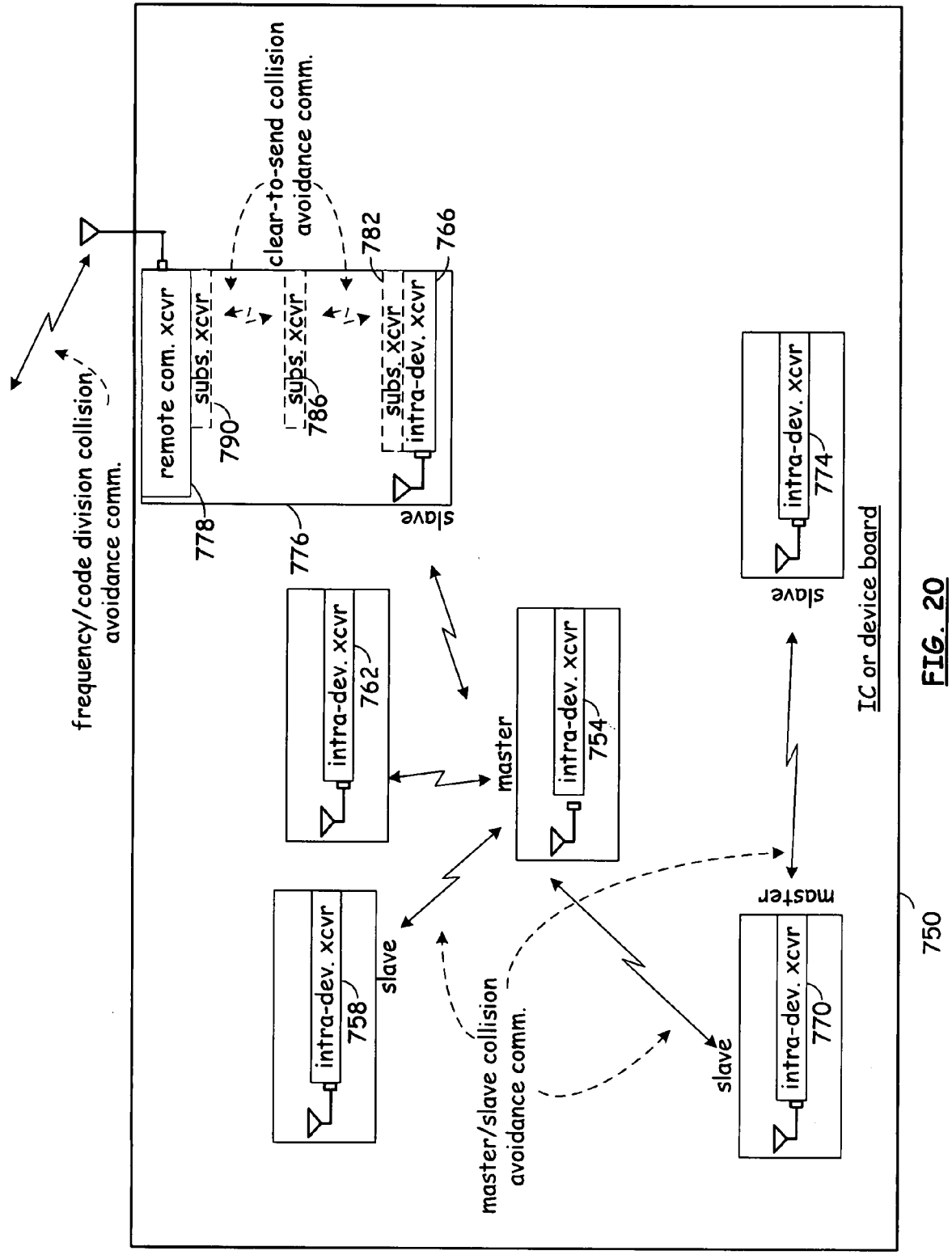
FIG. 20 is a functional block diagram of a substrate supporting a plurality of local transceivers operable according to one embodiment of the invention.

FIG. 20 is a functional block diagram of a substrate supporting a plurality of local transceivers operable according to one embodiment of the invention. A supporting board 750 is operable to support a plurality of integrated circuit radio transceivers. In the described embodiment, the transceivers are intra-device local transceivers that are operable to communicate with each other utilizing a very high radio frequency (at least 10 GHz). The supporting substrate may be any type of supporting board including a printed circuit board or even an integrated circuit that includes (supports) a plurality of local transceivers (intra-device transceivers). In the embodiment shown, the primary collision avoidance scheme is a master/slave implementation to control communications to avoid conflict and/or collisions. As may be seen, for the present operations, a local transceiver 754 (intra-device transceiver) is operable to control communications as a master for communications with transceivers 758, 762, 766 and 770. Transceiver 770, which is a slave for communications with transceiver 754, is a master for communications with transceiver 774.

While the primary collision avoidance scheme shown here in FIG. 20 is a master/slave scheme, it should be understood that a collision avoidance system as described in relation to FIG. 19 that includes the transmission of request-to-send and clear-to-send signals may also be implemented. In an embodiment of the invention in which the substrate is a board, such as a printed circuit board, the embodiment may further include a plurality of transceivers within an integrated circuit that is supported by the board. Thus, for example, if an integrated circuit 776 comprises an integrated circuit that includes intra-device transceiver 766 and a remote communication transceiver 778 in addition to a plurality of substrate transceivers 782, 786 and 790, a collision avoidance scheme is also implemented for communications within the integrated circuit 776, then either the same type of a different type of collision avoidance scheme may be implemented.

For example, a master/slave scheme is used for intra-device transceivers while a carrier sense scheme is used to avoid collisions within integrated circuit 776. Moreover, such schemes may be assigned for other communications including board-to-board (a local intra-device transceiver on a first board to a local intra-device transceiver on a second board). Moreover, any known collision avoidance scheme may also be used by remote communications transceiver 778 for remote communications (communications with remote devices). Use of carrier sense and master/slave schemes are particularly advantageous for communications that are not separated through frequency diversity (FDMA transmissions), space diversity (directional antennas), or even code diversity if a code division multiple access (CDMA) scheme is utilized to avoid collisions between intra-device local transceivers.

Figure 21:
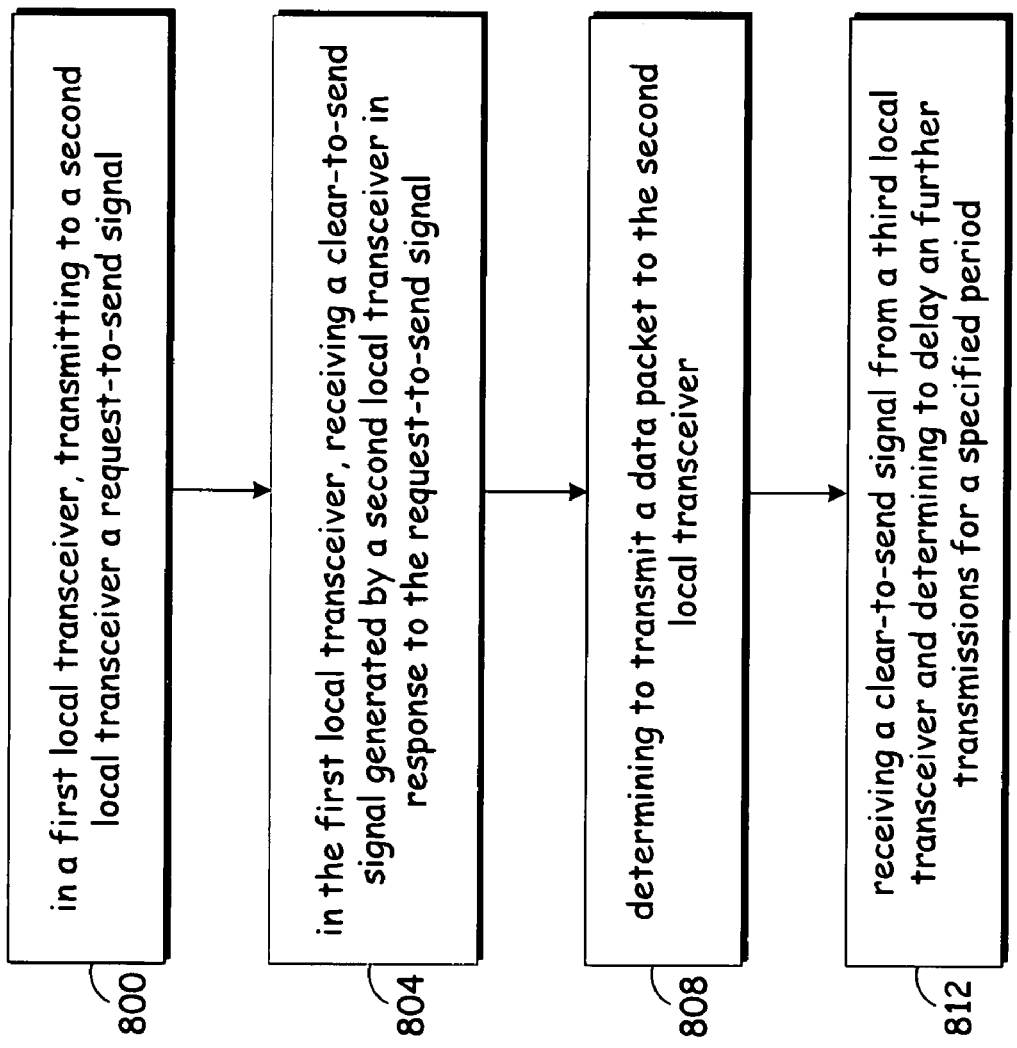
FIG. 21 illustrates a method for wireless local transmissions in a device according to one embodiment of the invention.

FIG. 21 illustrates a method for wireless local transmissions in a device according to one embodiment of the invention. The method includes, in a first local transceiver, transmitting to a second local transceiver a request-to-send signal (step 800). The method further includes, in the first local transceiver, receiving a clear-to-send signal generated by a second local transceiver in response to the request-to-send signal (step 804). After receiving the clear-to-send signal, the method includes determining to transmit a data packet to the second local transceiver (step 808) wherein the second local transceiver is operably disposed either within the integrated circuit or within a device housing the integrated circuit.

In one embodiment of the invention, the step of transmitting the request-to-send signal occurs only when the data packet to be transmitted exceeds a specified size. Finally, the method includes receiving a clear-to-send signal from a third local transceiver and determining to delay any further transmissions for a specified period (step 812). Generally, the method described in relation to FIG. 21 is a carrier sense scheme. Along these lines, variations to carrier sense schemes may be implemented. For example, in one alternate embodiment, a detection of a request-to-send type of signal may trigger a timer in each local transceiver that detects the request-to-send type of signal to delay transmissions to avoid a conflict. In yet another embodiment, a local transceiver merely initiates a communication if no other communications are detected on a specified communication channel.

Figure 22:
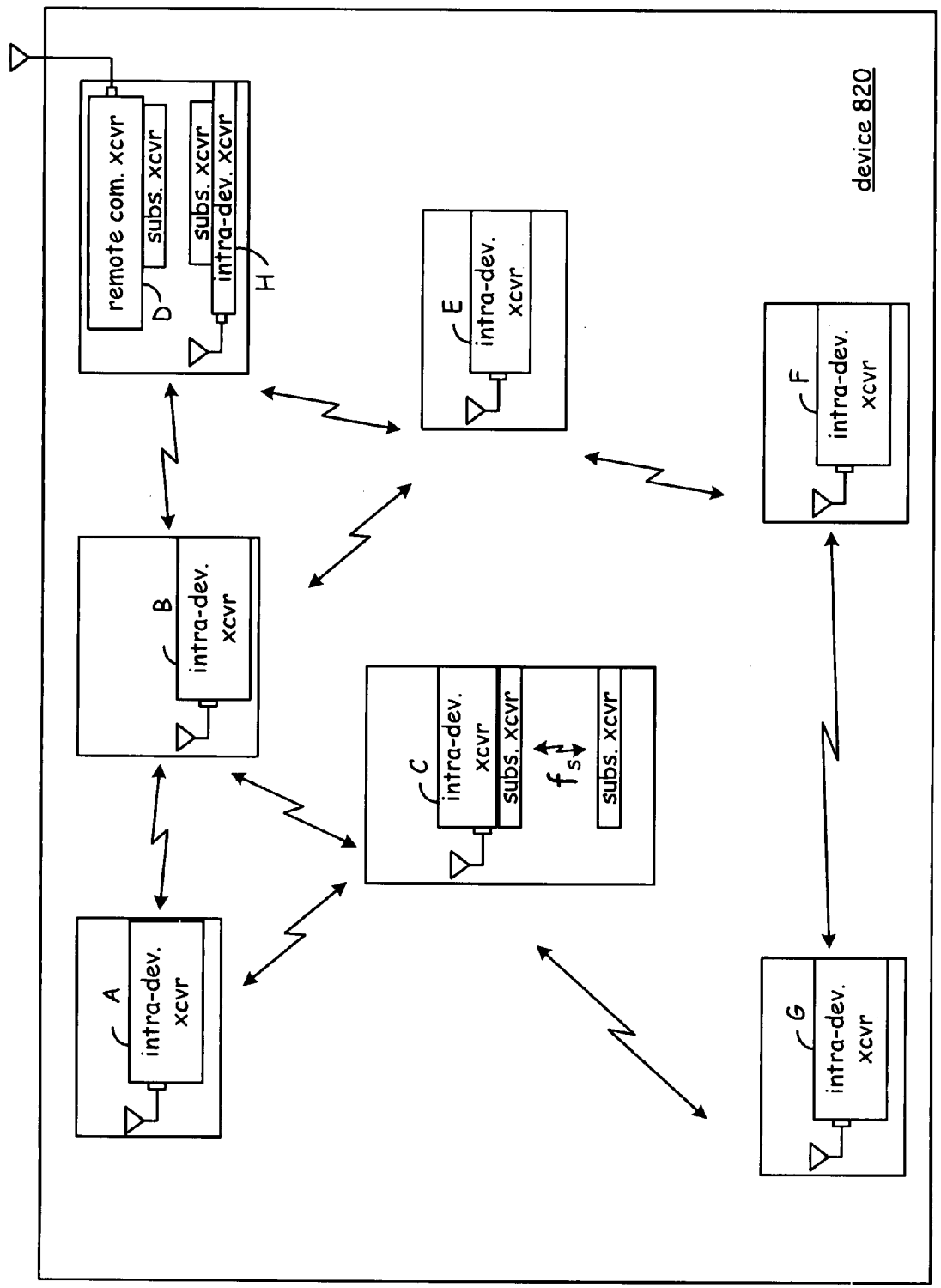
FIG. 22 is a functional block diagram a device that includes a mesh network formed within a board or integrated circuit according to one embodiment of the invention.

FIG. 22 is a functional block diagram a device that includes a mesh network formed within a board or integrated circuit according to one embodiment of the invention. Referring to FIG. 22, each of the local transceivers supported by a substrate 820 is operable as a node in a board level mesh network for routing communication signals from one local transceiver to another that is out of range for very short range transmissions at a very high radio frequency. More specifically, a network formed within a device that includes local transceivers A, B, C, D, E, F, G and H is operable to relay communications as a node based mesh network for defining multiple paths between any two local transceivers. In the embodiment shown, each of the local transceivers comprises a very high radio frequency transceiver for communications with local intra-device transceivers all within the same device. In one embodiment, the very high frequency local transceivers communicate at frequencies that equal at least 10 GHz. In one specific embodiment, the very high RF signal is a 60 GHz signal. The described embodiments of the invention include local transceivers that are operable to radiate electromagnetic signals at a low power to reduce interference with remote devices external to the device housing the board or integrated circuit (collectively "substrate") of FIG. 22.

The plurality of local transceivers of FIG. 22 operably form a mesh network of nodes that evaluate transceiver loading as well as communication link loading. Thus, each of the local transceivers A-H is operable to transmit, receive and process loading information to other local transceivers within the same device. Moreover, each is operable to make a next hop (transmit to a next intermediary node or local transceiver for forwarding towards the final destination node or local transceiver) and routing decisions based upon the loading information in relation to destination information (e.g., a final destination for a communication).

Figure 23:
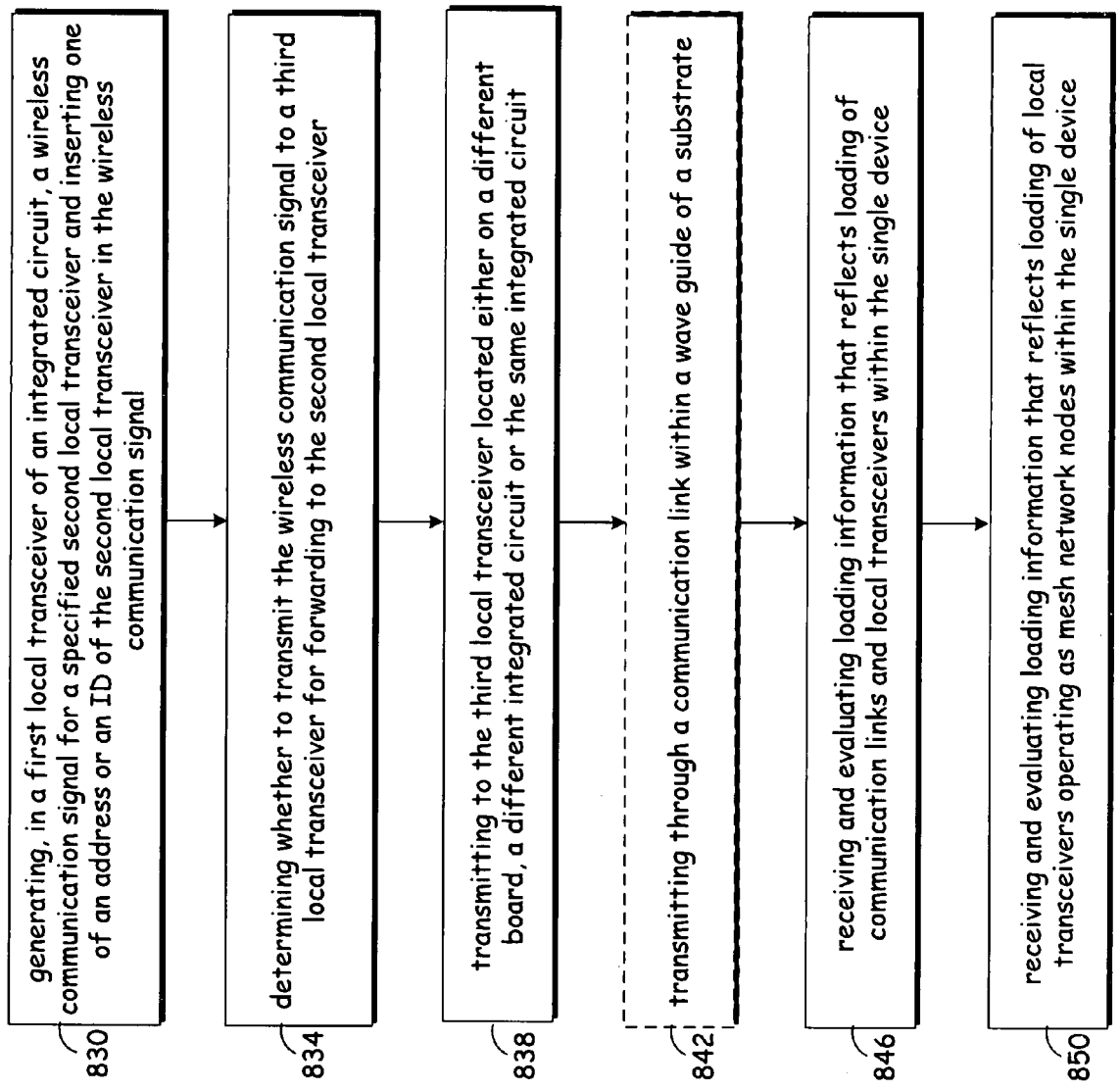
FIG. 23 is a flow chart illustrating a method according to one embodiment of the invention for routing and forwarding communications amongst local transceivers operating as nodes of a mesh network all within a single device.

FIG. 23 is a flow chart illustrating a method according to one embodiment of the invention for routing and forwarding communications amongst local transceivers operating as nodes of a mesh network all within a single device. The method includes initially generating, in a first local transceiver of an integrated circuit, a wireless communication signal for a specified second local transceiver and inserting one of an address or an ID of the second local transceiver in the wireless communication signal (step 830). As a part of transmitting the communication to the second transceiver, the method includes determining whether to transmit the wireless communication signal to a third local transceiver for forwarding the communication towards the second local transceiver either directly or to a fourth local transceiver for further forwarding (step 834). The next step thus includes sending the communication to the third local transceiver through a wireless communication link (step 838). The third local transceiver may be operably disposed (located) on a different board, a different integrated circuit on the same board, or even on the same integrated circuit. If on the same integrated circuit or board, the method optionally includes transmitting the communication within a wave guide formed within same integrated circuit or board or supporting substrate (step 842). The method further includes receiving loading information for loading of at least one communication link or at least one local transceiver (step 846). Thus, the method includes making routing and next hop determinations based upon the received loading information (step 850).

A given local transceiver of FIG. 22 is therefore operable to perform any combination or subset of the steps of FIG. 23 in addition to other steps to support operation as a node within a mesh network. More specifically, a first local transceiver is operable to forward communications as nodes in a mesh network wherein each node forms a communication link with at least one other node to forward communications. Communications received at the first local transceiver from a second local transceiver located on the same substrate may be forwarded to a third local transceiver located on the same substrate. The first local transceiver is further operable to establish a communication link with at least one local transceiver operably disposed on a separate substrate whether the separate substrate is a different integrated circuit operably disposed on the same board or a different integrated circuit operably disposed on a different board.

Each local transceiver, for example, the first and second local transceivers, is operable to select a downstream local transceiver for receiving a communication based upon loading. Loading is evaluated for at least one of an integrated circuit or a communication link. Each originating local transceiver is further operable to specify a final destination address for a communication and to make transmission decisions based upon the final destination address in addition to specifying a destination address for a next destination of a communication (the next hop) and to make transmission decisions based upon a final destination address. Finally, it should be noted that the mesh communication paths may be determined statically or dynamically. Thus, evaluating loading condition is one embodiment in which the routing is determined dynamically. In an alternate embodiment, however, communication routing may also be determined statically on a permanent basis.

Figure 24:
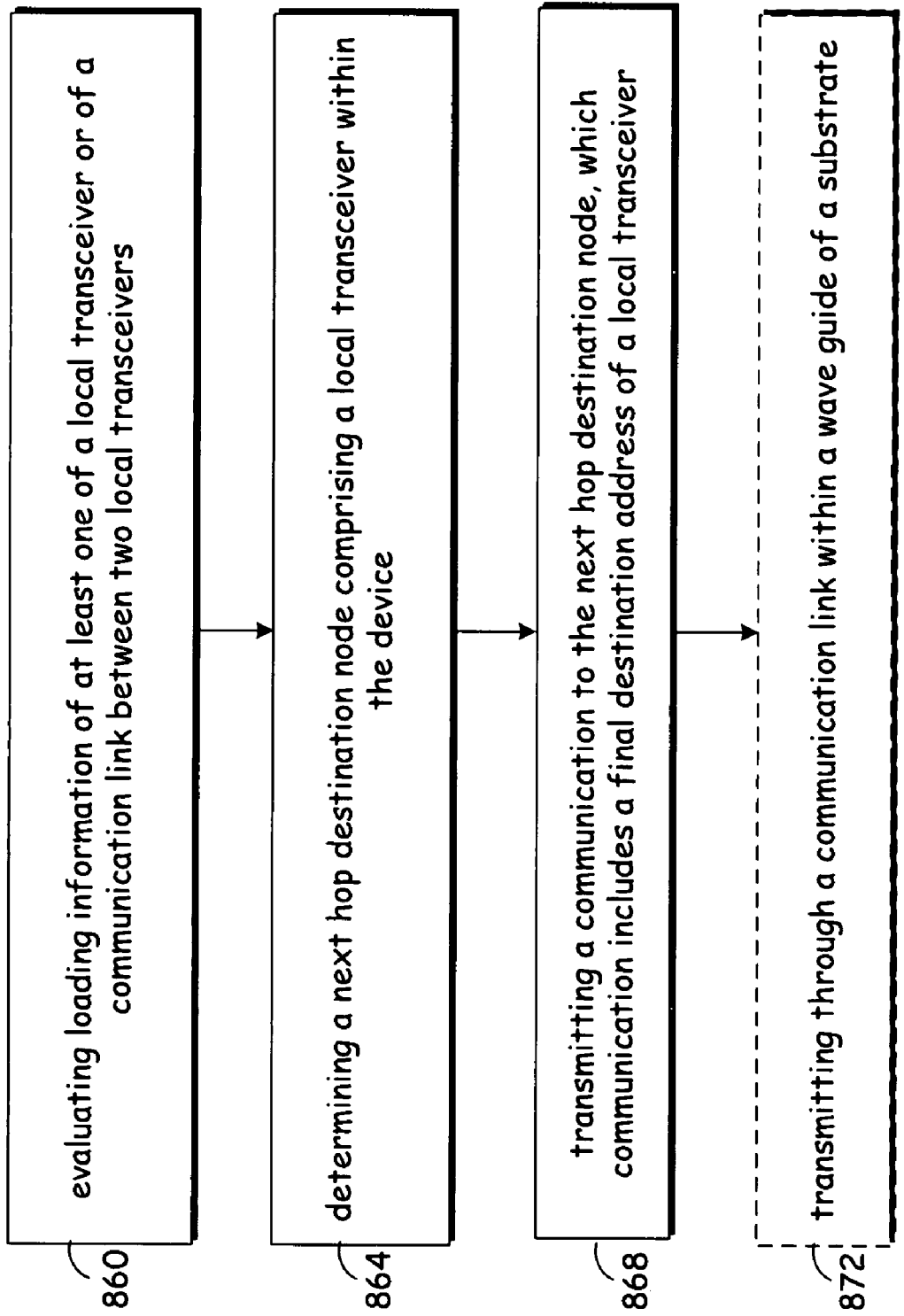
FIG. 24 illustrates a method for communications within a device according to one embodiment of the invention in which communications are transmitted through a mesh network within a single device.

FIG. 24 illustrates a method for communications within a device according to one embodiment of the invention in which communications are transmitted through a mesh network within a single device. The method includes evaluating loading information of at least one of a local transceiver or of a communication link between two local transceivers (step 860) and determining a next hop destination node comprising a local transceiver within the device (step 864). Thereafter, the method includes transmitting a communication to the next hop destination node, which communication includes a final destination address of a local transceiver (step 868). Generally, determining the next hop destination node is based upon loading information and upon the final destination of the communication. For a given route for a communication, communication links may result between local transceivers operably disposed on the same substrate, between local transceivers on the different integrated circuits operably disposed on the same substrate, between local transceivers on the different integrated circuits operably disposed on the same board, and between local transceivers on the different integrated circuits operably disposed on different substrates. A method optionally includes utilizing at least one communication link between local transceivers operably coupled by way of a wave guide formed within a substrate supporting the local transceivers (step 872).

Figure 25:
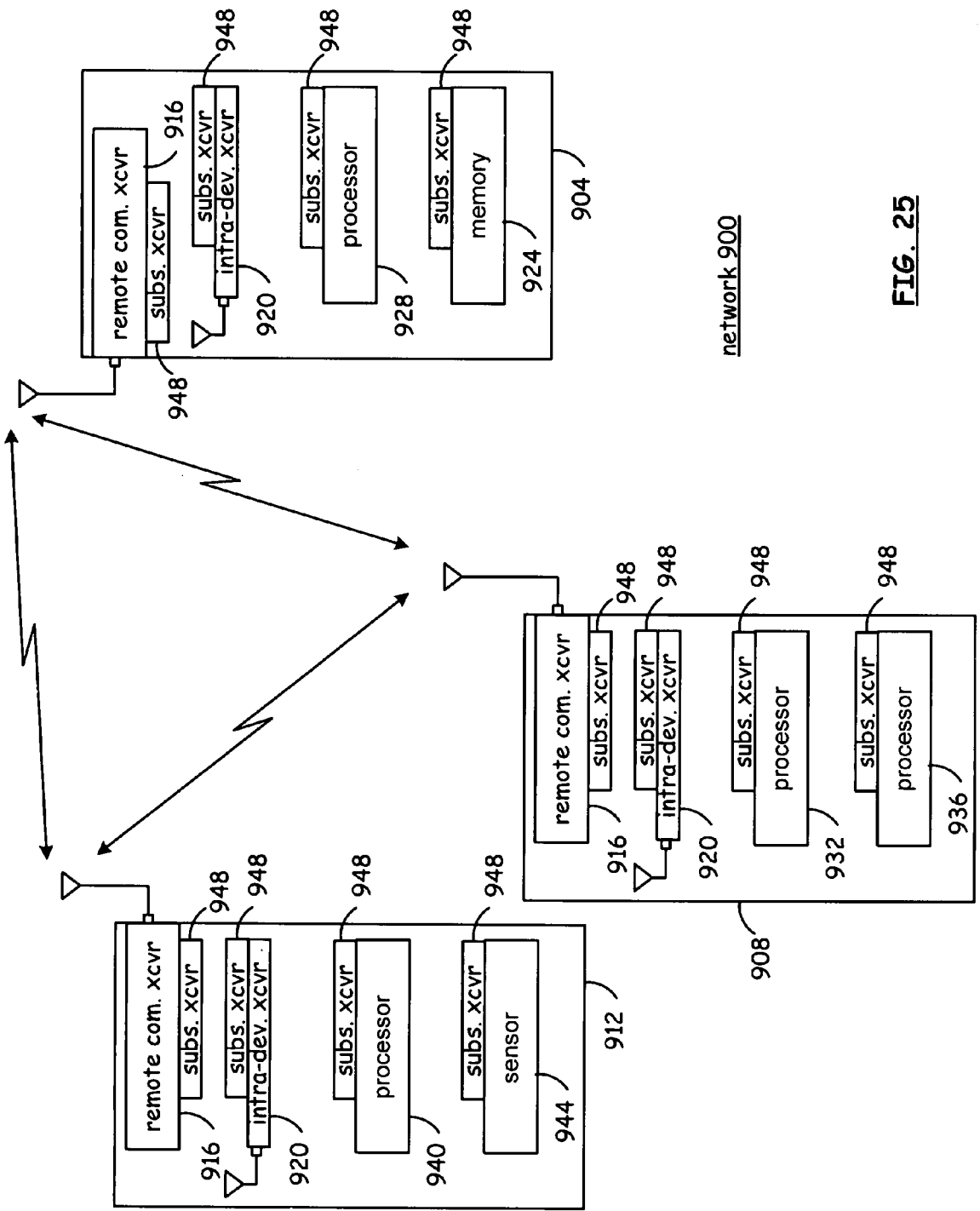
FIG. 25 is a functional block diagram of a network operating according to one embodiment of the present invention.

FIG. 25 is a functional block diagram of a network operating according to one embodiment of the present invention. A network 900 includes a plurality of devices 904, 908 and 912 that are operable to communicate using remote communication transceivers 916. These communications may be using any known communication protocol or standard including 802.11, Bluetooth, CDMA, GSM, TDMA, etc. The frequency for such communications may also be any known radio frequency for the specified communication protocol being used and specifically includes 900 MHz, 1800 MHz, 2.4 GHz, 60 GHz, etc.

Within each of the devices 904-912, intra-device local transceivers 920 communicate with each other at very high radio frequencies that are at least 10 GHz to provide access to a specific circuit module within the device. For example, intra-device local transceivers 920 may be utilized to provide access to memory 924 or processor 928 of device 904, to processors 932 and 936 of device 908, or to processor 940 and sensor 944 of device 912. Additionally, where available, access may also be provided through substrate communications using substrate transceivers 948. In the described embodiments, the substrate processors operate at very high radio frequencies of at least 10 GHz.

Within each device, the frequencies used may be statically or dynamically assigned as described herein this specification. Further, mesh networking concepts described herein this specification may be used to conduct communications through out a device to provide access to a specified circuit module. Additionally, the described collision avoidance techniques may be utilized including use of a clear-to-send approach or a master/slave approach to reduce interference and collisions.

As one application of all of the described embodiments, a tester may access any given circuit block or element using any combination of the remote communication transceivers 916, the intra-device local transceivers 920 or the substrate transceivers 948. As another application, such inter-device and intra-device communications may be used for resource sharing. Thus, for example, a large memory device may be placed in one location while a specialty application device and a computing device are placed in other locations. Such wireless communications thus support remote access to computing power of the computing device, to memory of the memory device or to the specific sensor of the specialty application device. While FIG. 25 illustrates distinct devices 904-912, it should be understood that some of these devices may also represent printed circuit boards or supporting boards housing a plurality of integrated circuit blocks that provide specified functions. For example a remote device 904 may communicate through the remote communication transceivers with two printed circuit boards 908 and 912 within a common device.

Figure 26:
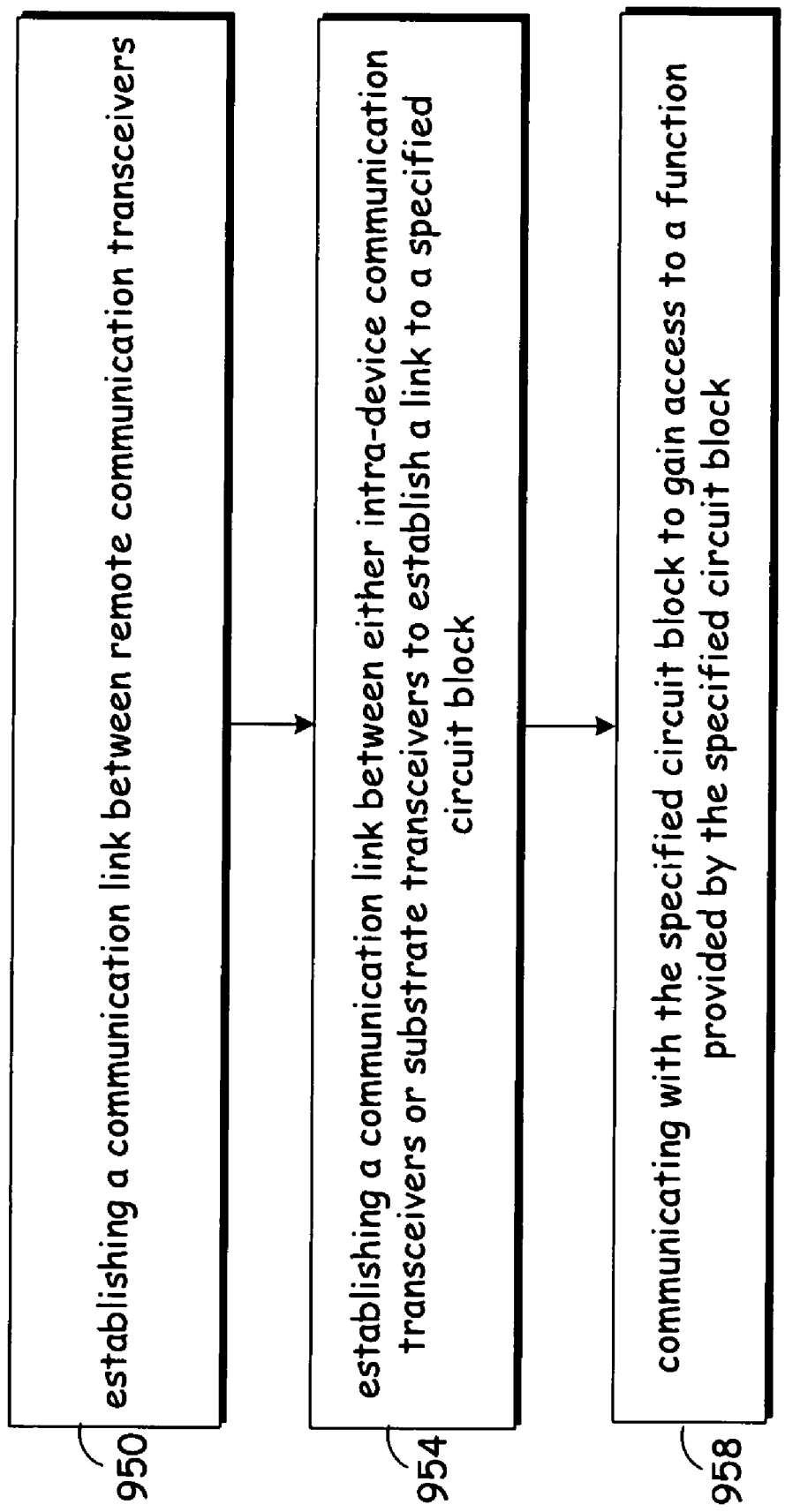
FIG. 26 is a flow chart illustrating a method according to one embodiment of the invention.

FIG. 26 is a flow chart illustrating the use of a plurality of wireless transceivers to provide access to a specified circuit block according to one embodiment of the invention. The method includes establishing a first communication link between remote communication transceivers (step 950), establishing a second communication link between either intra-device communication transceivers or substrate transceivers to establish a link to a specified circuit block (step 954), and communicating with the specified circuit block to gain access to a function provided by the specified circuit block (step 958). These steps include coupling the first and second communication links and, as necessary, translating communication protocols from a first to a second protocol and translating frequencies from a first frequency to a second frequency. As such, a remote device may access a specified circuit block to achieve the benefit of a function of the specified circuit block or to obtain data or to test one or more circuit blocks.

Figure 27:
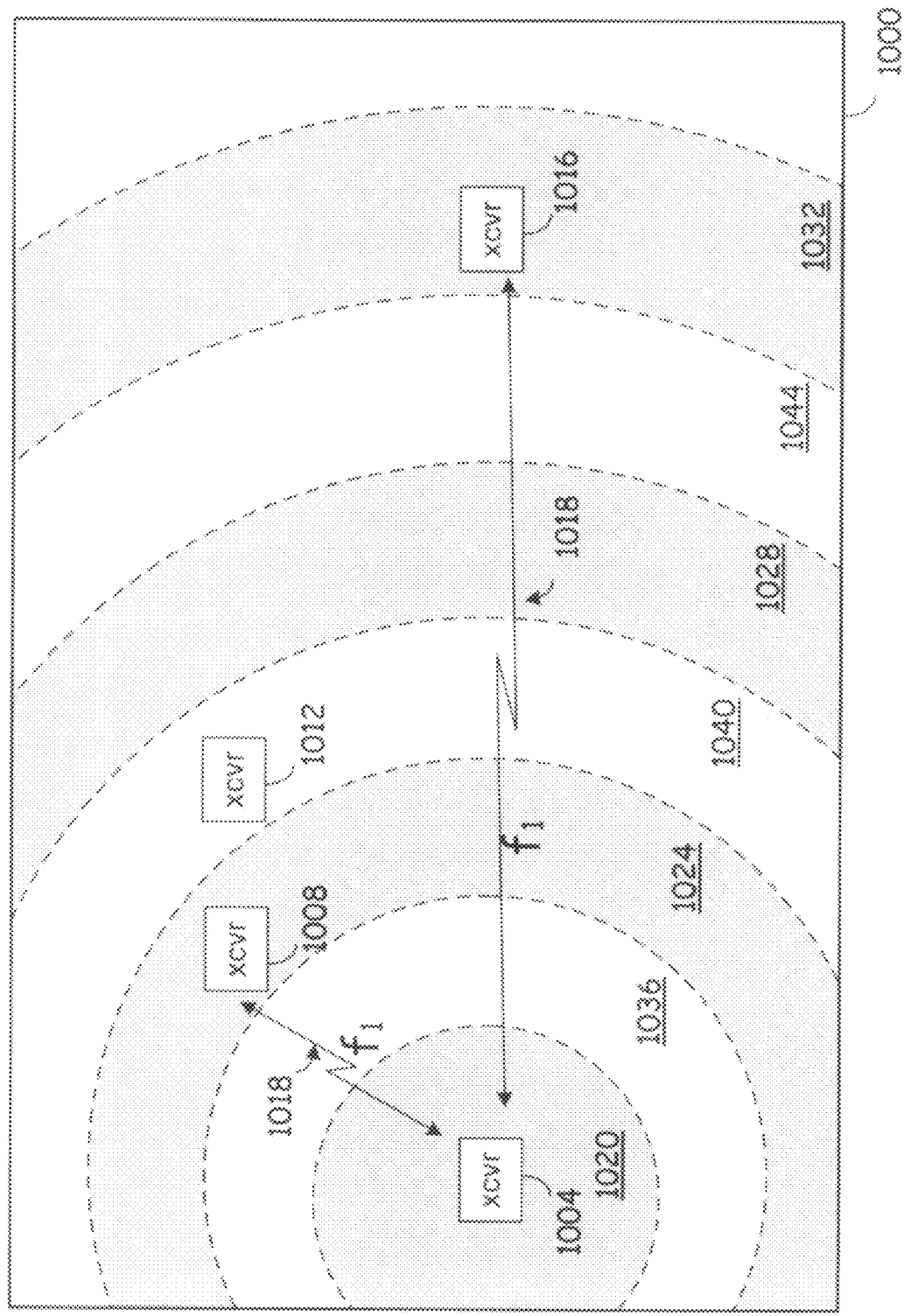
FIG. 27 is a functional block diagram of a plurality of substrate transceivers operably disposed to communicate through a substrate according to one embodiment of the invention.

FIG. 27 is a functional block diagram of a plurality of substrate transceivers operably disposed to communicate through a substrate according to one embodiment of the invention. A substrate 1000 is shown with a plurality of substrate transceivers 1004, 1008, 1012 and 1016 operably disposed to communicate through substrate 1000. For the purposes of the example of FIG. 27, a peak and null pattern for transmissions 1018 from transceiver 1004 at a frequency f1 is shown. More specifically, peak regions 1020, 1024, 1028 and 1032 and null regions 1036, 1040, 1044 are shown for transmissions 1018 from transceiver 1004 at frequency f1. As may be seen, transceivers 1008 and 1016 are operable disposed within peak regions 1024 and 1032, respectively, while transceiver 1012 is operably disposed within null region 1040.

One aspect of the transmissions by the transceivers 1004-1016 is that the transmissions are at a very high radio frequency that is at least 10 GHz. In one embodiment, the transmissions are in the range of 50-75 GHz. A low efficiency antenna is used to radiate low power RF signals in one embodiment. Peak regions within a transmission volume whether a substrate or space within a device are advantageous for creating a signal strength that is sufficiently strong at any receiver operably disposed within the peak region to be satisfactorily received and processed. On the other hand, the signal strength is sufficiently low to inhibit the ability of a receiver in a null region to receive and process a given signal. Thus, one embodiment of the invention includes placing transceivers within expected peak regions and null regions for a specified frequency that a transceiver is assigned to use for transmissions within a device or substrate (whether the substrate is a dielectric substrate of a board such as a printed circuit board or of a die of an integrated circuit).

Another of the embodiments of the invention illustrated here in FIGS. 27-31 is that frequencies are dynamically assigned based at least in part to place a destination receiver (or at least the antenna of the receiver) of a receiver of a transceiver, that is disposed in a fixed position in relation to the transmitter, within a peak or null region according to whether a communication is intended. Generally, within a device or substrate within which the radio signals are being wirelessly transmitted, energy from reflections off of an interior surface of the substrate or structure within the device will add or subtract from the signal radiated from the antenna according whether the reflected signal is in phase with the signal from the antenna or out of phase.

Not only does the phase relationship of the radiated signal and reflected signals affect the peak and null regions, but the relative amplitude affects the extent of that a null region minimizes the magnitude of the received signal. For two signals to cancel each other out to create a complete null when the two are out of phase by 180 degrees, the two signals are required to be equal in amplitude.

Referring back to FIG. 27, if one assumes, especially for such very high radio frequency transmissions that travel a very short distance within a substrate or a device (as is especially the case for very high frequency, low power transmissions from low efficiency antennas), that the magnitude of the reflected signals are substantially equal to the magnitude of the transmitted signal, then transmitted signals are substantially canceled in the null regions and a peak magnitude will be equal to nearly twice the peak of the radiated signal in the peak regions. The embodiments of the invention assume a transceiver and antenna structure and power that produce such results. As such, transceiver 1012, since located in a null region, will receive a signal that is too attenuated to be received and processed even if transceiver 1004 transmits a signal at frequency f1 that is intended for transceiver 1012.

Figure 28:
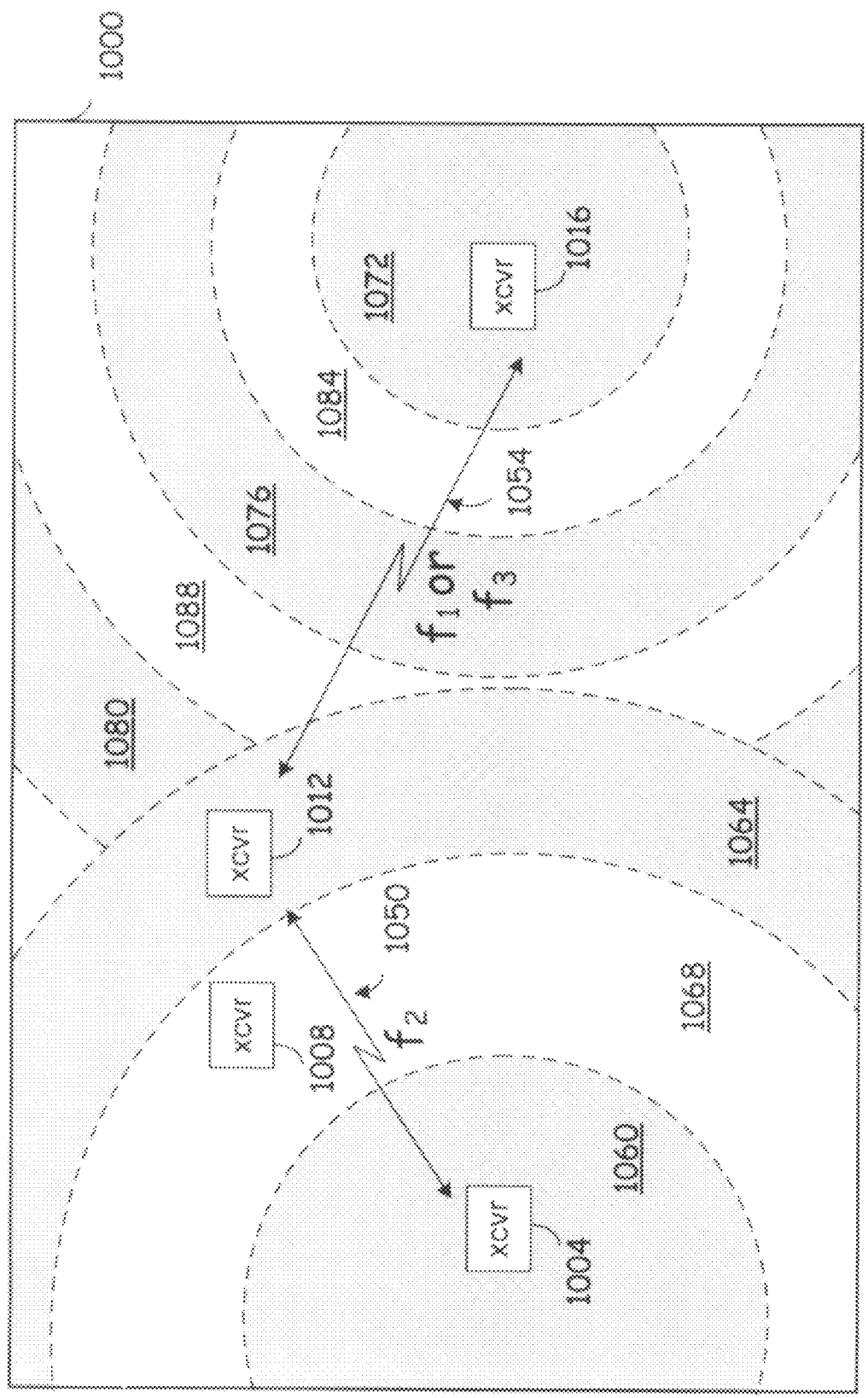
FIG. 28 is a functional block diagram of a plurality of substrate transceivers operably disposed to communicate through a substrate according to one embodiment of the invention.

FIG. 28 is a functional block diagram of a plurality of substrate transceivers operably disposed to communicate through a substrate according to one embodiment of the invention. More specifically, FIG. 28 illustrates the same substrate 1000 and transceivers 1004-1016 of FIG. 27. It may be seen, however, in comparing FIGS. 27 and 28, that the peak and null regions are different for transmissions 1050 from transceiver 1004 for transmissions at frequency f2 versus f1. More specifically, at frequency f2, transceiver 1004 transmission 1050 generates peak regions 1060 and 1064 and null region 1068. Transceiver 1016 transmission 1054 generates peak regions 1072, 1076 and 1080 and null regions 1084 and 1088 at frequencies f1 or f3.

As may be seen in FIG. 28, for transceiver 1004 transmissions 1050 at frequency f2, transceiver 1008 is in a null region while transceiver 1012 is in a peak region. In FIG. 27, on the other hand, transceiver 1008 was in a peak region while transceiver 1012 was in a null region for transmissions Thus, one aspect of the embodiment of the present invention is that transceiver 1004 is operable, for example, to select frequency f1 for transmissions to transceiver 1008 and frequency f2 for transmissions to transceiver 1012. As such, transceiver 1012 is operable to communicate with transceiver 1004 using a first frequency f2 and with transceiver 1016 using a second (different) frequency, namely f1 or f3. As may also be seen, transceiver 1016 generates its own peak and null regions and is operable to communicate with transceiver 1012 using frequencies f1 or f3.

One aspect of the embodiment of the present invention is that transceiver 1004 is operable to select frequencies that achieve desired results for a given configuration (relative placement) of transceivers. For example, transceiver 1004 is operable to select a first frequency that creates a multi-path peak for the second transceiver location and a multi-path null for the third transceiver location and to select a second frequency that creates a multi-path peak for the third transceiver location and a multi-path null for the second transceiver location. Transceiver 1004 is further operable to select a third frequency that creates a multi-path peak for the second and third transceiver locations.

Referring back to FIG. 27, transceiver 1004 is further operable to select a frequency that can result in defined peak regions overlapping two specified transceivers while creating a null region for a third (or third and fourth) transceiver. For example, in FIG. 27 wherein a fourth transceiver is shown, transceiver 1004 is operable to select a frequency (e.g., the first frequency) that enables communication signals to reach the fourth substrate transceiver (transceiver 1016) wherein the second and fourth radio transceivers 1008 and 1016 are both in expected peak regions.

As yet another aspect of the embodiments of the present invention, transceivers according to the embodiments of the present invention are also operable to select a frequency based upon frequencies being used by intra-device local transceivers within the same device and further based upon locations of the intra-device local transceivers.

Figure 29:
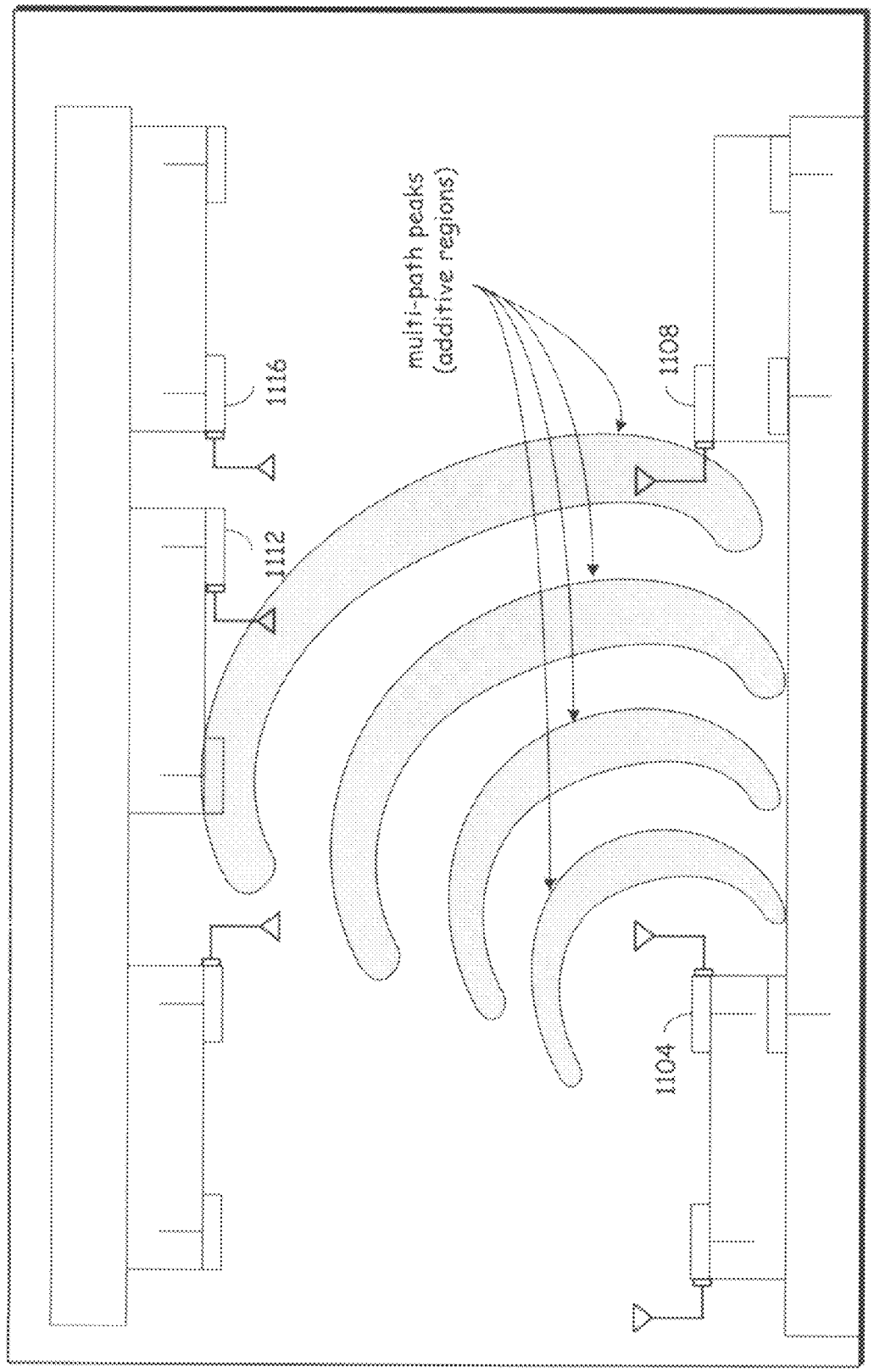
FIG. 29 is a functional block diagram of a plurality of intra-device local transceivers operably disposed to wirelessly communicate through a device with other intra-device local transceivers according to one embodiment of the invention.

FIG. 29 is a functional block diagram of a plurality of intra-device local transceivers operably disposed to wirelessly communicate through a device with other intra-device local transceivers according to one embodiment of the invention. A device 1100 is shown that includes a plurality of intra-device local transceivers 1104, 1108, 1112 and 1116. For the purposes of the example of FIG. 29, a peak and null pattern for transmissions from transceiver 1104 at a frequency f1 is shown. More specifically, a plurality of additive or peak regions are shown for transmissions from transceiver 1104 at frequency f1. It should be understood that the peak and null patterns are exemplary for a specified transmitter of a transceiver and that each transceiver of the same type operates in a similar manner. Subtractive or null regions are not specifically shown though it should be understood that subtractive regions that produce a severely attenuated signal and perhaps even cancel the originally transmitted signal to sufficiently create a null region exist in between the peak regions though such subtractive or null regions are not specifically shown.

As may be seen, transceivers 1108 and 1112 are operable disposed within additive or peak regions while transceiver 1116 is operably disposed within a substractive or null region. Within the context of FIGS. 27 and 28, reference was made to peak and null regions. Because the transmissions of FIGS. 27 and 28 are through a substrate that operates as a wave guide, the discussion presumes that null regions are created wherein reflected waves substantially cancel transmitted waves. Here, however, the "null" regions should be understood to be subtractive or null regions. For a given structural environment, there may be more multi-path interference that results in reflective wave patterns having diminished magnitudes thereby not fully canceling the transmitted signal. To reflect this potential result that is a function of a physical layout of structure within a device, the "null" regions should be understood to be subtractive regions that may result in a null, but not necessarily so. The same applies in an additive sense for the regions referred to as peak or additive regions.

One aspect of the transmissions by the intra-device local transceivers 1104-1116 is that the transmissions are at a very high radio frequency that is at least 10 GHz. In one embodiment, the transmissions are in the range of 50-75 GHz. Moreover, a low efficiency antenna is used to radiate low power RF signals in at least one embodiment. Generally, within a device within which the radio signals are being wirelessly transmitted by intra-device local transceivers, energy from reflections off of an interior surface within the device will add or subtract from the signal radiated from the antenna according whether the reflected signal is in phase with the signal from the antenna or out of phase. As such, peak regions within a transmission volume within a device created by a transmission at a specified frequency are advantageous for creating a sufficient signal strength at any intra-device local transceiver operably disposed within the peak region. On the other hand, the signal strength is sufficiently low to inhibit the ability of a receiver in a subtractive or null region (collectively "null region") to receive and process a given signal. Thus, with the embodiments of the invention illustrated here in FIGS. 27-31, intra-device local transceivers dynamically assign frequencies based at least in part on given receiver locations to place a destination receiver of a transceiver within a peak or null region according to whether a communication is intended.

Figure 30:
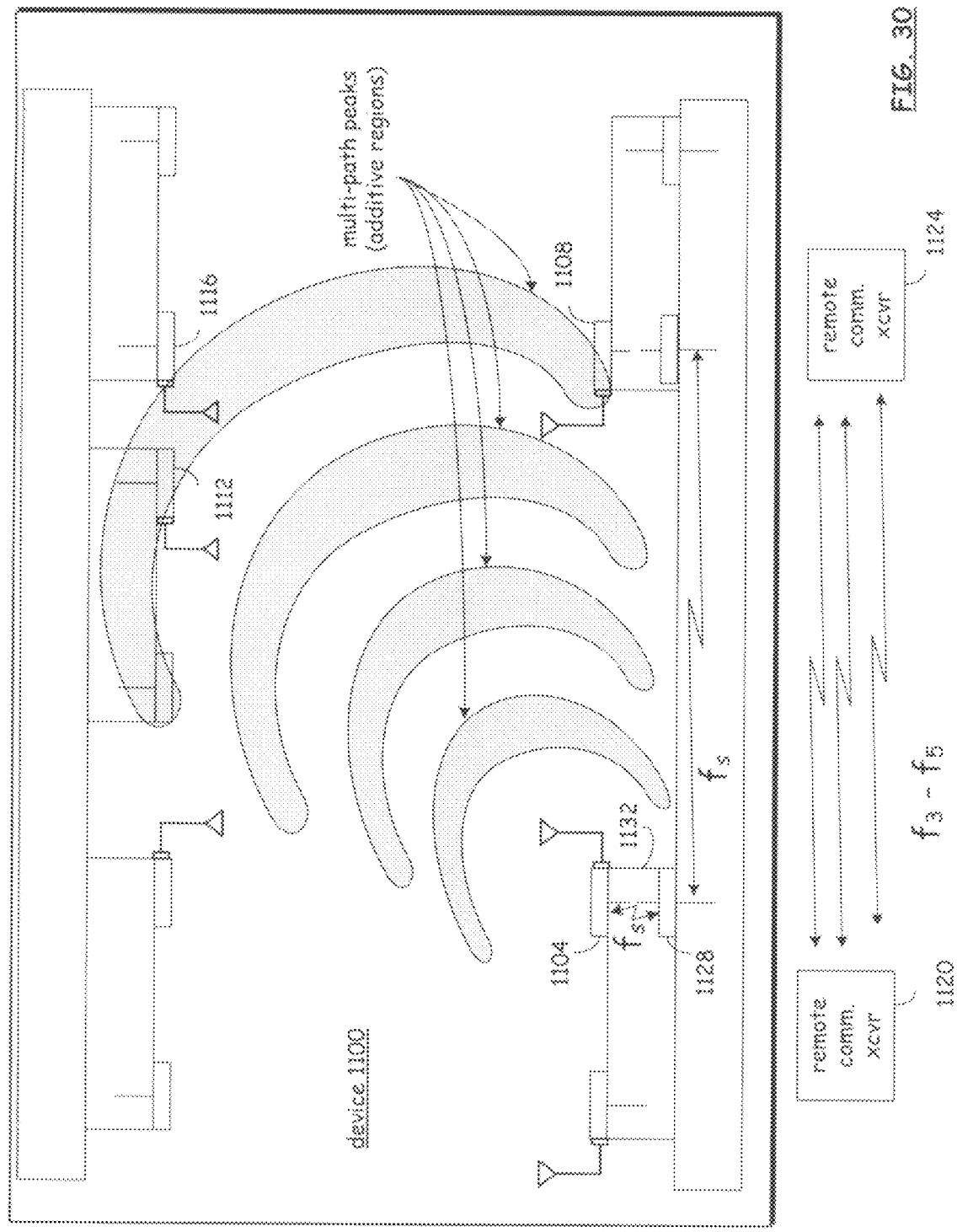
FIG. 30 is a functional block diagram of a plurality of intra-device local transceivers operably disposed to communicate through a device according to one embodiment of the invention.

FIG. 30 is a functional block diagram of a plurality of intra-device local transceivers operably disposed to communicate through a device according to one embodiment of the invention. More specifically, FIG. 30 illustrates the same device 1100 and transceivers 1104-1116 of FIG. 29 but transceiver 1104 is transmitting at a frequency f2. It may be seen, in comparing FIGS. 29 and 30, that the peak and null regions are different for transmissions from transceiver 1104 for transmissions at frequency f2 versus f1 (as shown in FIG. 29). More specifically, at frequency f2, transceiver 1104 generates peak regions and null regions that place transceiver 1116 in a peak region instead of a null region as was the case for transmissions at frequency f1.

As may be seen in FIG. 30, for transmissions at frequency f2, antennas for intra-device local transceivers 1108 and 1112 are in a null region while an antenna for transceiver 1016 is in a peak region. In FIG. 29, on the other hand, transceivers 1108 and 1112 were in a peak region while transceiver 1016 was in a null region for transmissions at frequency f1. Thus, transceiver 1104 is operable to select frequency f1 for transmissions to transceiver 1108 and frequency f2 for transmissions to transceiver 1012.

One aspect of the embodiment of the present invention is that transceiver 1104 is operable to select frequencies that achieve desired results for a given configuration (relative placement of transceivers). For example, transceiver 1104 is operable to select a first frequency that creates a multi-path peak for the second transceiver location and a multi-path null for the third transceiver location and a second frequency that creates a multi-path peak for the third transceiver location and a multi-path null for the second transceiver location. Transceiver 1104 is further operable to select a third frequency that creates a multi-path peak for the second and third transceiver locations.

As another aspect of the embodiment of the present invention, an intra-device local transceiver is further operable to not only evaluate frequency dependent peak and null regions in relation to specified transceivers as a part of selecting a frequency, but also to evaluate frequencies being used by other transceivers including other intra-device local transceivers and remote transceivers to reduce interference. Thus, the intra-device local transceiver is operable to select a frequency that not only produces a desired peak and null region pattern for desired signal delivery, but that also minimizes a likelihood of interference. For example, referring again to FIG. 30, transceiver 1104 is operable to detect frequencies f3-f5 being used externally by remote transceivers 1120 and 1124 and to select frequencies f1 and f2 that produce the desired peak and null region patterns without interfering with the frequencies being used by remote transceivers 1120 and 1124.

As yet another aspect, the intra-device local transceiver is further operable to select a frequency that corresponds to a frequency being used by an associated substrate transceiver to avoid a frequency conversion step if the frequency being used by the substrate transceiver is one that creates the desired peak and null regions and does not interfere with frequencies being used by other transceivers. For example, if frequencies f1 and f2 are available and won't interfere with frequencies f3-f5 being used by remote transceivers 1120 and 1124, then intra-device local transceiver is operable to select a frequency f1 or f2 if either f1 or f2 provides the desired peak and null region pattern and is equal to substrate frequency fs which is being used by a substrate transceiver associated with intra-device local transceiver 1104.

For example, if a frequency of transmission fs for transmissions between a substrate transceiver associated with intra-device local transceiver 1104 and substrate transceiver 1128 for transmissions through substrate 1132 is equal to frequency f1 and if frequency f1 produces a desired peak region pattern and does not interference with frequencies f3-f5 being used by remote transceivers 1120 and 1124, then transceiver 1104 is operable to select frequency f1 which is equal to frequency fs.

The first intra-device local transceiver is further operable to select the first frequency for communications within the radio transceiver module based upon detected frequencies being used outside of the radio transceiver module or even by other intra-device local transceivers to avoid interference.

Figure 31:
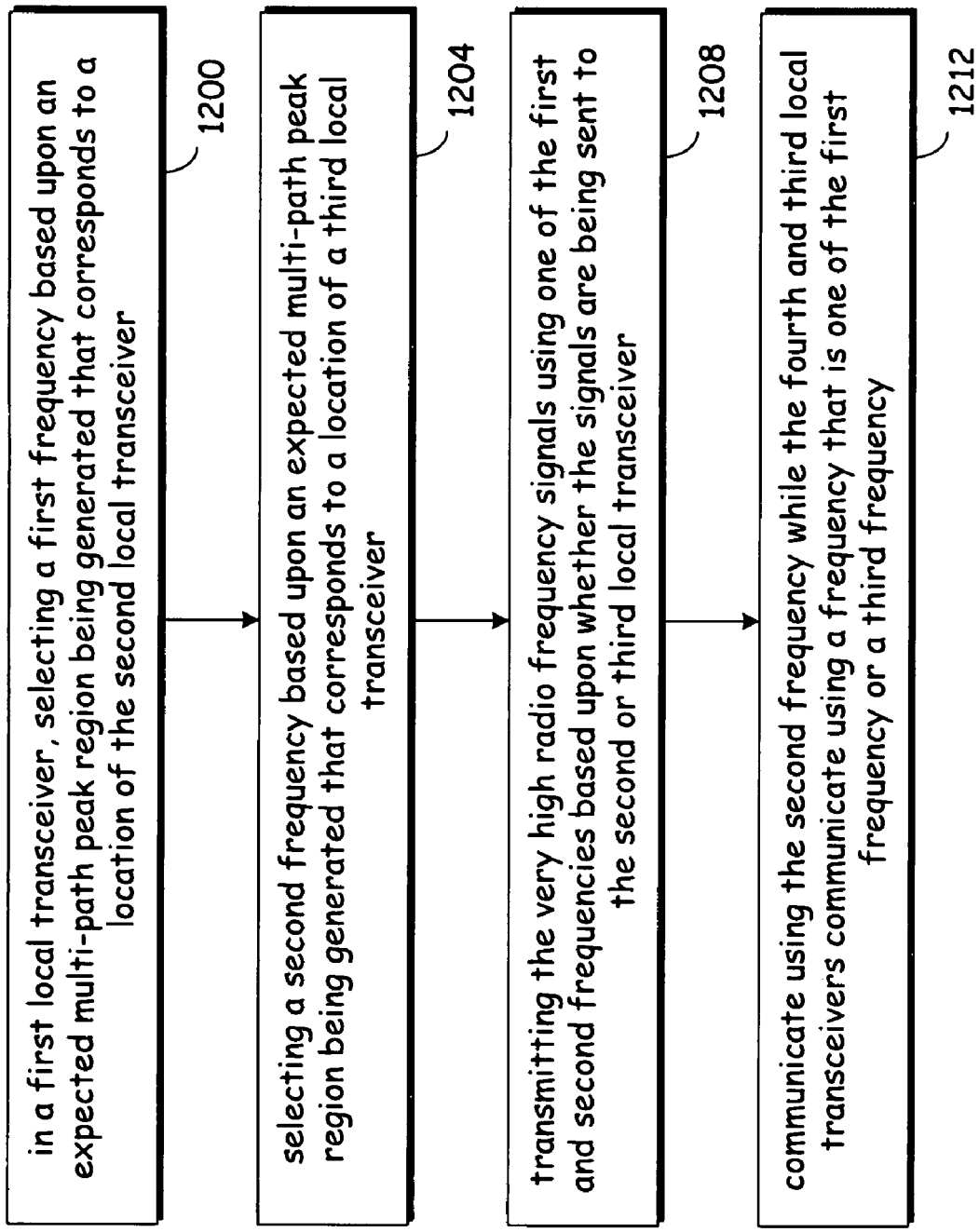
FIG. 31 is a flow chart illustrating a method for dynamic frequency division multiple access frequency assignments according to one embodiment of the invention.

FIG. 31 is a method for dynamic frequency division multiple access frequency assignments according to one embodiment of the invention. The method, which may be practiced by a first local transceiver for choosing a frequency for local wireless communications either within a substrate or within a device, generally includes selecting a frequency based upon a fixed location of a destination receiver to result in that receiver being in an additive or peak region for the transmissions at the selected frequency. An additional aspect includes selecting frequencies to avoid interference or collisions with ongoing communications of other local transceivers (substrate transceivers or intra-device local transceivers), and remote transceivers.

The method initially includes selecting a first frequency based upon an expected multi-path peak region being generated that corresponds to a location of a second local transceiver (namely, the receiver) (step 1200). The method further includes selecting a second frequency based upon an expected multi-path peak region being generated that corresponds to a location of a third local transceiver (step 1204). Thus, steps 1200 and 1204 illustrate a transmitter selecting a frequency based upon a target receiver's location (relative to the transmitter) and, if necessary, changing frequencies to reach a new receiver. Because peak and null patterns are frequency dependent, and because the transmitter will always be in a fixed position relative to a target receiver, the transmitter (first transceiver) may select a first or a second frequency based upon whether the target receiver is the second or third transceiver. Moreover, the transmitter is further operable to select yet another frequency that will operably reach the second and third transceiver while only one of the first and second frequencies can operably create a peak region for the second and third transceivers.

The method thus includes transmitting the very high radio frequency signals using one of the first and second frequencies based upon whether the signals are being sent to the second or third local transceiver (step 1208). The method may thus include selecting a first frequency that creates a multi-path peak for the second local transceiver location and a multi-path null for the third local transceiver location. Alternatively, the method may further include selecting a second frequency that creates a multi-path peak for the third local transceiver location and a multi-path null for the second local transceiver location.

The method may also include transmitting the very high radio frequency signals to a fourth local transceiver using the first frequency wherein the second and fourth local radio transceivers are both in expected peak regions for first local transceiver transmissions using the first frequency. Thus, the selection of frequencies is a function of topology and peak and null patterns for a given relative placement between a transmitter and one or more target receivers.

As another aspect of the embodiments of the invention, the method includes the first local transceiver and a fourth local transceiver communicating using the first frequency while the first local transceiver and a third local transceiver communicate using the second frequency and further while the fourth and third local transceivers communicate using a frequency that is one of the first frequency or a third frequency (step 1212).

Each reference to a local transceiver may be what is commonly referred to herein as a local intra-device transceiver or a substrate transceiver. Thus, the method may apply to at least two of the local transceivers (substrate transceivers) that are operable to communicate through a substrate or, alternatively, two intra-device local transceivers that are operable to transmit through space within the radio transceiver module or device.

Figures 32, 33:
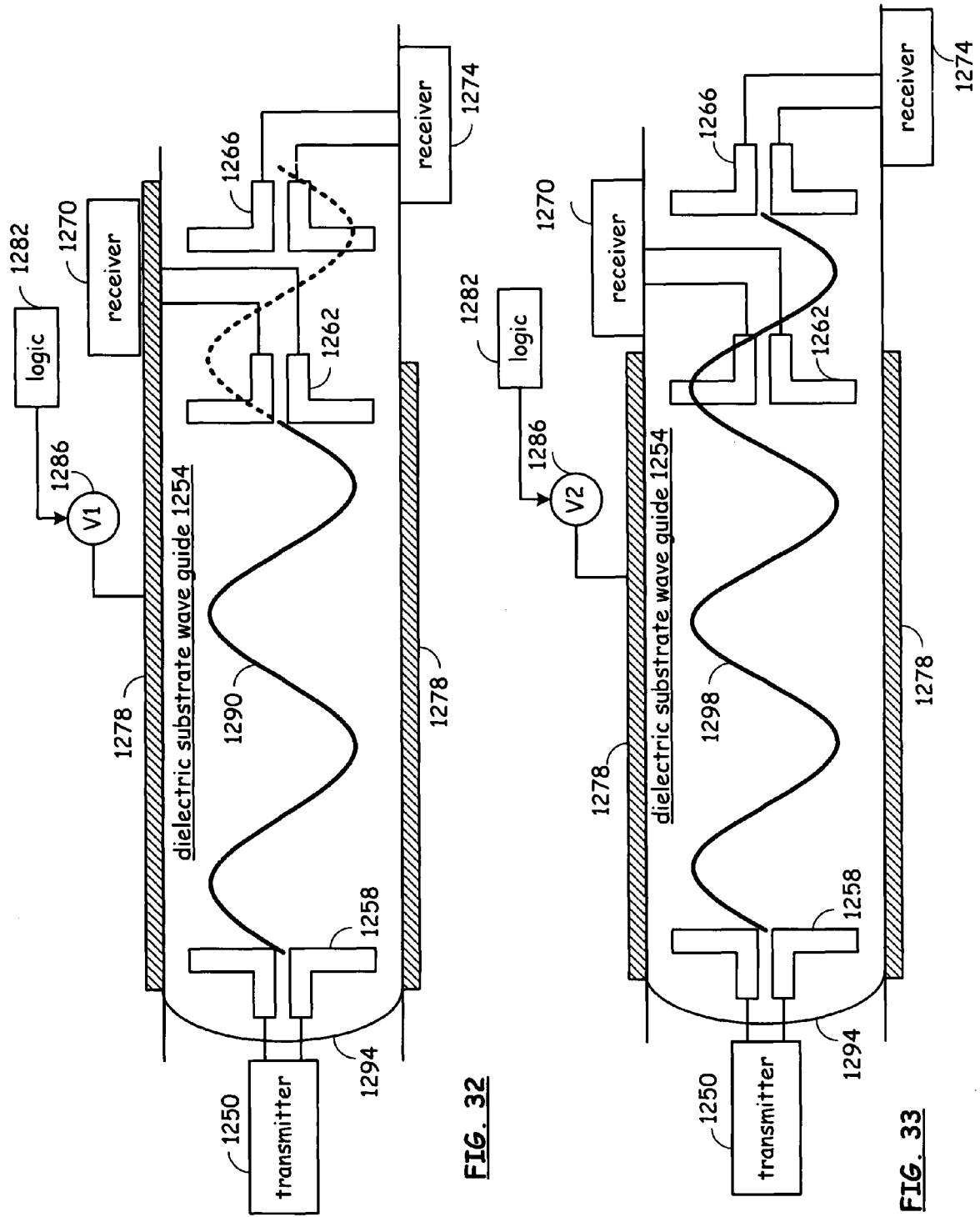
FIG. 32 is a functional block diagram of radio transceiver system operable to communication through a dielectric substrate wave guide according to one embodiment of the invention.
FIG. 33 illustrates alternate operation of the transceiver system of FIG. 32 according to one embodiment of the invention.

FIG. 32 is a functional block diagram of radio transceiver system operable to communication through a dielectric substrate wave guide according to one embodiment of the invention. A radio frequency substrate transceiver includes a substrate transmitter 1250 operable to transmit through a dielectric substrate wave guide 1254 from a substrate antenna 1258 to a receiver antenna. In FIG. 32, two receiver antennas 1262 and 1266 are shown. The dielectric substrate wave guide 1254 has a defined a bounded volume and is operable to conduct very high radio frequency (RF) electromagnetic signals within the defined bounded volume.

Substrate transmitter 1250 is communicatively coupled to substrate antenna 1258 and is operable to transmit and receive the very high RF electromagnetic signals having a frequency of at least 20 GHz. In one embodiment, each of the antennas 1258, 1262 and 1266 is a dipole antenna having a total antenna length that is equal to one half of the wave length of the transmitter signal. Thus, each dipole is a one quarter wave length. For a 60 GHz frequency signal having a wave length that is approximately 5 millimeters, each dipole therefore has a length of approximately 1.25 millimeters. Transmitter 1250 generates a signal having a center frequency that substantially matches the resonant frequency of the dielectric substrate wave guide.

A second substrate transceiver includes a receiver 1270 communicatively coupled to substrate antenna 1262 wherein the substrate antennas 1258 and 1262 are operably disposed to transmit and receive radio frequency communication signals, respectively, through the dielectric substrate wave guide 1254. Similarly, a receiver 1274 is coupled to antenna 1266 to receive transmitted RF therefrom.

One aspect of using a dielectric substrate wave guide 1254 is that two antennas are placed substantially near a multiple of a whole multiple of a wave length of a transmitted wave to improve communications signal strength at the receiving antenna. Moreover, the wavelength corresponds to a frequency that is approximately equal to a resonant frequency of the substrate wave guide. Because a standing wave occurs at each multiple of a wave length of a transmitted signal, and because a signal is easiest to detect at the standing wave within a wave guide, an antenna is therefore desirably placed at the standing wave for the given frequency of a transmission.

In the described embodiments, the dielectric substrate wave guide 1254 has a closed end 1294 that reflects transmitted signals from antenna 1258 to create a structure that generates a resonant frequency response within the dielectric wave guide wherein the resonant frequency is at least 20 GHz. In one specific embodiment, the resonant frequency of the wave guide is approximately 60 GHz. In some preferred embodiments, the wave guide has a resonant frequency in the range of 55 to 65 GHz. though alternate embodiments specifically include lower frequencies. For example, one embodiment includes a wave guide that has a resonant frequency that is in the range of 25 GHz to 30 GHz.

As one aspect of the embodiments of the invention, a frequency of transmission and a resonant frequency of the wave guide are operably adjusted to create a standing wave at the location of a substrate antenna within the dielectric substrate wave guide. The electromagnetic waves are subject to diffuse scattering as they reflect off of the interior surface of the wave guide. Typically, however, the diffusely scattered waves pass through a common point within a wave guide to create a standing wave at the common point. This standing wave is typically located at a multiple of a wave length of a resonant frequency of the wave guide.

The resonant frequency of dielectric substrate 1254 is generally based upon the dimensions of the dielectric substrate wave guide 1254 and the reflective properties of an end of a wave guide, upon the placement of a transmitting antenna in relation to a reflective end of the wave guide and upon the dielectric constant of the dielectric substrate material. Generally, a mere wave guide is not necessarily a resonator having a high Q factor to pass very narrow frequency bands. Transmission of an electromagnetic wave from a properly located antenna 1248 results in the wave reflecting off of the interior surface of the dielectric wave guide with comparatively little loss assuming that a surface boundary exists in which the dielectric substrate has a sufficiently different composition than a surrounding material. The requirements for a highly contrasting boundary especially apply to a closed end to create a resonating volume for electromagnetic waves to create a filter function with a high Q factor. Two cross-sectional shapes for the dielectric substrate wave guides are the represented by a rectangle and a circle. A dielectric substrate wave guide according to the embodiment of the invention is operable to create resonance for a narrow band of frequencies in the 60 GHz around a specified frequency range and thus operates as a resonator and further provides a filtration function with a relatively high quality factor (Q) value.

Dielectric substrate wave guide 1254 is formed of a dielectric material having a high dielectric constant in one embodiment to reduce the energy dissipated per cycle in relation to the energy stored per cycle. While a resonance frequency of the dielectric substrate wave guide is based in part by the dimensions and shape of the wave guide including the closed end, the propagation properties of the dielectric material also affects the resonant frequency of the wave guide. Further, a resonant frequency of a dielectric substrate wave guide is also affected by the electromagnetic environment of the wave guide. Electromagnetic energy transmitted through the dielectric substrate of the wave guide may be used to adjust a resonant frequency of the wave guide.

Moreover, for a fixed frequency signal being transmitted through the wave guide, changing the propagation properties of the dielectric substrate operably changes the wavelength of the signal as it propagates through the wave guide. Thus, one aspect of the embodiments of the invention includes adjusting an electromagnetic field radiating through the dielectric substrate to change the propagation properties of a signal being propagated through to adjust the wavelength and corresponding frequency of the conducted signal. For small adjustments, such a change is tantamount to a change in phase of a signal.

Another aspect of the dielectric substrate wave guide 1254 is that the narrow band of frequency about the resonant frequency effectively creates a narrow band pass filter having high selectivity for those embodiments in which an appropriate closed end is formed and a transmitting antenna is placed near to the closed end as shown in FIGS. 32 and 33 by the dashed lines at the left end of dielectric substrate wave guide 1254. As such, the embodiment of the invention includes controllable electromagnetic field generation circuitry 1278 operable to generate a field through at least a portion of the wave guide 1254 to adjust the resonant frequency of the dielectric substrate wave guide for a wave guide formed to operate as a resonator.

Logic 1282 is therefore operable to set an output voltage level of variable voltage source 1286 to set the electromagnetic field strength to generate a field to adjust at least one of a resonant frequency of the dielectric substrate wave guide 1254 or a phase of the signal being propagated to create a standing wave for transmissions substantially equal to the resonant frequency between antennas 1258 and 1262 as shown in FIG. 32. Changing the frequency results in changing the wavelength of the signal being propagated there through to operably change the locations as which standing waves occur.

In the described embodiment, dielectric substrate wave guide 1254 comprises a substantially uniformly doped dielectric region. The logic 1274 is therefore operable to set the electromagnetic field strength level to adjust the dielectric substrate wave guide 1254 resonant frequency to support transmission to create a standing wave for transmissions between substrate antennas 1258 and 1262 to compensate for process and temperature variations in operational characteristics of the dielectric substrate wave guide.

FIG. 33 illustrates alternate operation of the transceiver system of FIG. 32 according to one embodiment of the invention. As may be seen, logic 1282 is further operable to adjust the electromagnetic field strength to change the resonant frequency of the dielectric substrate wave guide 1254 create a standing wave for transmissions between the substrate antenna 1258 substrate antenna 1266. Generally, logic 1282 is operable to send control commands to prompt a variable voltage source (or alternatively current source) 1286 to generate a corresponding output signal that results in a desired amount of electromagnetic radiation being emitted through dielectric substrate wave guide 1254 to correspond to a specific receiver antenna for a given transmitter antenna.

In operation, logic 1282 prompts an electromagnetic signal to be generated, if necessary, to adjust a resonant frequency of dielectric substrate wave guide 1254 to create a standing wave at one of substrate antennas 1262 or 1266 for signals being transmitted either to receiver 1270 or to receiver 1274. As may be seen therefore, transmitter 1250 generates a signal 1290 for transmission from substrate antenna 1258. Based upon the wavelength of signal 1290 and the resonant frequency of dielectric substrate wave guide 1254, a standing wave is created at substrate antenna 1262 to enable receiver 1270 to receive signal 1290.

The wavelength of signal 1290 is largely determined by associated transmitter circuitry. As described above, however, changing the dielectric properties of the wave guide also can change the wavelength of signal 1290. Accordingly, in some applications of the embodiments of the invention, merely changing the dielectric properties may be adequate to move a standing wave from a first receiver antenna to a second receiver antenna. In an alternate application, the associated transmitter circuitry also modifies the transmit frequency to create the standing wave at the second antenna from the first antenna.

For example, as may be further seen in FIG. 32, antenna 1266 is not located at a multiple wavelength of the signal 1290 thereby rendering reception either difficult or impossible in some cases based upon a plurality of factors including signal strength. When logic 1282 adjusts the resonant frequency of wave guide 1254, however, a standing wave is created for an adjusted resonant frequency of the dielectric substrate wave guide 1254. As such, transmitter 1250 adjusts the frequency of signal 1290 as necessary to create signal 1298 that substantially matches the adjusted resonant frequency to create a standing wave at substrate antenna 1266.

FIGS. 32 and 33 illustrate a plurality of aspects of the various embodiments of the invention. First, use of a closed end 1294 proximate to a transmitting antenna operably produces a signal that resonates within the dielectric substrate wave guide thereby creating a very narrow band response in which frequencies removed from the resonant frequency are attenuated. Second, regardless of whether resonance is achieved by the physical construction of the wave guide, an electromagnetic field radiated through the dielectric substrate operably changes the wave length of the propagated signal thereby affecting the strength of a received signal based upon whether a standing wave is created at the target receiver antenna. Even without resonance, waves continue to reflect on the outer boundaries of the wave guide thus creating standing waves that have a wave length that is a function of the dielectric properties of the wave guide. While not all Figures that illustrate a dielectric substrate wave guide show a closed end approximate to a transmitting antenna, it is to be understood that such an embodiment is contemplated and may be included for creating desired resonance. In some Figures, the closed end 1294 is shown in a dashed line to illustrate that the closed end is optional according to design requirements. One of average skill in the art may readily determine such design parameters through common diagnostic simulation and analysis tools.

Figure 34:
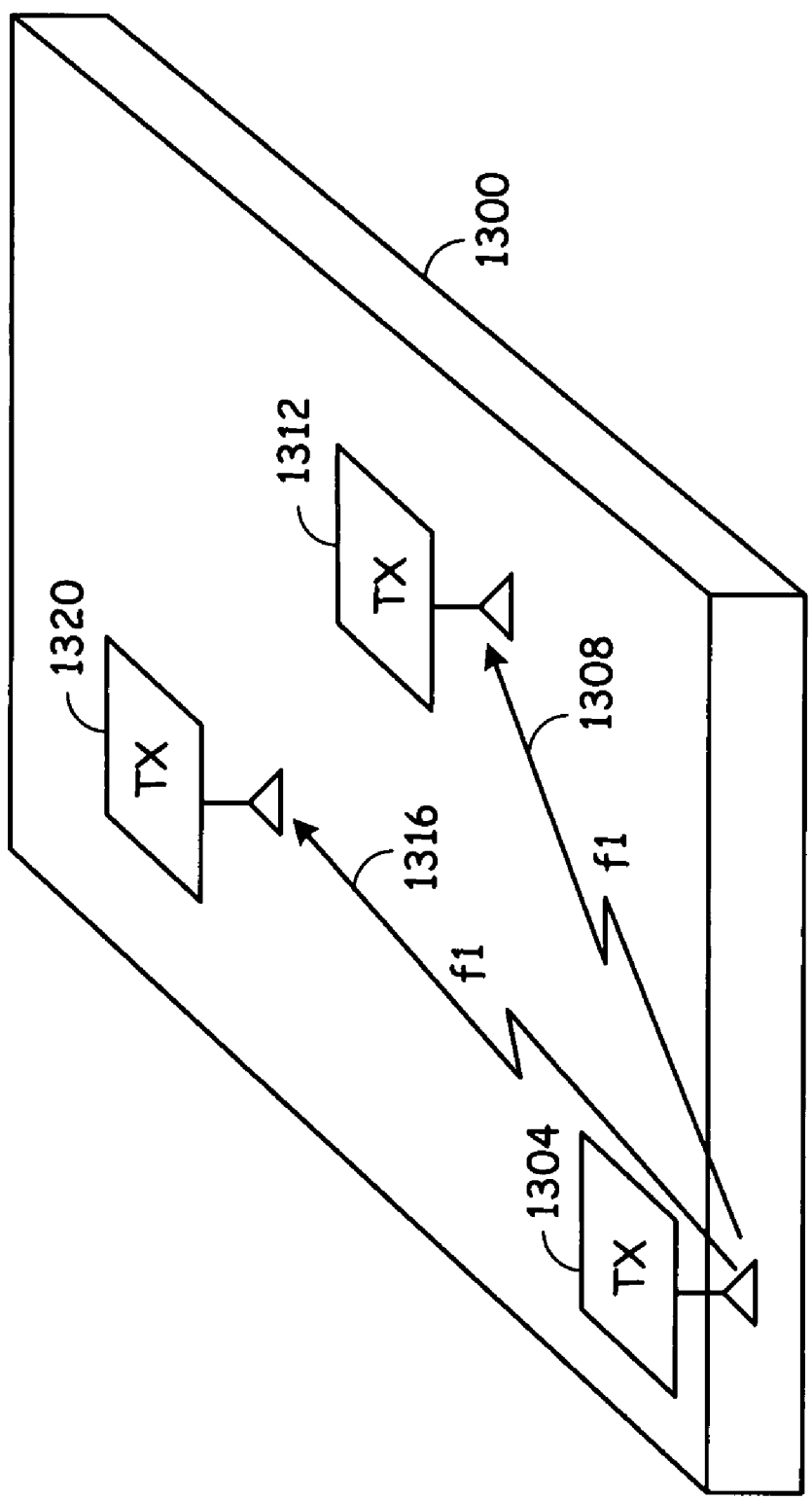
FIG. 34 is a perspective view of a substrate transceiver system that includes a plurality of substrate transceivers communicating through a dielectric substrate wave guide according to one embodiment of the present invention.

FIG. 34 is a perspective view of a substrate transceiver system that includes a plurality of substrate transceivers communicating through a dielectric substrate wave guide according to one embodiment of the present invention. A dielectric substrate wave guide 1300 includes a plurality of substrate transceivers operably disposed to communicate through dielectric substrate wave guide 1300. Specifically, a transmitter 1304 of a first transceiver is shown generating a communication signal 1308 to substrate receiver 1312 of a second substrate transceiver and a communication signal 1316 to receiver 1320 of a third substrate transceiver. Both communication signals 1308 and 1316 are generated at substantially equal frequencies that are adjusted to create standing waves at the receiver antennas based upon conductive dielectric properties of dielectric substrate wave guide 1300. In the described embodiment, an electromagnetic field is produced through dielectric substrate wave guide 1300 and is adjusted according to whether a standing wave is desired at receiver 1312 or at receiver 1320. Circuitry for generating the electromagnetic signal is known and is assumed to be present though not shown. One purpose of the perspective view of FIG. 34 is to shown an arrangement in which the receiver antennas are at different distances without providing multi-path interference with each other. The side view of FIGS. 32 and 33, for example, seem to show that one receiver is directly behind the other though there may actually be some angular separation as shown here in FIG. 34.

Figure 35:
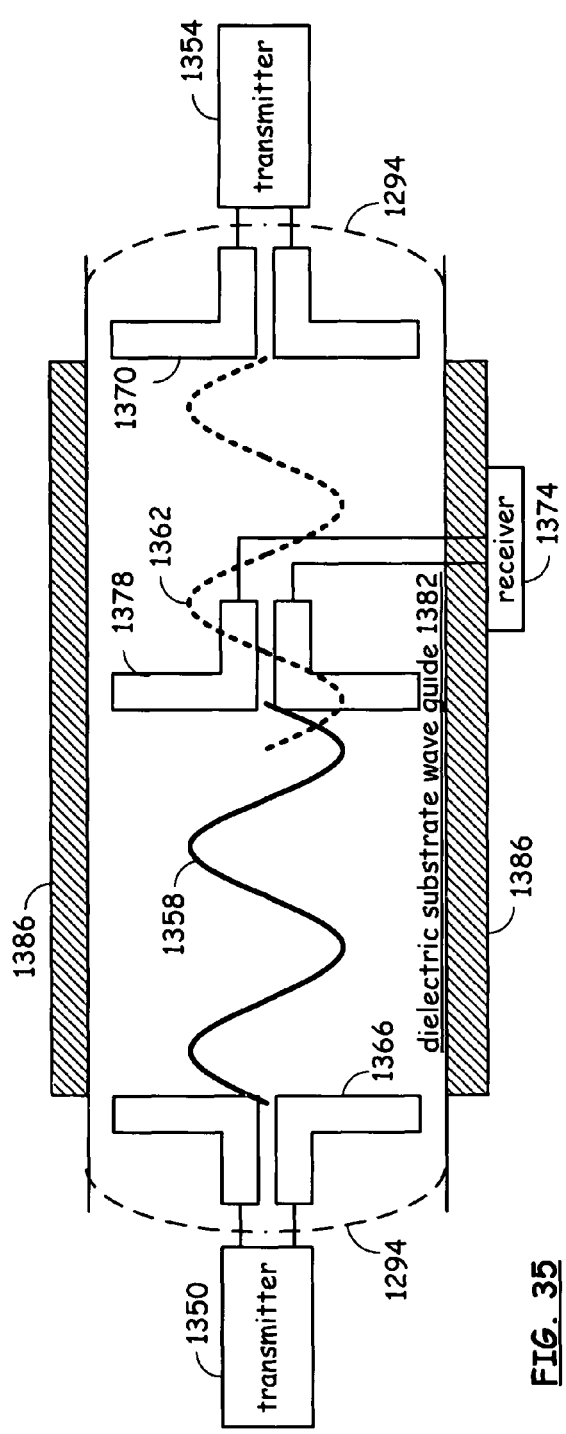
FIG. 35 is a functional block diagram of radio transceiver system operable to communicate through a dielectric substrate wave guide according to one embodiment of the invention showing operation of a plurality of transmitters in relation to a single receiver.

FIG. 35 is a functional block diagram of radio transceiver system operable to communicate through a dielectric substrate wave guide according to one embodiment of the invention showing operation of a plurality of transmitters in relation to a single receiver. Substrate transmitters 1350 and 1354 are operable to generate communication signals 1358 and 1362 from substrate antennas 1366 and 1370, respectively, to a substrate receiver 1374. Substrate receiver 1374 is operably coupled to substrate antenna 1378 to receive communication signals 1358 and 1362. Each substrate transmitter 1350 and 1354 is operable to transmit through a dielectric substrate wave guide 1382. Dielectric substrate wave guide 1382 is operable to conduct very high radio frequency (RF) electromagnetic signals within a defined a bounded volume for conducting and substantially containing the very high RF electromagnetic signals. In the described embodiments, the dielectric substrate wave guide 1382 has closed ends approximate to the transmitting antennas 1366 and 1370 and an associated resonant frequency that is at least 20 GHz. In one specific embodiment, the resonant frequency of the wave guide is approximately 60 GHz. In most preferred embodiments, the wave guide has a resonant frequency in the range of 55 to 65 GHz.

Substrate transmitters 1350 and 1354 are operable to transmit and receive the very high RF electromagnetic signals having a frequency of at least 20 GHz. In one embodiment, each of the antennas is a dipole antenna having a total antenna length that is equal to one half of the wave length of the transmitter signal. Thus, each dipole is one quarter wave length long. For a 60 GHz frequency signal having a wave length that is approximately 5 millimeters, each dipole therefore has a length of approximately 1.25 millimeters. Transmitters 1350 and 1354 generate signals having a center frequency that substantially match the resonant frequency of the dielectric substrate wave guide. In operation, it may be seen that dielectric substrate wave guide 1382 has a resonant frequency that supports a signal having a standing wave at substrate antenna 1378 for communication signal 1358 transmitted from antenna 1366 by transmitter 1350. As may further be seen, the resonant frequency of dielectric substrate wave guide 1382 results in communication signal 1362 not generating a standing wave at antenna 1378.

Figure 36:
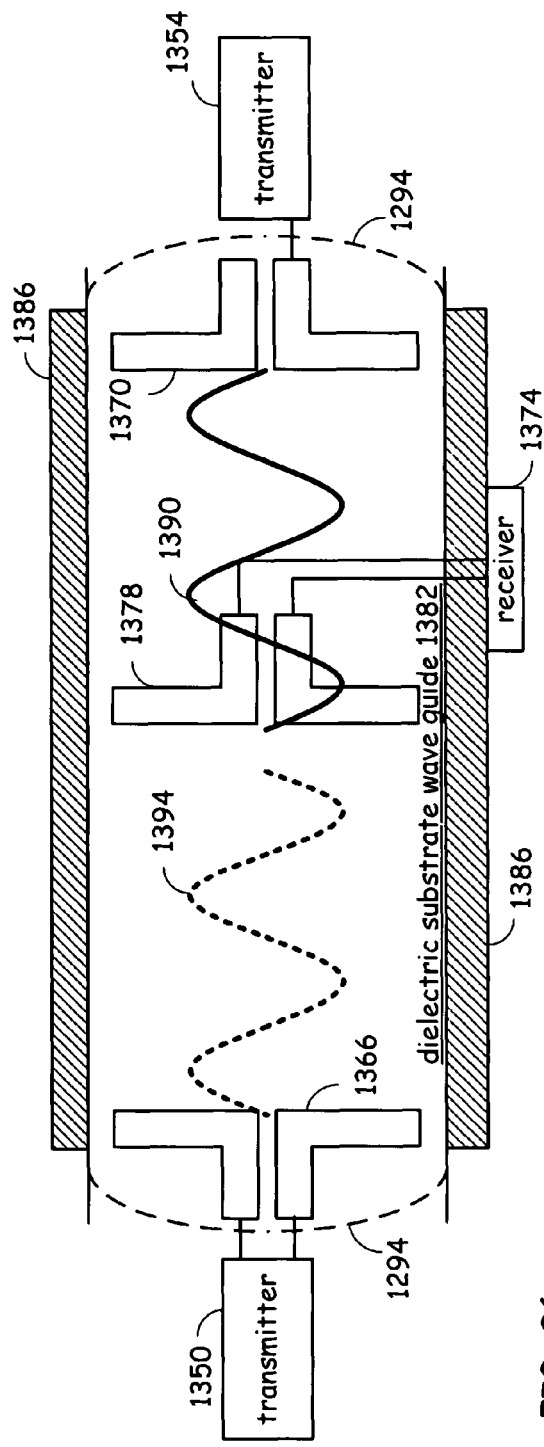
FIG. 36 is a functional block diagram of radio transceiver system operable to communicate through a dielectric substrate wave guide according to one embodiment of the invention.

FIG. 36 is a functional block diagram of radio transceiver system operable to communicate through a dielectric substrate wave guide according to one embodiment of the invention showing operation of a plurality of transmitters in relation to a single receiver to enable the receiver to receive communication signals from a different transmitter. As may be seen, the structure in FIG. 36 is the same as FIG. 35. Referring to FIG. 36, it may be seen that communication signal 1390 now creates a standing wave at substrate antenna 1378 while communication signal 1394 does not create a standing wave at substrate antenna 1378. Thus, FIG. 36 illustrates how the substrate resonant frequency may be changed as a part of discriminating between transmitters. Thus, the embodiment of the invention includes logic to adjust an electromagnetic field produced through dielectric substrate wave guide 1382 to change the resonant frequency to support transmissions from a specified transmitter to a specified receiver. As an electromagnetic field strength through the dielectric material of dielectric substrate wave guide 1382 changes in intensity, the resonant frequency of the dielectric material changes thereby supporting the transmission of waves that can create a desired standing wave at a substrate antenna. Thus, FIG. 36 illustrates that the resonant frequency of dielectric substrate wave guide 1382 is changed in relation to FIG. 35 thereby allowing a change in frequency.

Changing the resonant frequency is required when the bandwidth of signals that may be passed with little attenuation is less than a required frequency change to create a standing wave at a different antenna location. Thus, in one embodiment, only the frequency of the transmission requires changing to create a standing wave. In another embodiment, both the resonant frequency of dielectric substrate wave guide 1382 and the transmission frequency must be changed for a desired standing wave to be generated within dielectric substrate wave guide 1382.

It should be understood that the use of the closed ends by the transmitting antennas is to create resonance and an associated narrow band filtration function centered about the resonant frequency. Regardless of whether the closed ends are utilized (i.e., they are optional and thus shown as dashed lines), the embodiments of FIGS. 35 and 36 illustrate use of the electromagnetic fields to select between transmitting sources or antennas for a specified receiver antenna to create a standing wave at the receiver antenna for the selected source based upon, for example, approximate boundary surfaces to the receiver antenna.

Figure 37:
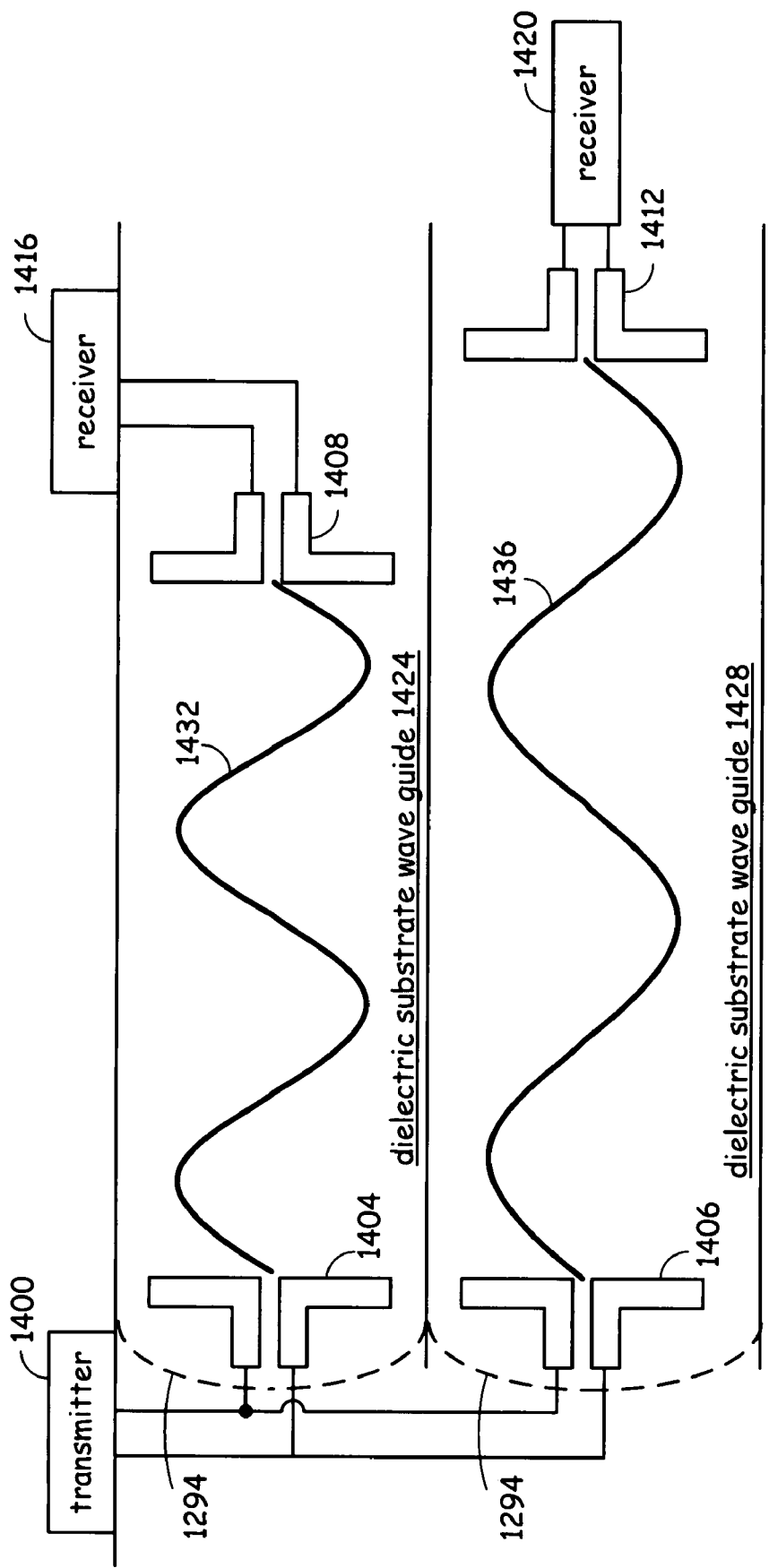
FIG. 37 illustrates an alternate embodiment of a transceiver system for utilizing dielectric substrate wave guide dielectric characteristics to reach a specified receiver antenna.

FIG. 37 illustrates an alternate embodiment of a transceiver system for utilizing dielectric substrate wave guide dielectric characteristics to reach a specified receiver antenna. More specifically, a plurality of dielectric substrate wave guides are provided having different dielectric constants and, therefore, different propagation characteristics. As such, a transmitter, such as transmitter 1400, is operable to generate transmission signals from antennas 1404 and 1406 to antennas 1408 and 1412 for reception by receivers 1416 and 1420, respectively, which creates standing waves at antennas 1408 and 1412. In one embodiment, the transmission signals have substantially similar frequencies wherein only the propagation properties of the dielectric substrate wave guides change to create the desired standing wave at the corresponding receiver antennas.

In a different embodiment, the transmission signal frequency is set according to the propagation properties of the dielectric substrate wave guide through which a signal will be transmitted. In reference to FIG. 37, therefore, transmitter 1400 is operable to select a first transmission frequency to match a propagation properties of dielectric substrate wave guide 1424 and a second transmission frequency to match a propagation properties of dielectric substrate wave guide 1428. As such, a signal 1432 having a first wavelength generates a standing wave at antenna 1408 and a signal 1436 having a second wavelength generates a standing wave at antenna 1412. As may be seen, the separation difference between antennas 1406 and 1412 is greater than between antennas 1404 and 1408. In contrast to FIGS. 32, 33, 35 and 36, the dashed closed ends for creating resonance are not shown though they may readily be included.

Figure 38:
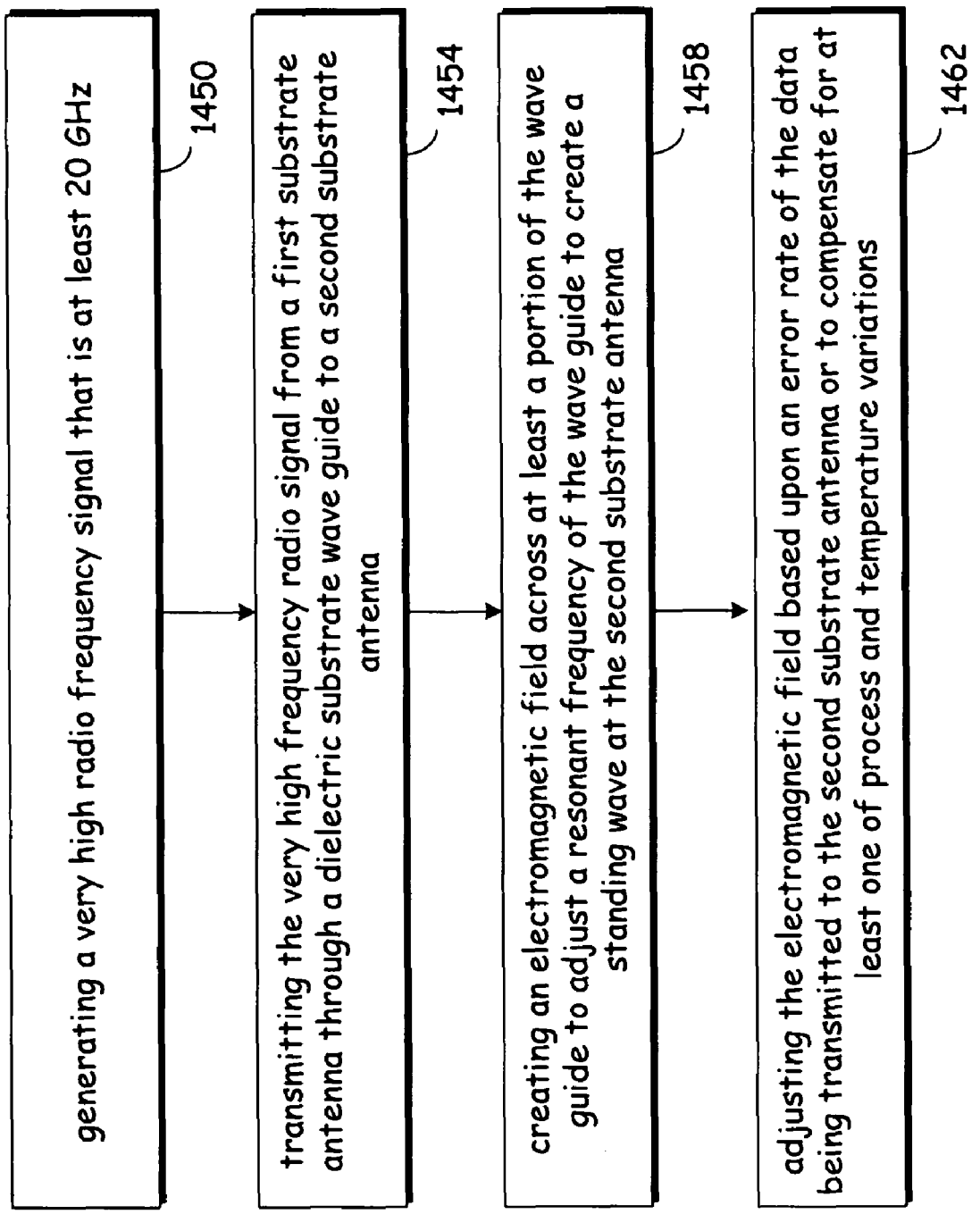
FIG. 38 is a flow chart that illustrates a method for transmitting a very high radio frequency through a dielectric substrate according to one embodiment of the invention.

FIG. 38 is a flow chart that illustrates a method for transmitting a very high radio frequency through a dielectric substrate according to one embodiment of the invention. Generally, the dielectric substrate may be formed of any dielectric material within a die, an integrated circuit, a printed circuit board or a board operable to support integrated circuits. The method includes a transmitter of a substrate transceiver generating a very high radio frequency signal that is at least 20 GHz (step 1450). In the described embodiments, the transmissions will typically have a center frequency that is within the range of 55-65 GHz. In one particular embodiment, the center frequency is 60 GHz. Thus, the transmitter of the substrate transceiver includes circuitry for and is operable to generate such very high frequencies. One of average skill in the art may readily determine a transmitter configuration to generate such a signal for transmission.

Thereafter, the method includes transmitting the very high frequency radio signal from a first substrate antenna through a dielectric substrate wave guide to a second substrate antenna (step 1454). The dielectric substrate wave guide, in one embodiment, is shaped to define a cross sectional area that may be represented by a circle (or other shape without straight surfaces), a square, a rectangle or polygon or a combination thereof.

The method further includes creating an electromagnetic field across at least a portion of the wave guide to adjust a propagation property of the wave guide to create a standing wave at the second substrate antenna (step 1458). This step may be formed before step 1454, after step 1454 or both before and after step 1454. The electromagnetic field may be created in any one of a plurality of known approaches including by transmitting pulsed or continuously changing waveform signal through an inductive element. The inductive element may comprise a coil or, for signals having very high frequencies, a trace, strip line or micro-strip.

The method further includes adjusting the electromagnetic field based upon an error rate of the data being transmitted to the second substrate antenna or to compensate for at least one of process and temperature variations (step 1462). For example, a targeted receiver (one for which transmissions are intended) is operable to determine a signal quality based, for example, upon a bit or frame error rate or a signal to noise ratio for a received signal. Then, logic coupled to the targeted receiver is operable to adjust the electromagnetic field strength to improve the signal quality. In one embodiment, the logic adjusts the field strength in a defined and iterative manner to determine an acceptable electromagnetic field strength to shift a standing wave to better align with the antenna of the targeted receiver.

Figure 39:
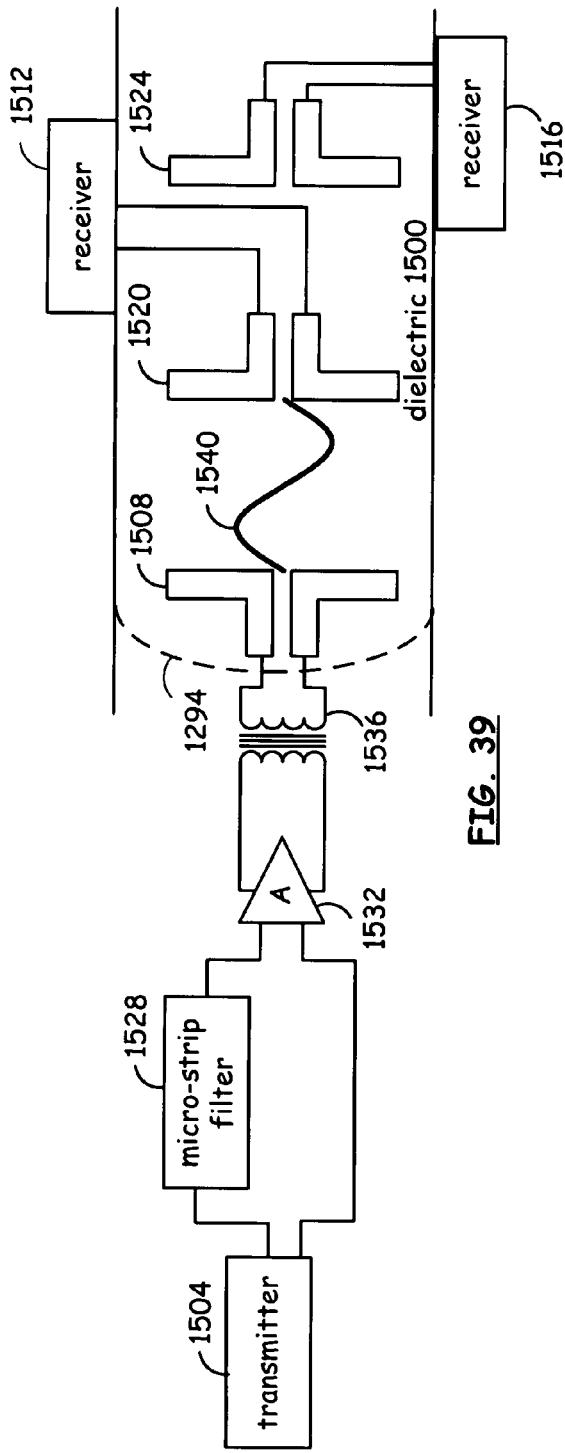
FIG. 39 is a functional block diagram of a radio transceiver module according to one embodiment of the invention.

FIG. 39 is a functional block diagram of a radio transceiver module according to one embodiment of the invention. The radio transceiver module of FIG. 39 includes dielectric substrate wave guide 1500 for conducting very high radio frequency (RF) electromagnetic signals. The dielectric substrate wave guide 1500 is characterized by conductive properties of the dielectric substrate. More specifically, the physical dimensions and dielectric constant of the wave guide 1500 and the properties of the wave guide boundary with a surrounding material affect the internal reflections and conduction of the dielectric substrate forming the wave guide to affect the conductive and, potentially, resonant properties of the wave guide.

The wave guide, when formed to have a closed end, supports the electromagnetic waves propagating down the wave guide to result in the coupling of natural frequencies (based upon wave guide construction) that resonate with waves of those same frequencies propagating down the main tube. The dielectric substrate wave guide 1500 of the described embodiment may be formed to operate as a resonator that exhibits resonance for a narrow range of frequencies in the range of 10-100 GHz according to design properties and generally provides a filtration function for non-resonant frequencies though such an aspect (resonance) is not required and is but one embodiment of the invention that may be combined with other described embodiments of the invention according to design choice.

The transceiver module further includes a first substrate transmitter 1504 communicatively coupled to a first substrate antenna 1508. Further, first and second substrate receivers 1512 and 1516 are communicatively coupled to second and third substrate antennas 1520 and 1524. The first and second substrate antennas 1508 and 1520 are operably disposed to transmit and receive radio frequency communication signals, respectively, through the dielectric substrate wave guide 1500. While this embodiment is described in terms of transmitters and receivers, it should be understood that the transmitters and receivers are typically a part of associated transceivers having both transmitters and receivers. For simplicity, the description refers to transmitters and receivers to describe transmit and receive operations for the purpose of explaining operation of the embodiment of the invention.

The transceiver module of FIG. 39 further includes a micro-strip resonator filter 1528 that provides selectable filter responses. As will be described in greater detail in relation to figures that follow, the micro-strip filter includes a plurality of tap points that each provides a different filter response. Typically, the filter response is a band pass filter response in the described embodiments of the invention. In at least one embodiment, the filter response is a very narrow and very high frequency filter response. Each selectable each tap point thus provides a corresponding filter response characterized by a resonant frequency for passing signals of a specified frequency band for transmission through the wave guide. While the described embodiments include micro-strip filters, it should be understood that the embodiments can include or have a strip line in place of the micro-strip to provide the desired filter response.

The output of micro-strip filter 1528 is produced to an amplifier 1532 where it is amplified. The amplifier 1532 output is then provided to a transformer 1536 that couples an outgoing signal to the first substrate antenna 1508 for transmission through dielectric substrate wave guide 1500. Thus, as may be seen, a communication signal 1540 is radiated from substrate antenna 1508 through dielectric substrate wave guide 1500 to substrate antenna 1520. The frequency of communications signal 1540 is one that is not filtered or blocked by micro-strip filter 1528 and is one that not only passes through dielectric substrate wave guide 1500, but also creates a standing wave at antenna 1520 for reception by substrate receiver 1512 for a give dielectric property of the substrate wave guide.

In the described embodiment of the invention, the resonant frequency of the micro-strip filter 1528 is approximately equal to a frequency of the dielectric substrate wave guide 1500 that creates a standing wave at the target receiver antenna and is in the range of 55-65 GHz. For embodiments in which the wave guide 1500 is formed with a closed end or other geometric configuration to operate as a resonator, the resonant frequency of the micro-strip filter is approximately equal to the resonant frequency of the dielectric wave guide 1500. The dielectric substrate wave guide in the described embodiment comprises a substantially uniformly doped dielectric region.

As described before, micro-strip filter 1528 is operable to produce filter responses to pass signals having different center frequencies having a narrow bandwidth to produce a narrow band pass response at very high frequencies in one embodiment of the invention. Transmitter 1504, therefore, is operable to produce a communication signal having a frequency that matches the resonant frequency of the micro-strip filter 1528 according to the selected filter response.

Generally, a first filter response passes a signal having a first frequency and corresponding wave length that creates a standing wave at antenna 1520. A second filter response passes a signal having a second frequency and corresponding wave length that creates a standing wave at antenna 1524. As will be described below, the filter responses are selected by producing a signal to a selected tap point of the micro-strip filter in a described embodiment of the invention. As may further be seen in FIG. 39, the first, second and third substrate antennas are operably sized to communicatively couple with the substrate region and are operably disposed within dielectric substrate 1500 to receive the corresponding standing waves. Further, the first substrate antenna is a ¼ wavelength dipole antenna in one embodiment of the invention.

Figure 40:
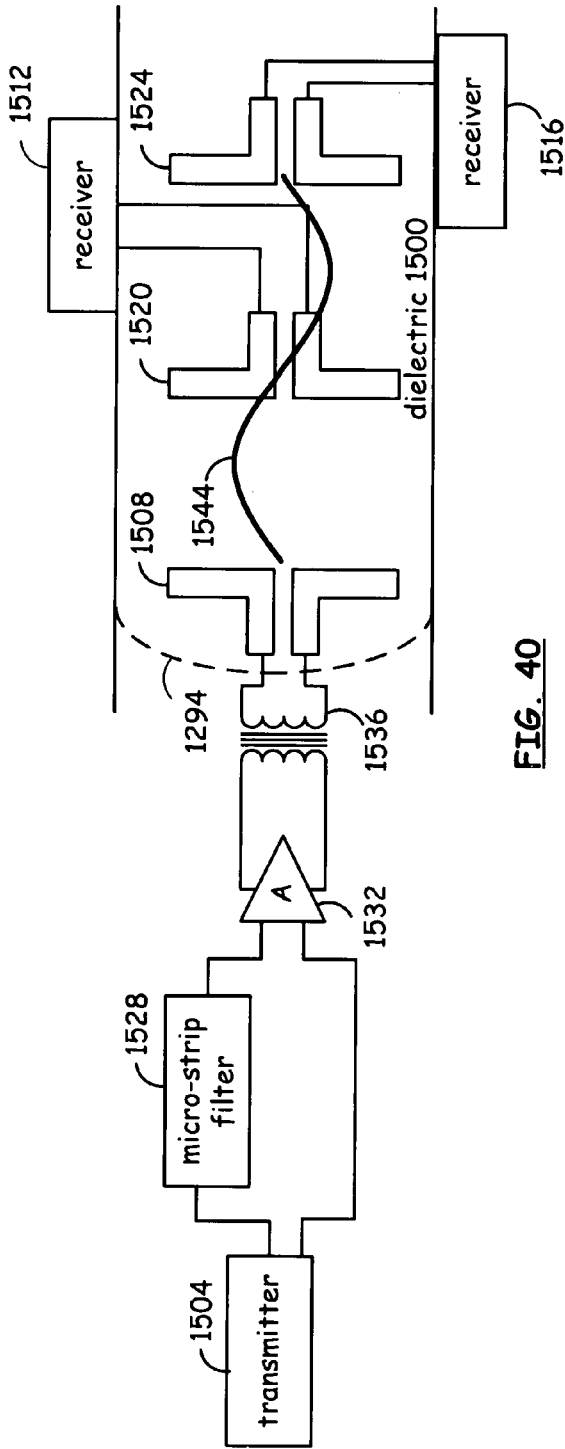
FIG. 40 is a functional block diagram of a radio transceiver module according to one embodiment of the invention.

FIG. 40 is a functional block diagram of a radio transceiver module according to one embodiment of the invention. More specifically, the radio transceiver module of FIG. 40 is the same as shown in FIG. 39. It may be seen, however, that a communication signal 1544 is being transmitted from substrate antenna 1508 instead of communication signal 1540. Further, as may be seen, communication signal 1544 is transmitted at a frequency that creates a standing wave at substrate antenna 1524 instead of 1520. While only one wave form is shown in FIGS. 39 and 40, it should be understood that the shown waveforms represent any number of signal periods and are intended to reflect a standing wave exists between the shown pair of substrate antennas. Moreover, while the various figures illustrate a transmitter and a receiver, it should be understood that these are exemplary illustrations and that the communications may be in a reverse direction. Finally, in a typical embodiment, each transmitter and receiver shown is part of a transceiver and, therefore, communications in opposite directions to that shown are fully included as embodiment of the invention.

Figure 41:
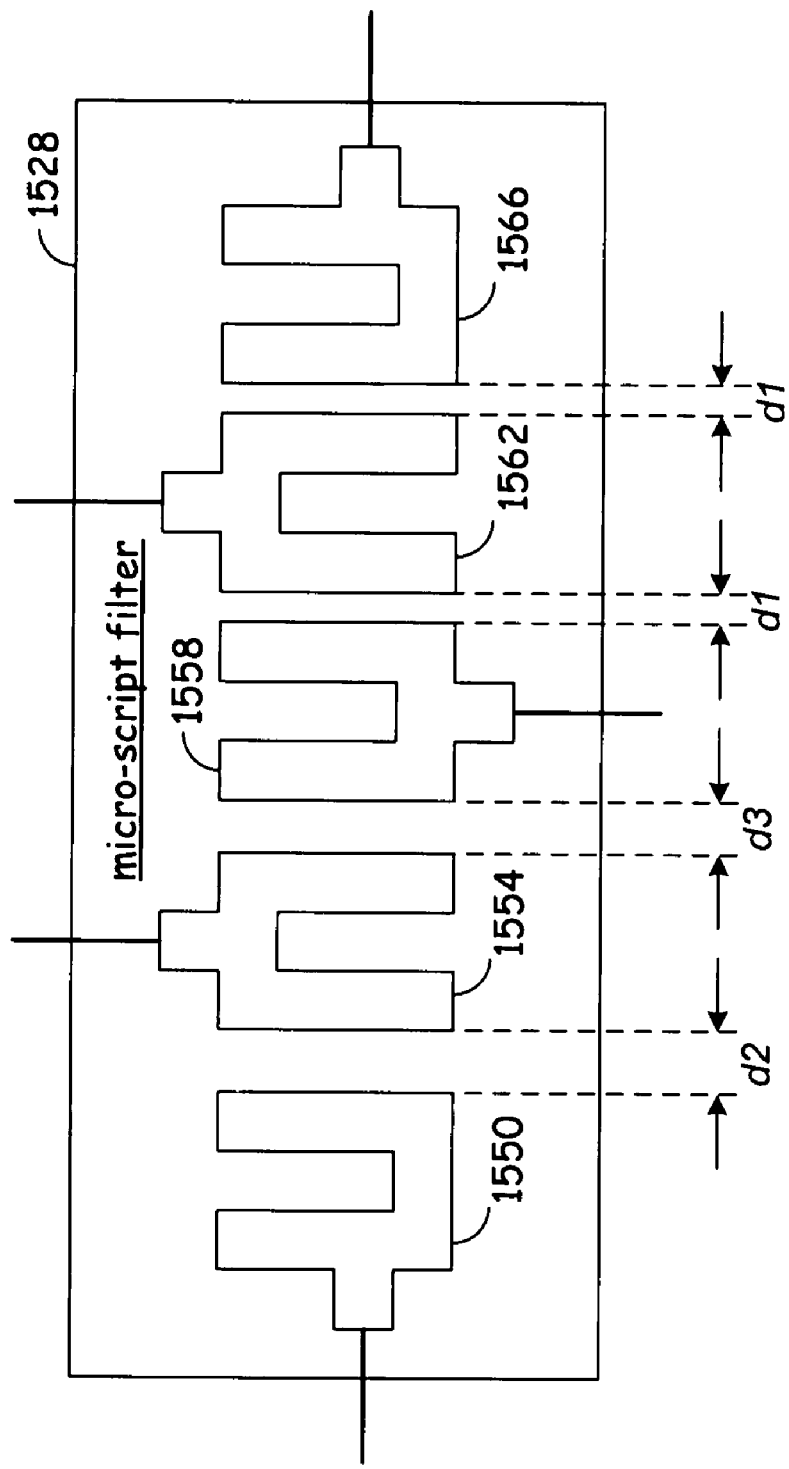
FIG. 41 is a functional block diagram of a micro-strip filter according to one embodiment of the present invention.

FIG. 41 is a functional block diagram of a micro-strip filter according to one embodiment of the present invention. A micro-strip filter 1528 comprises a plurality of resonators 1550-1566 arranged to be electrically and magnetically coupled in one embodiment of the invention according to desired filter responses. Generally, the resonators of micro-strip filter 1528 comprise strips that are arranged and sized to provide electro-magnetic coupling that further creates a desired inductive and capacitive response. For example, if the separation "d1", "d2" or "d3" between two resonators is less than a specified distance, the coupling is primarily electrical for very high frequency signals (e.g., at least 10 GHz) and primarily magnetic for when "d1", "d2" or "d3" exceeds the specified distance. The specified distance, of course, is based on several parameters including frequency, signal strength, and strip dimensions. Factors such as strip width, layout and relative placement, therefore affect the inductive and capacitive response.

For example, as may be seen examining the illustrated separation of the resonators 1550-1566, a separation distance "d2" between resonators 1550 and 1554 is greater than the separation "d3" between 1554 and 1558 which is greater than the separation distances "d1" between the remaining resonators 1558-1566. Thus, the signal relationship between resonators 1550-1558 is more magnetic and less electrical than the signal relationship between resonators 1558-1566.

The use of resonators 1550-1566 in micro-strip filters results in significantly smaller sized filters that maintain desired performance. Generally, the higher the dielectric constant of the dielectric material out of which the resonator is formed, the smaller the space within which the electric fields are concentrated thus affecting the magnetic and electric coupling properties between the resonators of the micro-strip filter.

One of skill in the art of designing circuitry utilizing micro-strips may readily determine a micro-strip configuration that creates a desired filter response based on thickness, width and separation distance. Moreover, while not shown here, the resonators may be separated vertically also to change electrical and magnetic coupling. The resonators, in some embodiments, are not axially aligned as shown here in FIG. 41. Thus, in an alternate embodiment, micro-strip filter 1528 comprises a plurality of resonators arranged to be electrically and magnetically coupled according to a desired filter response and are not arranged in an axial configuration as in the embodiment of FIG. 41.

Not only is a defined filter response based upon width, length and shape of the resonators, but also upon the thickness of the resonator construction. Because skin effect is very prevalent for very high frequency operations, the width and depth of the resonators as well as length can greatly increase or decrease resistive and inductive characteristics of each resonator and the micro-filter 1528 as a whole.

A micro-strip filter 1528 may therefore include resonators 1550-1566 that are less inductive in relation to others and that have greater or less electrical or magnetic coupling between the resonators. Accordingly, producing a signal to a selected resonator of resonators 1550-1562 for transmission through micro-filter 1528 for output from resonator 1566 can produce a desired filter response, for example, a band pass filter response for a communication signal being produced for transmission. A different tap point to the micro-strip filter 1528 may be selected according to the frequency of the signal desirably being produced for transmission through the dielectric substrate wave guide.

While not shown explicitly in FIG. 41, a radio transceiver according to one embodiment further includes logic to select a micro-strip tap point based upon whether transmissions are intended to be received by the second or third (or other additional) substrate transceivers within the dielectric substrate wave guide.

Figure 42:
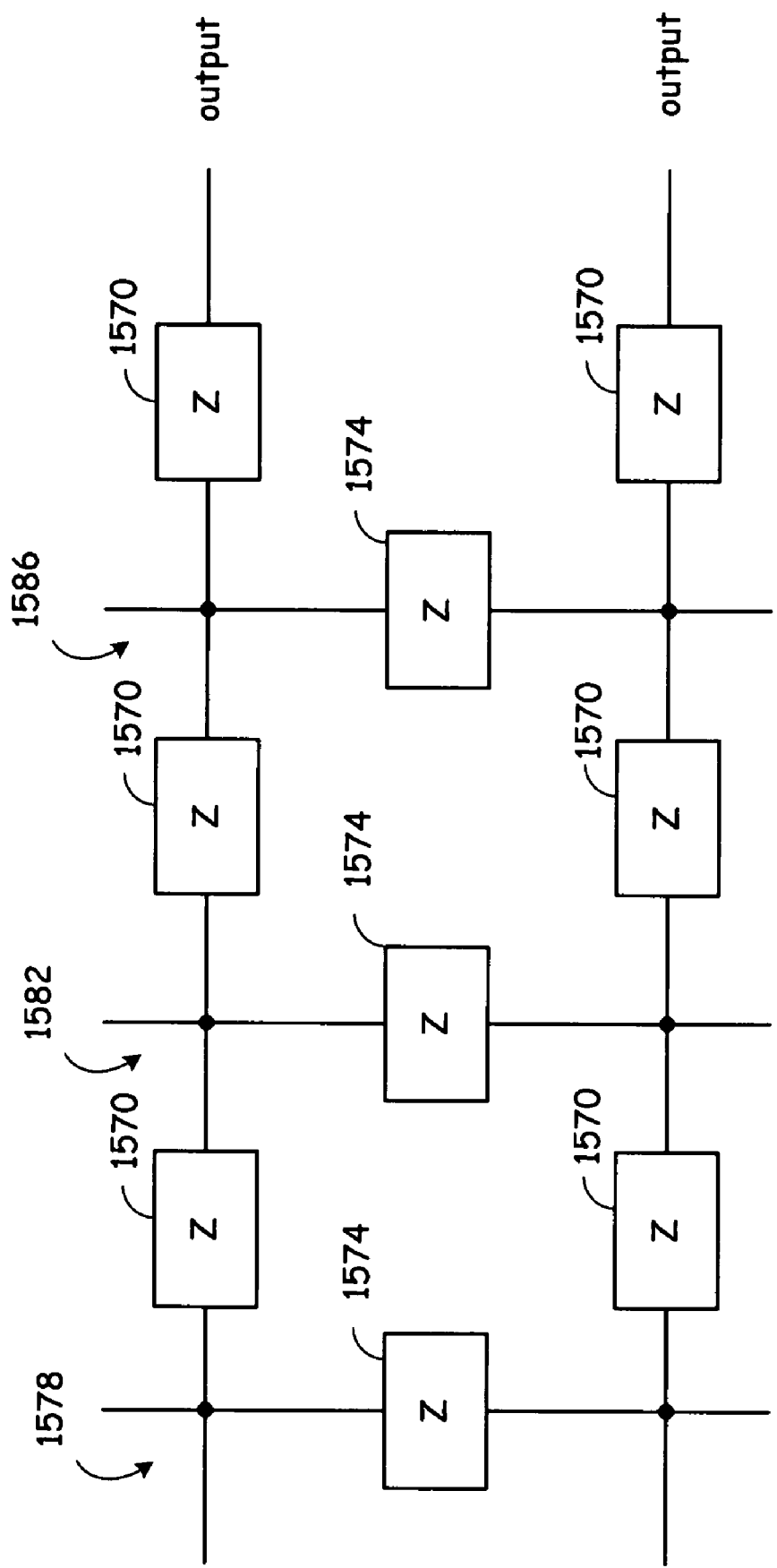
FIG. 42 is a circuit diagram that generally represents a small scale impedance circuit model for a micro-strip filter comprising a plurality of resonators according to one embodiment of the invention.

FIG. 42 is a circuit diagram that generally represents a small scale impedance circuit model for a micro-strip filter comprising a plurality of resonators according to one embodiment of the invention. A plurality of series coupled impedance blocks 1570 are operably coupled to a plurality of parallel coupled impedance blocks 1574. The impedance of each block is shown as "Z" though it should be understood that the impedance blocks do not necessarily have similar impedance values. Nodes 1578-1586 provide different input points for the circuit model of the micro-strip filter for the output as shown. By coupling the input signal to one of the input nodes 1578-1586, the impedance of the small scale circuit model results in changes substantially based upon which node is selected to receive the signal produced by the RF front end. The filter response for a given very high frequency signal changes accordingly. The impedance values "Z" of the impedance blocks vary according to the micro-strip parameters as described above.

Figure 43:
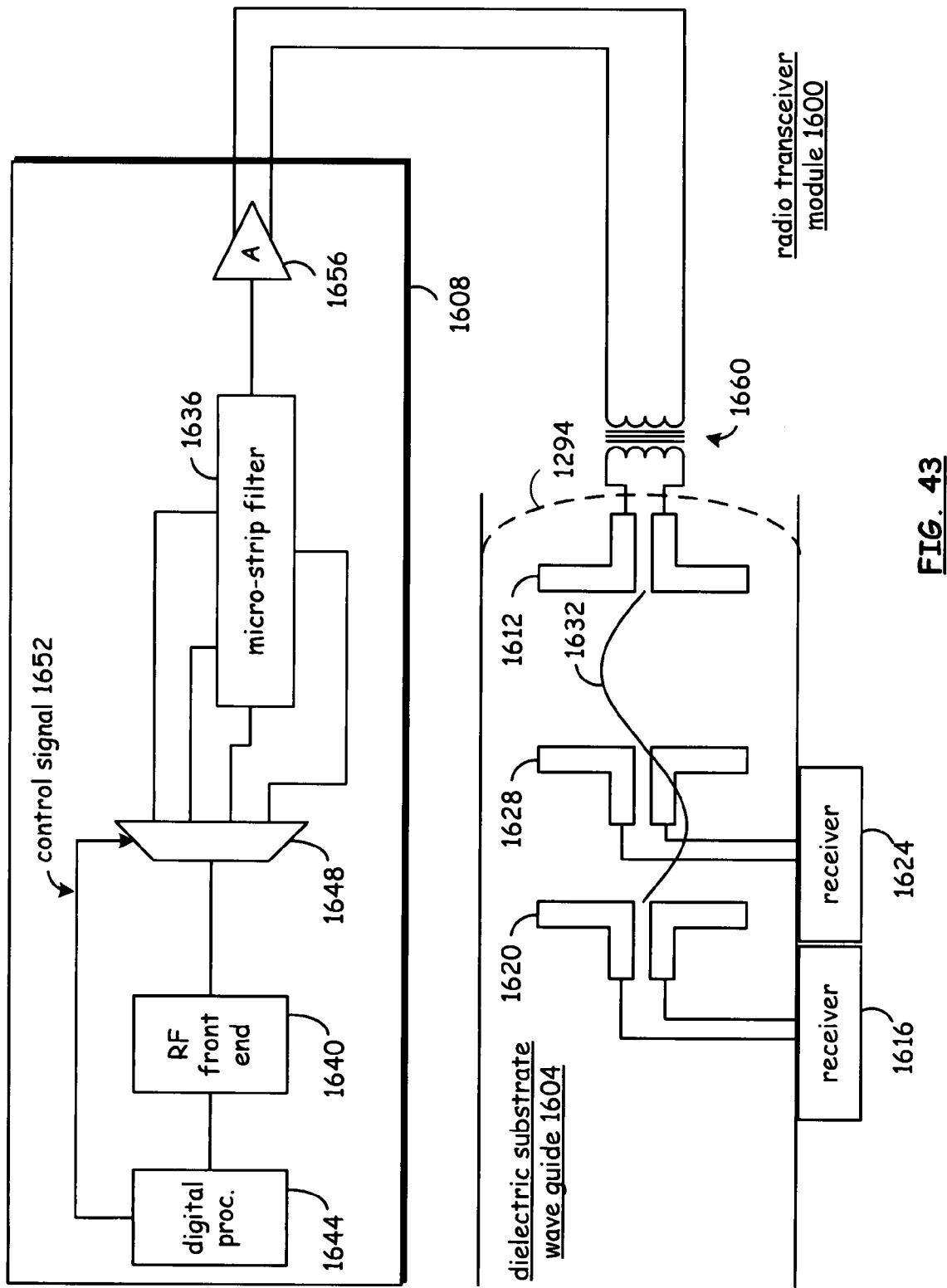
FIG. 43 is a functional block diagram of radio transceiver module for communicating through a dielectric substrate wave guide according to one embodiment of the invention.

FIG. 43 is a functional block diagram of radio transceiver module for communicating through a dielectric substrate wave guide according to one embodiment of the invention. A radio transceiver module 1600 includes a dielectric substrate wave guide 1604 for conducting very high radio frequency electromagnetic signals. A substrate transmitter 1608 is communicatively coupled to a first substrate antenna 1612 which antenna comprises a ¼ length dipole antenna in the described embodiment of the invention.

A substrate receiver 1616 is communicatively coupled to a second substrate antenna 1620 wherein the first and second substrate antennas are operably disposed to transmit and receive radio frequency communication signals, respectively, through the dielectric substrate wave guide 1604. As may further be seen, a substrate receiver 1624 is coupled to a third substrate antenna 1628. For exemplary purposes, a standing wave 1632 wave length is shown between antennas 1612 and 1620. As described previously, a standing wave 1632 is based upon a signal frequency generated by substrate transmitter 1608 and by dielectric properties of the wave guide. If a closed end is formed proximate to antenna 1612, then the wave length is substantially equal to a resonant frequency of the wave guide 1604.

A micro-strip resonator filter 1636 having a plurality of selectable tap points is electrically disposed to conduct a signal between an RF front end 1640 of the substrate transmitter 1608 and the first substrate antenna 1612 by way of the plurality of selectable tap points wherein selectable each tap point provides a corresponding filter response characterized by a filter resonant frequency for passing narrow bandwidth signals that match the filter response for transmission through the wave guide 1604. A digital processor 1644 is operable to generate digital data which is produced to RF front end 1640. RF front end 1640 subsequently produces very high frequency RF communication signals 1632 having a frequency that will pass through filter 1636 according to the selected tap point and that creates a standing wave between a desired antenna pair (e.g., substrate antennas 1612 and 1620) to switching logic 1648. Switching logic 1648 is operable to couple the RF signals produced by RF front end 1640 to a specified tap point of micro-strip filter 1636 based upon a control signal 1652 generated by digital processor 1644. The micro-strip filter 1636, which is functionally similar to the filter shown in FIGS. 41 and 42, produces a narrow band pass response based upon the resonant frequency of the filter 1636 for the selected tap point to pass the desired communication signal to amplifier 1656. Amplifier 1656 produces an amplified output to transformer 1660 that produces communication signal 1632 to antenna 1612 for radiation through dielectric substrate wave guide 1604.

The radio front end 1640 is operable in one embodiment to generate continuous waveform transmission signals characterized by a frequency that is at least 20 GHz and that is substantially equal to a resonant frequency of the wave guide and that has a wave length that creates a standing wave between the first and second substrate antennas 1612 and 1620. For communications between antennas 1612 and 1628, however, RF front end 1640 is operable to generate a signal having a new or different frequency that creates a standing wave between antennas 1612 and 1628. Additionally, digital processor 1644 generates control signal 1652 having a value that selects a corresponding tap point of filter 1636 that will pass the new frequency signal and will block frequencies outside of the narrow band response of the filter resulting from the selected tap point.

Each of the resonant frequencies of the selected filter function of micro-strip filter 1636 is substantially similar to match a desired transmission frequency of a signal to be propagated through the dielectric substrate wave guide 1604 (resonant or non-resonant). If necessary, as described in relation to previously described figures, the resonant frequency of the dielectric substrate wave guide 1604 may also be selected by selecting a specific dielectric layer or by changing the dielectric properties to change the resonant frequency of the wave guide to correspond to the antenna separation distance in addition to the defined geometry of the wave guide in relation to the transmitter antenna(s).

The resonant frequency of the filter response, in one embodiment of the invention, for the selected tap point is in the range of 55-65 GHz. In an alternate embodiment, the range is from 25-30 GHz. More generally, however, the filter response may be set for any desired frequency and may, for example, be for any frequency above 5 or 10 GHz (e.g., 20 GHz). One factor for consideration is the relationship between antenna size and its arrangement in relation to the size constraints of the substrate (die or printed circuit board for example). As before, in the described embodiment, the dielectric substrate wave guide comprises a substantially uniformly doped dielectric region. Additionally, the first, second and third substrate antennas 1612, 1620 and 1628, respectively, are operably sized to communicatively couple with the substrate region. At least the first substrate antenna is a ¼ wavelength dipole antenna. The dielectric substrate wave guide 1604 of the radio transceiver module 1600 may be of a dielectric substrate within an integrated circuit die or a dielectric substrate formed within a supporting board. A supporting board includes but is not limited to printed circuit boards.

Figure 44:
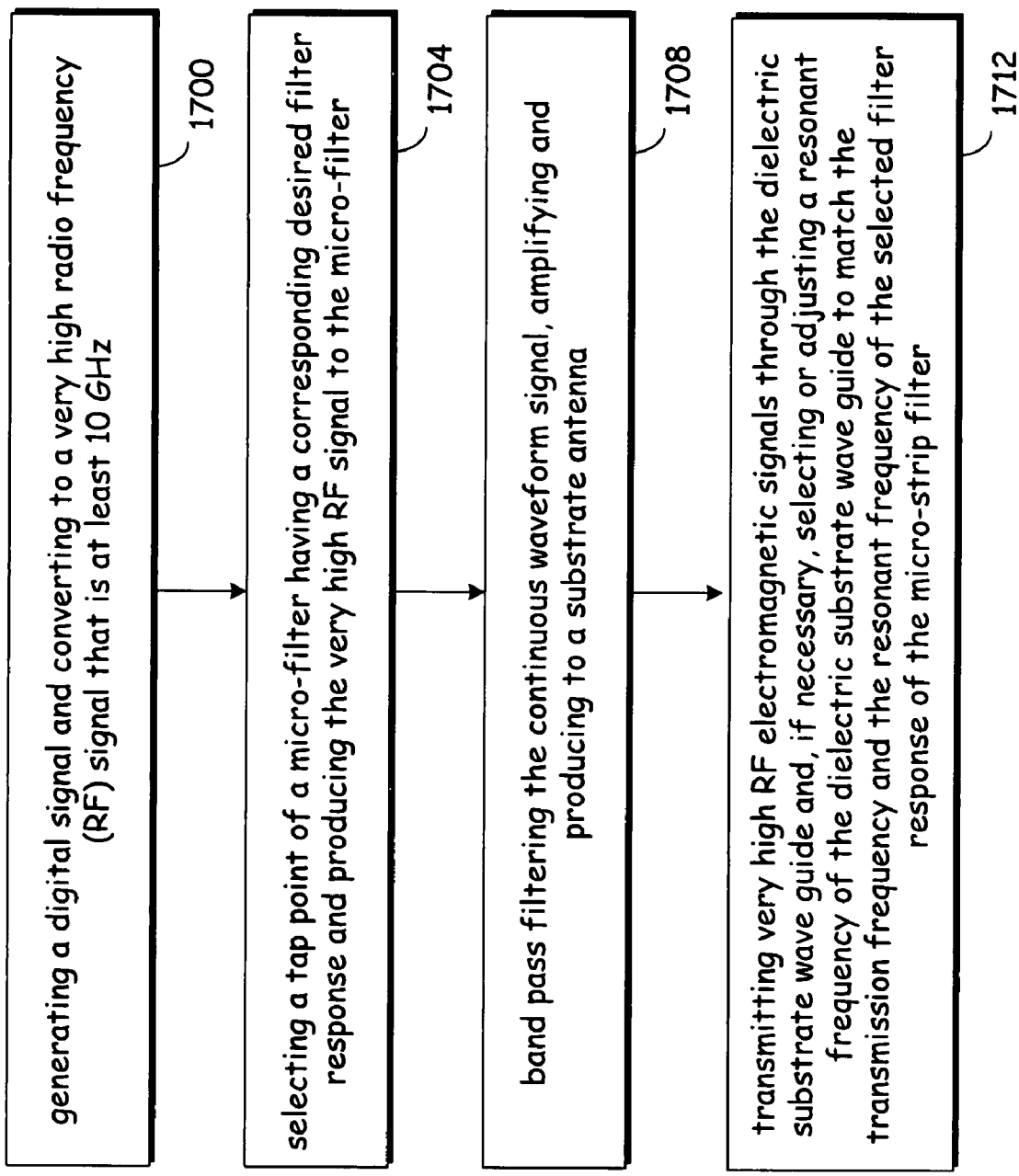
FIG. 44 is a flow chart illustrating a method according to one embodiment of the invention for transmitting very high radio frequency transmission signals through a dielectric substrate wave guide.

FIG. 44 is a flow chart illustrating a method according to one embodiment of the invention for transmitting very high radio frequency transmission signals through a dielectric substrate wave guide. The method includes generating a digital signal and converting the digital signal to a continuous waveform signal and upconverting the continuous waveform signal to generate a very high frequency radio frequency (RF) signal having a specified frequency of at least 10 GHz (step 1700). In alternate embodiments, the very high RF has a frequency of at least 20 GHz. In yet other alternate embodiments, the very high RF has a frequency in the range of one of 25-30 GHz or 55-65 GHz.

The method further includes selecting a tap point of a micro-filter having a corresponding desired filter response and producing the very high RF signal to the micro-filter (step 1704). A selected filter response thus band pass filters the continuous waveform signal, an amplifier amplifies the filtered signal and produces the filtered and amplified signal to a substrate antenna by way of a transformer in the described embodiment of the invention (step 1708).

Finally, the method includes transmitting very high RF electromagnetic signals through the dielectric substrate wave guide and, if necessary, selecting or adjusting a propagation frequency (resonant or non-resonant) of the dielectric substrate wave guide to match the transmission frequency and the resonant frequency of the selected filter response of the micro-strip filter (step 1712).

Figure 45:
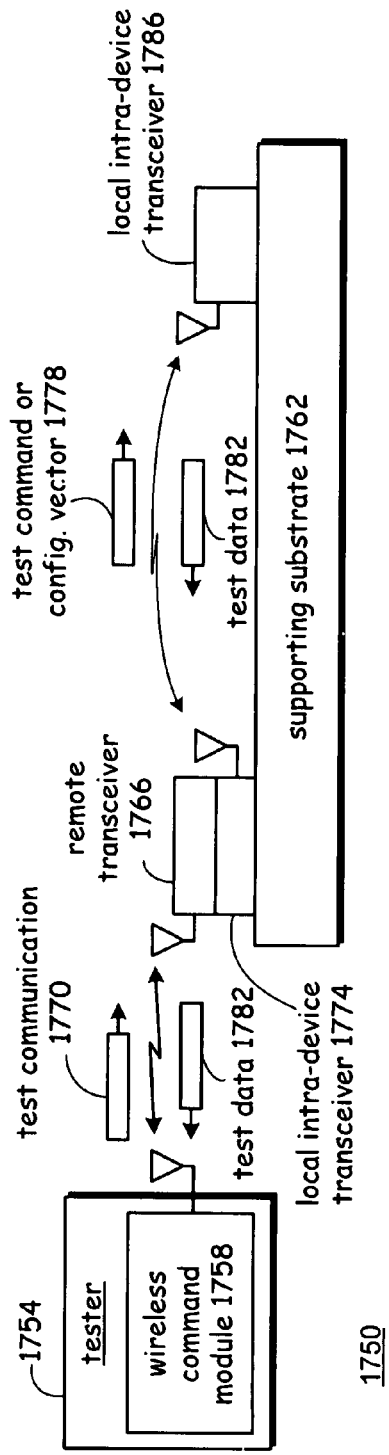
FIG. 45 is a functional block diagram of a wireless testing system on a substrate according to one embodiment of the invention.

FIG. 45 is a functional block diagram of a wireless testing system on a substrate according to one embodiment of the invention. A testing system 1750 generally includes a tester 1754 operable to initiate or control testing operations of a circuitry on a substrate by way of a plurality of wireless communication links. Tester 1754 includes a wireless test command module 1758 that defines test operation logic for commanding test procedures and for generally controlling test procedures and test data processing.

Test system 1750 further includes a supporting substrate 1762 to be tested wherein the supporting substrate 1762 further includes a remote transceiver 1766 operable to communicate with the tester 1754 to support test communications 1770, a first local intra-device wireless transceiver 1774 for wirelessly transmitting test commands or configuration vectors 1778 to another wireless device local transceiver and for receiving test data 1782 from another wireless device local transceiver.

The configuration vectors that are transmitted include any signal that defines an operational parameter in support of one or more subsequent test operations. For example, the configuration vectors may include bias levels, test data (input values, buffer and memory values, shift register values, switch position definitions, power definitions, and operational mode definitions. The configuration vectors may be transmitted not only in support of subsequent testing, but also to configure circuitry for normal (non-test) operations after one or more tests are concluded. As is known, the configuration vectors may be delivered to operational circuitry of the substrate for normal (non-test) operations or to dedicated test circuitry that is included for supporting test operations.

The first local intra-device wireless transceiver 1774 is operable to communicate at a very high frequency of at least 10 GHz with a second local intra-device wireless transceiver 1786 in the exemplary embodiment of FIG. 45. The first and second local intra-device wireless transceivers 1774 and 1786 generate very high frequency, low power short range communications within a device housing the first and second local intra-device wireless transceivers 1774 and 1786. It should be understood that references to communications by local intra-device transceivers usually apply to substrate transceivers as well unless the communication is to a transceiver on a different substrate wherein over the air transmissions are required to reach the transceiver for which a transmission is being generated. In many cases, such an alternate approach is mentioned. If not mentioned, however, such an alternate embodiment should be understood to exist.

In one embodiment, the communication frequency between local intra-device and/or substrate transceivers is in the range of 25-30 GHz and in another embodiment, in the range of 55-65 GHz. The first local intra-device wireless transceiver 1774 is communicatively coupled to the remote transceiver 1766 to exchange test communications 1770 with tester 1754 and to generate the test commands or configuration vectors 1778 to another local intra-device wireless transceiver at the very high frequency that are based upon the test communications 1770.

Test communications 1770 between remote transceiver 1766 and tester 1754, on the other hand, are not necessarily at a very high frequency and may occur at standard Bluetooth or IEEE 802.11 or other operational frequencies (e.g., 2.4 GHz or 5.0-6.0 GHz) and are relatively low in frequency in comparison to the very high frequencies of the local intra-device wireless transceivers and substrate transceivers of the embodiments of the present invention that communicate at frequencies greater than or equal to 20 GHz. Thus, one embodiment of the invention includes a remote transceiver of the substrate operable to communicate with a remote tester at a frequency in the range of 2.0 GHz to 6.0 GHz. In an alternate embodiment, the remote transceiver is operable to communicate at a very high frequency (e.g., at least 10 GHz).

In one particular application, remote transceiver 1770 and one of the first local intra-device transceiver 1774 and the substrate transceiver not shown here (e.g., substrate transceiver 2010 of FIG. 46) communicate at the same very high frequency to avoid a frequency conversion step. Moreover, the minimum transmission power level for transmissions from remote transceiver 1766 are necessarily substantially greater than for transmissions from local intra-device transceivers because of the relative transmission distance and potentially increased interference levels. For example, a remote transceiver of a given substrate and a tester may be separated by as little as a few inches to as much as a hundred feet (for example), while two local intra-device transceivers will typically be separated by less than six inches and may be separated by as little as a few millimeters (for intra-die communication through air or substrate with substrate transceivers). Moreover, intra-device communications are typically shielded from external interference by the device housing thereby requiring less power to overcome interference. Substrate transceivers are even further protected since they typically occur within a dielectric substrate wave guide as described herein.

Referring back to FIG. 45, the second local intra-device wireless transceiver 1786 is operable to wirelessly receive test commands or configuration vectors 1778 and to transmit test data 1782 to the first local intra-device wireless transceiver 1774. Second local intra-device wireless transceiver 1786 also is operable to communicate at a very high frequency with first local intra-device wireless transceiver 1774.

The first and second local intra-device wireless transceivers 1774 and 1786 typically communicate with very short range high frequency communication signals at a power and frequency that is for very short distance communications. As in prior described embodiments, the communications are adapted to adequately reach another local intra-device wireless transceiver on the same substrate or in a same device. The transmission power is therefore set to achieve such communications without excess power to reduce interference with remote or external communication devices and circuitry.

Figure 46:
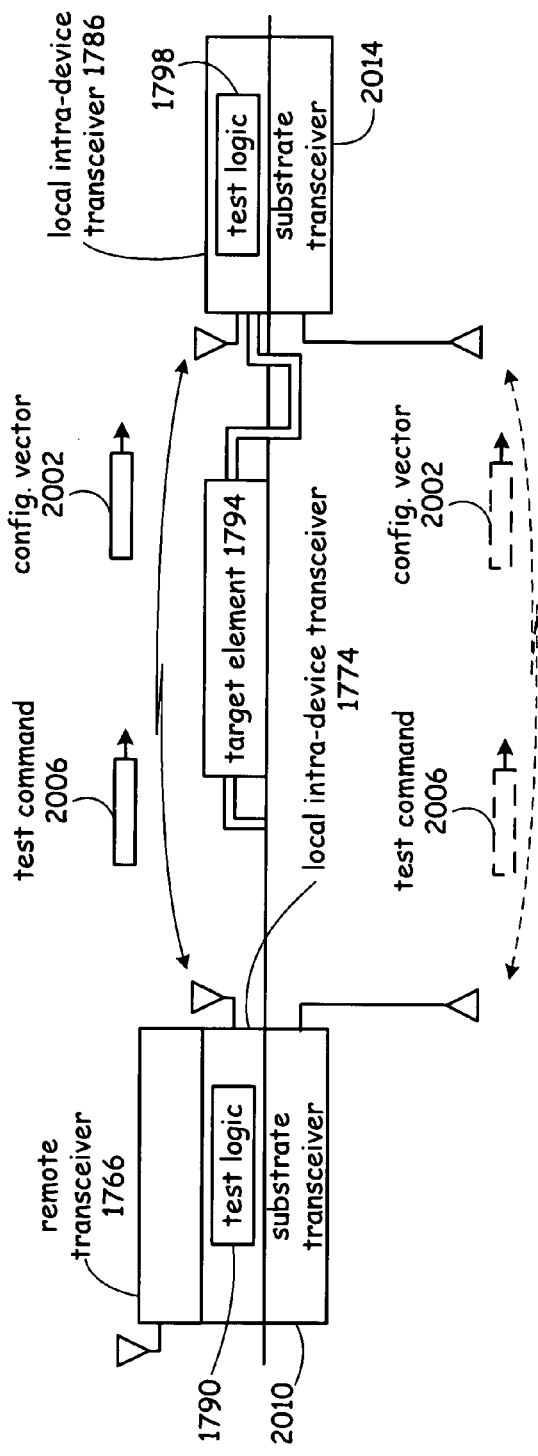
FIG. 46 is a functional block diagram showing greater detail of a supporting substrate and circuitry for supporting test operations according to one embodiment of the invention.

FIG. 46 is a functional block diagram showing greater detail of a supporting substrate and circuitry for supporting test operations according to one embodiment of the invention. The test system 1750, and more particularly, test logic and circuitry of substrate 1762 being tested further includes first test logic 1790 associated with the first local intra-device wireless transceiver 1774. Test logic 1790 is for processing the test commands or configuration vectors 2002, test commands 2006 and test data 1782 (as shown in FIG. 45). The logic 1790 is communicatively coupled to the first local intra-device wireless transceiver 1774 and is operable to determine, based upon the test communications 1770, a plurality of corresponding test procedures corresponding to at least one of a plurality of circuit modules and to produce the corresponding test procedures.

In operation, the first local intra-device wireless transceiver 1774 is operable to determine a target circuit element 1794 to be tested based at least in part upon the test communications 1770. The first local intra-device wireless transceiver 1774 is further operable to determine an associated second local intra-device wireless transceiver 1786 to which test commands 2006 or configuration vectors 2002 are to be sent as a part of testing target circuit element 1794.

In one embodiment of the invention, the target circuit element 1794 and associated second local intra-device wireless transceiver 1786 are on the same bare die as local intra-device transceiver 1774. As such, substrate transceivers 2010 and 2014 may be used for the configuration vectors 2002, test commands 2006, or test data 1782. In another embodiment, the target circuit element 1794 and associated second local intra-device wireless transceiver 1786 are part of a different die installed or formed on the same supporting substrate. Depending upon configuration, substrate transceivers may be used here also. In yet another embodiment, the target circuit element 1794 and associated second local intra-device wireless transceiver 1786 are part of a different die and a different supporting substrate but within a common device. For example, the common device may be a multi-chip module or merely a device housing a plurality of supporting substrates. For this embodiment, the local intra-device with transceivers are used for supporting test communications.

The testing system 1750, in one embodiment of the invention, further includes a second test logic 1798 associated with the second local intra-device wireless transceiver 1786. The second local intra-device wireless transceiver 1786 thus receives test commands or configuration vectors 1778 and provides the test commands or configuration vectors 1778 to second test logic 1798. Second test logic 1798 subsequently initiates test procedures to test target element 1794 based upon the test commands or configuration vectors 1778.

Alternatively, especially if the testing system 1750 (and more particularly the substrate 1762 being tested) does not include second test logic 1798, the test commands or configuration vectors 1778 include associated commands to specify specific communication and other process steps to control a test procedure or configuration procedures by way of second local intra-device wireless transceiver 1786. Thus, for example, the first local intra-device wireless transceiver 1774 is operable to transmit configuration vectors to the second local intra-device wireless transceiver 1786 for pre-configuring circuit conditions for at least one subsequent test corresponding test command. If test logic 1798 is included, test logic 1788 is operable to establish configuration conditions and to determine specific test steps based upon test command 2006. In this embodiment, test command 2006 is more general than necessary if logic 1798 is not present (does not exist in the specific embodiment).

A testing system tester, e.g., tester 1754 of FIG. 45, is operable to engage in test communications with remote transceiver 1766 which, through a communicative coupling with local intra-device transceiver 1766, results in local intra-device transceiver 1766 transmitting configuration vectors and then test commands based upon the test communications and upon logic 1790 and whether transceiver 1786 includes an associated logic 1798.

Generally, the configuration vectors 2002 are transmitted to establish desired test conditions prior to a test procedure being performed. Depending on implemented design logic, therefore, the test command may be sent for storage until the test is executed or, alternatively, only after a specified period to allow enough time for the configuration vectors to set the test conditions. In one embodiment, the configuration vectors 2002 are at least partially stored within the first test logic 1790 associated with the first local intra-device transceiver 1774. Test logic 1798 associated with the second wireless transceiver 1786 is included in the described embodiment for providing at least one of test commands, test configuration parameters including bias levels, operational mode settings, and configuration vectors partially based upon the test communication received from the tester.

If the configuration vectors 2002 and test commands 2006 are alternatively transmitted by a substrate transceiver 2010 that is operably coupled to at least one of local intra-device transceiver 1774 or remote transceiver 1766 or test logic 1790, very low power may be used for the transmissions because of a lack of interference and because of the very short transmission distances. In the example of FIG. 46, the configuration vectors 20002 and test commands 2006 are transmitted to substrate transceiver 2014 which is communicatively coupled to one of local intra-device wireless transceiver 1786 or second test logic 1798 for testing target element 1774. Test data 1782 may be returned through the substrate or may alternatively returned over the air using local intra-device wireless transceivers 1786.

Figure 47:
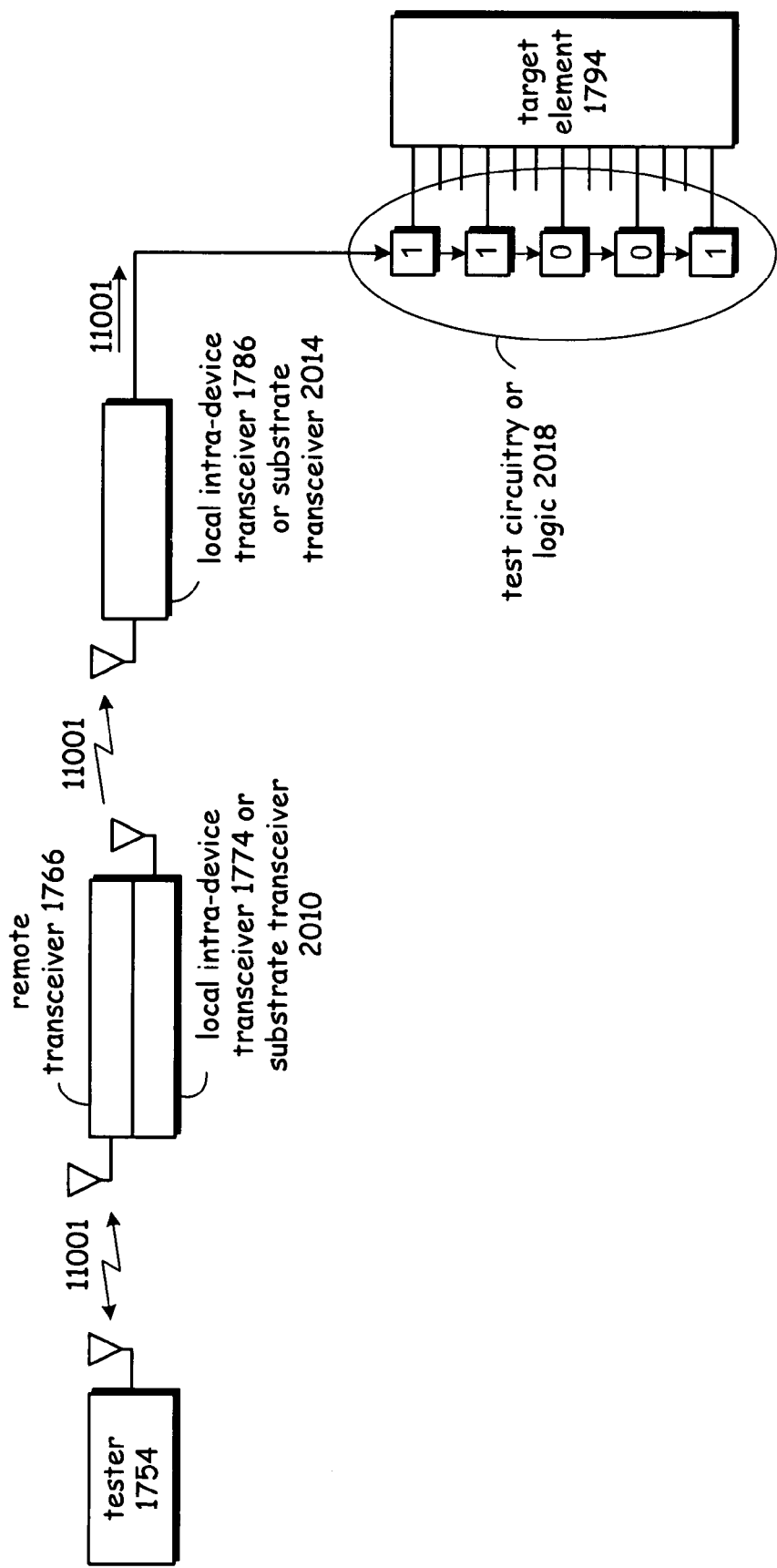
FIG. 47 is a functional block diagram of a system for testing a target element and, more particularly, illustrates loading configuration vectors according to one embodiment of the invention.

FIG. 47 is a functional block diagram of a system for testing a target element and, more particularly, illustrates loading configuration vectors according to one embodiment of the invention. As may be seen, a tester 1754 transmits a plurality of configuration vector values shown as "11001" to represent the transmission of a plurality of digital values in the order of "1" "0" "0" "1" and "1". The configuration vector values are transmitted to a remote transceiver 1766. An associated local intra-device transceiver 1774 or a substrate transceiver 2010 then forwards the configuration vector values to a down stream local intra-device transceiver 1786 or a substrate transceiver 2014. Thereafter, according to received control commands or internal logic, the configuration values are produced to test circuitry or logic 2018.

For example, in one embodiment, test circuitry or logic 2018 comprises circuit modules that receive the configuration values and generate a corresponding signal to a specified input of target element 1794. The corresponding signals may be stored data values, bias levels or any other input necessary for testing a specified aspect of target element 1794. The configuration values are thus merely stored and produced as inputs or are used to trigger a circuit module to generate a corresponding signal or input value to a target element that is to be tested either prior to or during a test procedure.

Figure 48:
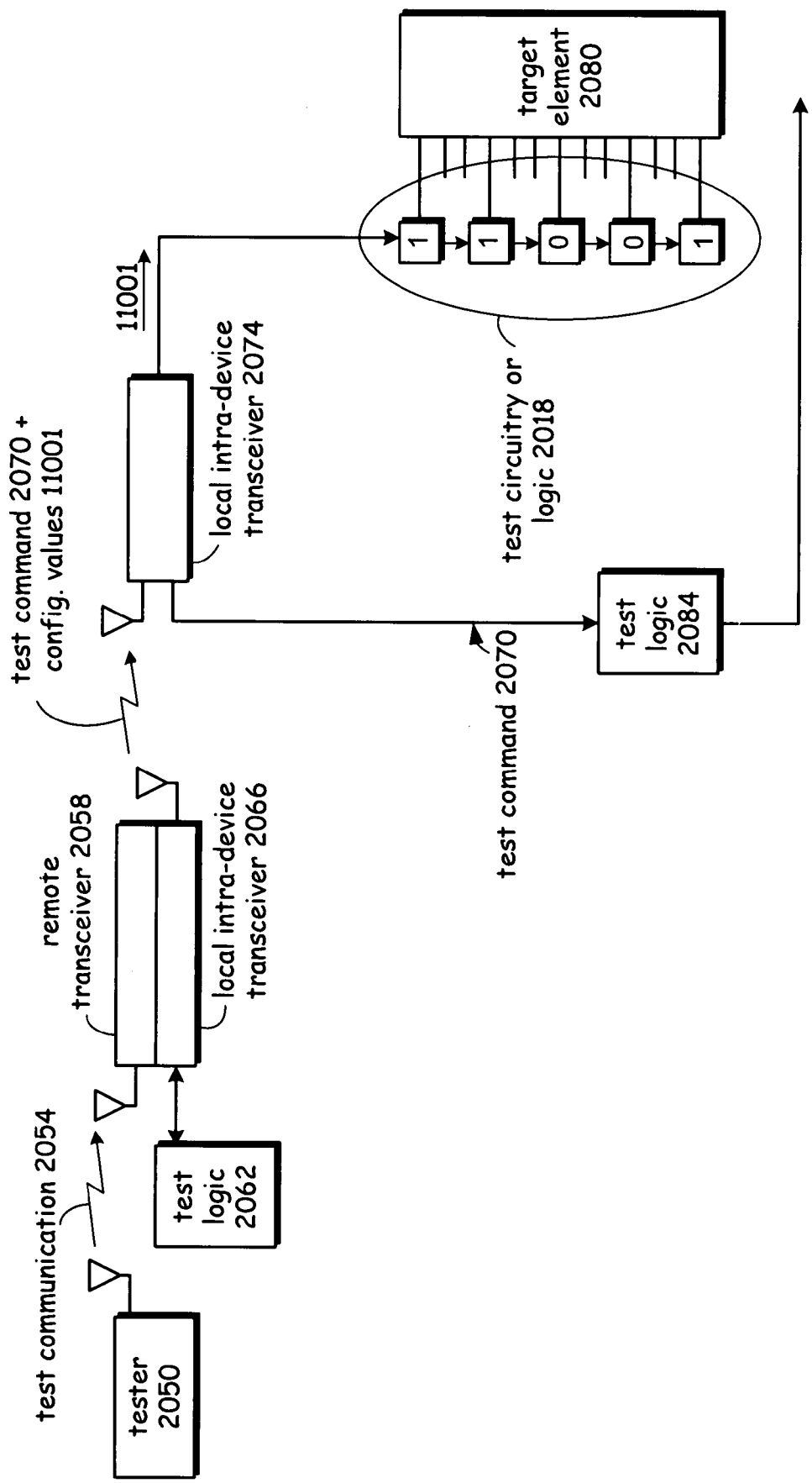
FIG. 48 illustrates an alternate embodiment of the invention in which a plurality of wireless communication links produce test commands and configuration vectors to circuitry that is to be tested.

FIG. 48 illustrates an alternate embodiment of the invention in which a plurality of wireless communication links produce test commands and configuration vectors to circuitry that is to be tested. In the described embodiment, tester 2050 generates test communication 2054 to remote transceiver 2058. Test logic 2062 receives and interprets test communication 2054 received by remote transceiver 2058 and generates at least one of test command 2070 and configuration values (shown as "11001") to local intra-device transceiver 2066.

Figure 49:
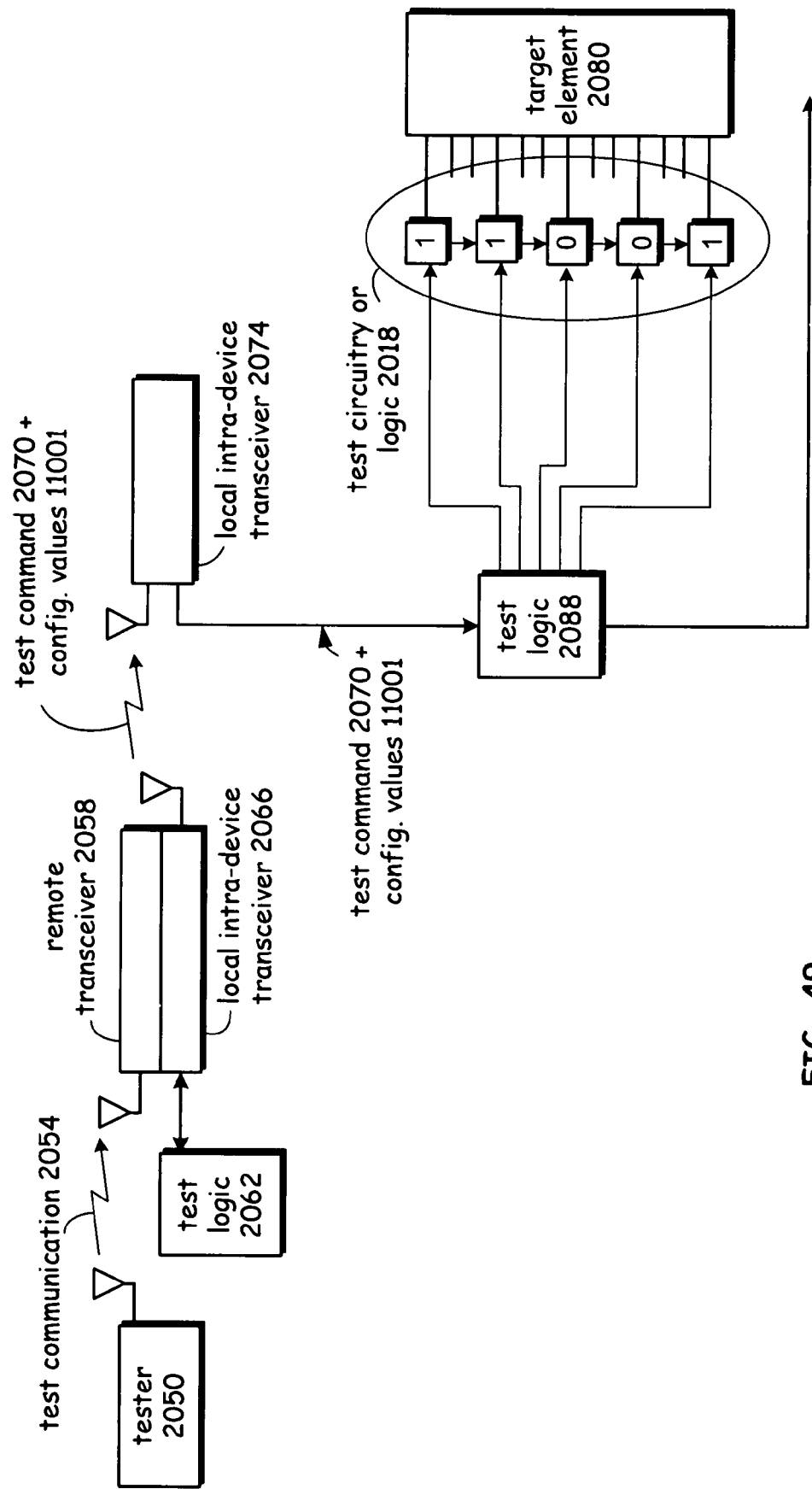
FIG. 49 illustrates yet another embodiment in which the configuration vectors and test command 2070 are produced solely to a test logic.

Local intra-device transceiver 2074 produces test command the configuration values to test circuitry or logic 2018 to establish a test or operational configuration for target element 2080. Local intra-device transceiver also produces test command 2070 to test logic 2084 to conduct at least one corresponding test. For example, test command 2070 may comprise either a command for a specific test or, alternatively, a command that triggers a defined sequence of tests. FIG. 49 illustrates yet another embodiment in which the configuration vectors and test command 2070 are produced solely to a test logic 2088. Test logic 2088 is then operable to produce the configuration values to test circuitry or logic 2018. In the embodiment that is shown, test logic 2062 generates the test command 2070 and configuration values based upon test communication 2054. In an alternate embodiment, test logic 2062 merely generates test command 2070 that is produced to test logic 2084. Test logic 2084, thereafter, generates the configuration value based upon the test command 2070.

Figure 50:
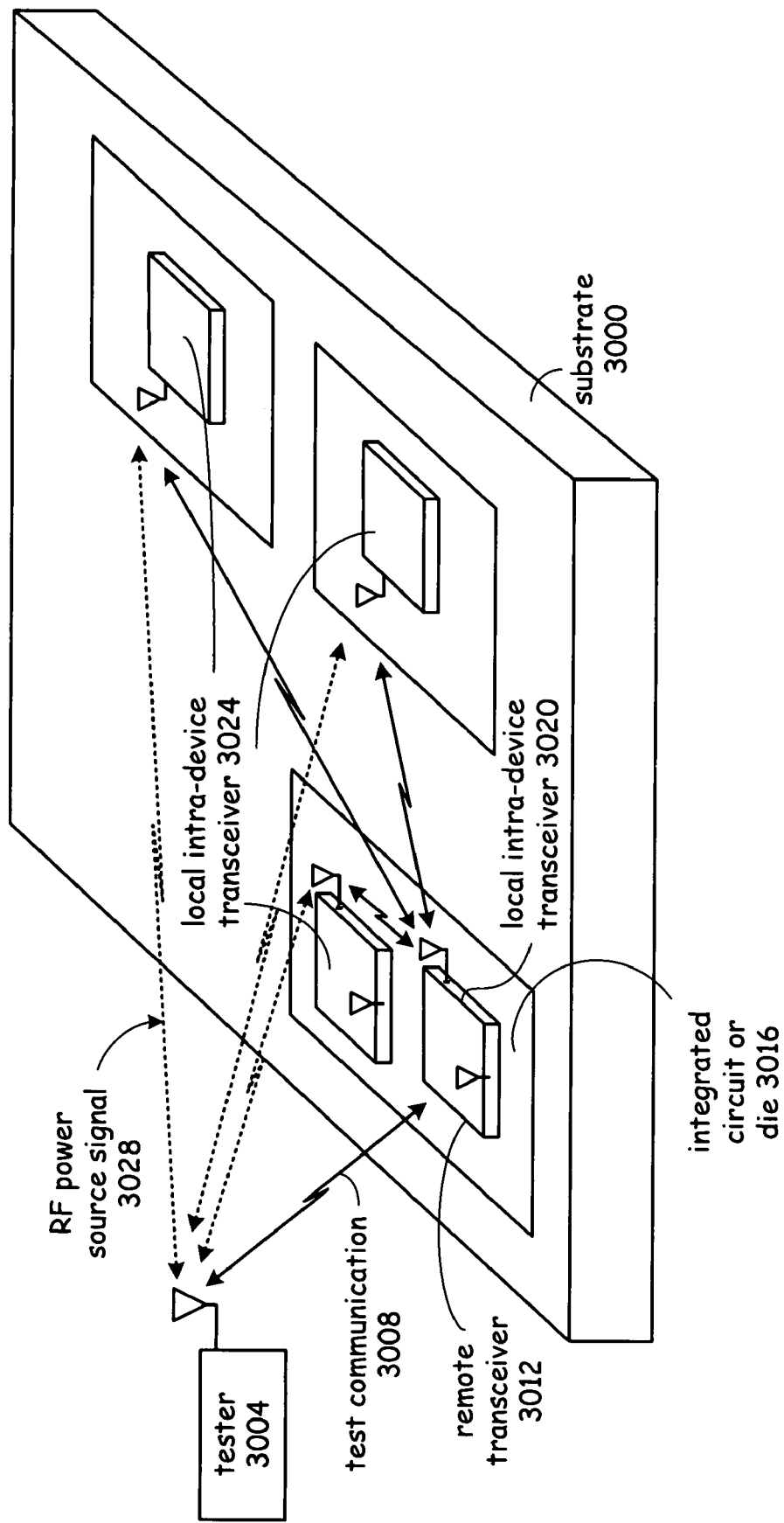
FIG. 50 is a functional schematic block diagram of a substrate under test according to one embodiment of the invention.

FIG. 50 is a functional schematic block diagram of a substrate under test according to one embodiment of the invention. A supporting substrate 3000 operably communicates with a tester 3054 that initiates and at least partially controls test operations. Thus, the substrate 3000 includes circuitry that is responsive to test communications initiated by tester 3054. Tester 3004 generates test communications 3008 that are transmitted at least to remote transceiver 3012. Remote transceiver 3012, which is located on integrated circuit or die 3016, receives the test communications 3008 and transmits test commands, configuration vectors or configuration values from local intra-device transceiver 3020 in a manner as described in relation to prior figures. In the example of FIG. 50, local intra-device transceiver 3020 transmits the test commands or configuration vectors/values to a local intra-device transceiver 3024. As may be seen, a plurality of local intra-device transceivers 3024 are shown. One local intra-device transceiver 3024 is located on the same integrated circuit or die 3016 as local intra-device transceiver 3020 while other local intra-device transceivers 3024 are located on different integrated circuits or die.

In the described embodiment, each local intra-device transceiver 3024 is located on the same substrate 3000 though they may be located on another substrate 3000 within a common device or multi-chip module. For an embodiment in which the test commands or configuration vectors/values are being transmitted to circuitry within the same substrate 3000, substrate transceivers (not shown in FIG. 50) may be used in place of the local intra-device transceivers.

One additional aspect shown in the embodiment of the invention of FIG. 50 is that the circuitry of substrate 3000 is operable to absorb power from the test communication 3008 and other transmissions such as RF power source signal 3028 which is transmitted to generate wireless transmissions for test purposes and to perform commanded tests.

In operation, remote transceiver 3012 and local intra-device transceiver 3020 both initially receive adequate power for subsequent operations as described herein from the initial test communication 3008. As is known, radiated RF energy dissipates quickly. For a doubling in transmission distance, the radiated power drops by 75 percent (quarter power). Thus, passive transponder designs may be utilized to facilitate some testing of integrated circuits and die even while still attached to a wafer after fabrication and prior to separation for subsequent test and packaging. Part of the design includes, however, a relationship between the transmitted power level of tester 3004, the distance between tester 3004 and substrate 3000, and a frequency of transmission of RF power source signal 3028 to facilitate passive test operations as described herein.

The local intra-device transceivers 3024, though not receiving test communication 3008 for communication purposes are also operable to absorb power therefrom to subsequently receive and process test commands and configuration vectors/values transmitted from local intra-device transceiver 3020. In one embodiment of the invention, tester 3004 periodically generates RF power source signal 3028 for the purpose of providing wireless power to the circuitry of substrate 3000. Such signal 3028 may or may not have data or control commands therein. A dashed line is used in FIG. 50 to represent signal 3028 and that the signal 3028 may not have information value (but could). Generally, therefore, each local intra-device transceiver 3024 is operable to receive test commands and/or configuration vectors/values from local intra-device transceiver 3020, which are based upon test communication 3008, while absorbing power from test communication 3008 and subsequent RF power source signal 3028 from tester 3004 (or alternate RF source for proving power through wireless transmissions). Techniques for absorbing power for subsequent operations are known to exist for RFID systems which are being used to replace bar codes on products. Such techniques may be applied herein without undue experimentation to meet design requirements by one of average skill in the art.

Figure 51:
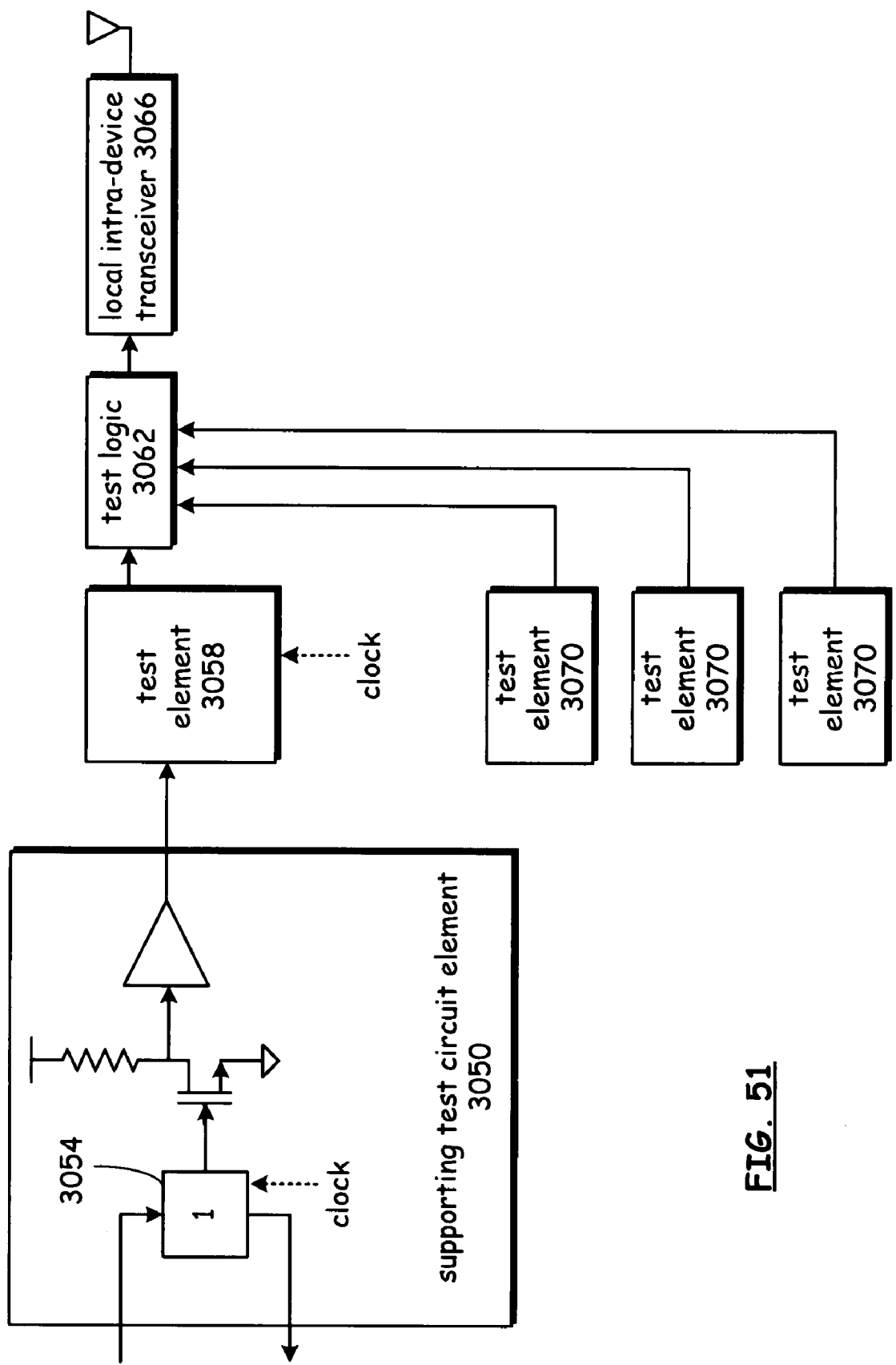
FIG. 51 is a functional block diagram of a system for applying a specified condition as an input to a test element based upon a configuration value according to one embodiment of the invention.

FIG. 51 is a functional block diagram of a system for applying a specified condition as an input to a test element based upon a configuration value according to one embodiment of the invention. A configuration value is produced to a register 3054 that holds the configuration value and produces the configuration value to a gate of a MOSFET transistor. In one optional embodiment, the configuration value is produced to the MOSFET transistor based upon a clock pulse. The gate, with the configuration shown, reaches a threshold turn on voltage to turn the transistor on to draw a current limited by the resistor to produce an output voltage to test element 3058. Test element 3058 produces at least one output to test logic 3062 based upon at least one specified input condition generated by supporting test circuit element 3050. In one optional embodiment, test element 3058 produces the at least one output based upon a clock pulse. The clock pulse may be the same or different from the clock pulse that drives register 3054. Use of clock pulses, and especially separate clock pulses, allows conditions to be specified for every input combination that is to be tested and for the test to occur only when all conditions are created for the test.

Test logic 3062 is operable to receive at least one output from test element 3058 and, optionally, from other test elements 3058 and to generate test data for transmission to a remote transceiver for forwarding to a tester by way of local intra-device transceiver 3066. As may further be seen, the logic 3062 of the embodiment of FIG. 51 is operably coupled to receive test data (results) from test element 3058 (as described above) and, optionally, from one or more additional test elements 3070 to produce test data for each test element 3058 or 3070 from which a test result was received.

Figure 52:
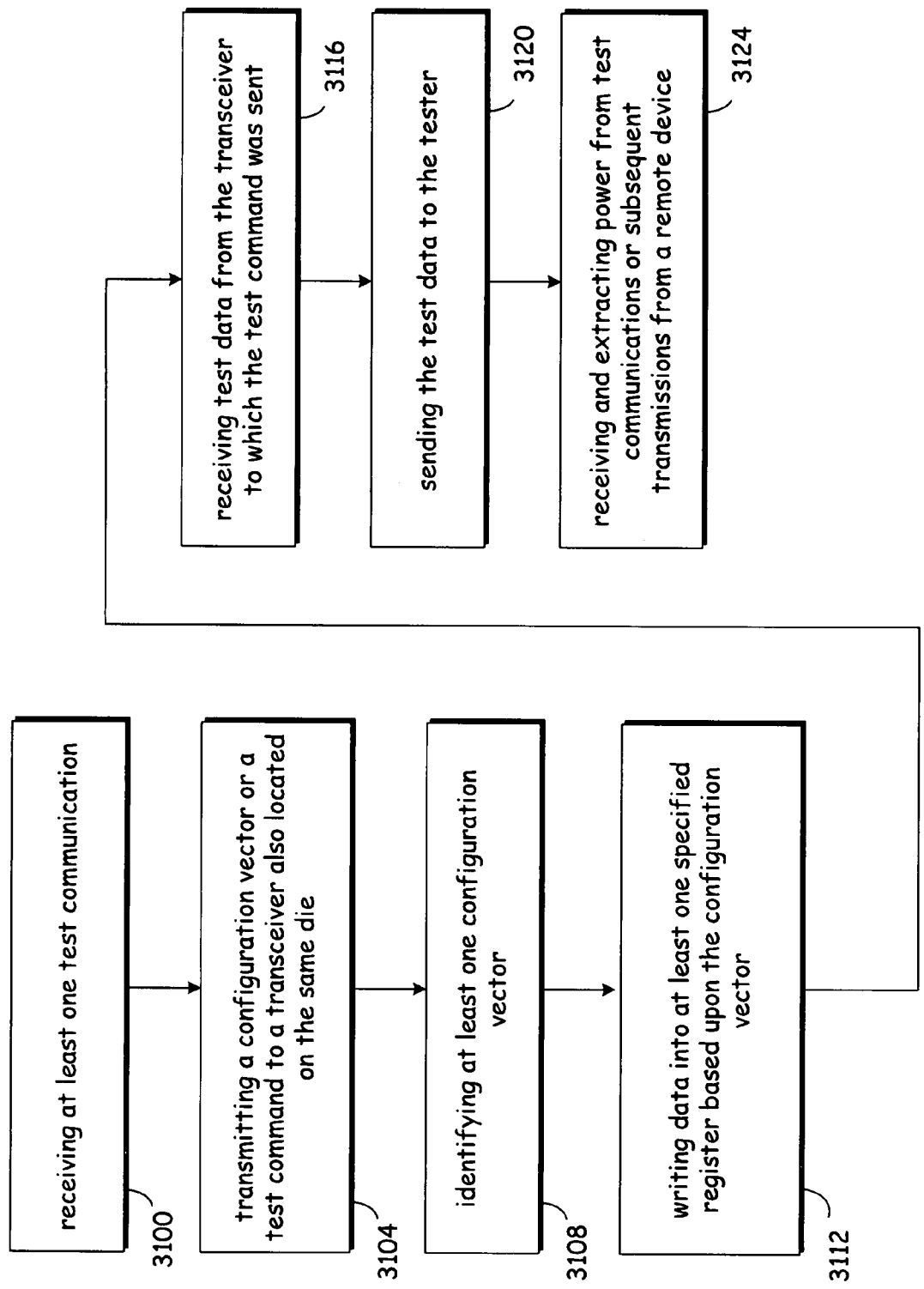
FIG. 52 is a flow chart that illustrates a method of testing components of a die according to one embodiment of the invention.

FIG. 52 is a flow chart that illustrates a method of testing components of a die according to one embodiment of the invention. The method includes wirelessly receiving at least one test communication transmitted at a radio frequency (RF) from a tester (step 3100). The received signal has an associated signal strength which enables each receiver that receives the signal to extract sufficient to perform subsequent communications and test related procedures. The method further includes wireless transmitting, from a first local intra-device wireless transceiver of the die, at least one of a configuration vector or a test command to a second local intra-device wireless transceiver also located on the die based at least in part on the at least test communication received from the tester (step 3104). This transmission, in one embodiment, may be generated using power extracted from the received transmission from the tester (or associated device) as discussed below.

The method further includes identifying at least one configuration vector that defines a circuit or logic condition that is to be established for a specified test (step 3108). The at least one configuration vector may be determined based upon a signal value with the test communication received from the tester or defined within logic or generated by the logic based upon the test communication. In one embodiment, circuitry associated with one of the remote transceiver or a coupled to a local intra-device transceiver is operable to determine the at least one configuration vector. In an alternate embodiment, the step of determining the at least one configuration vector may be determined by circuitry associated with a second local intra-device transceiver (or substrate transceiver) based upon a received test command.

In either embodiment, the method optionally includes, as needed, writing data into at least one specified register based upon the configuration vector (step 3112). Generally, the configuration vector that is received or determined comprises configuration parameters for a subsequent test that is to be performed, which configuration parameters further include at least one of a switch position setting, a bias level, a configuration setting, or an operational mode setting. Thereafter, the method includes receiving test data from the second local intra-device wireless transceiver (step 3116) and sending the test data to the tester (3120). Alternatively, the step of receiving the test data can include receiving the test data from a substrate transceiver.

The test communications with the tester are through a remote transceiver of the die wherein the remote transceiver is communicatively coupled to the first local intra-device wireless transceiver. These communications include the test communications initially transmitted by the tester to the die and, subsequently, the transmission of the test data from the die to the tester. It should be understood that the test data may comprise pure test data that has not been modified or, alternatively, at least partially processed data that reflects one or more results from the test. For example, the test data may comprise specific output readings or, alternatively, a signal that reflects whether a specified test was passed, failed, or a score relating to the test result.

Each of the above steps relate to performing at least one test on a target circuit element. The embodiment of the invention further includes, however, sending configuration parameters for normal operations, which configuration parameters further include at least one of a switch position setting, a bias level, a configuration setting, or an operational mode setting to support of resuming normal operations after completing at least one test.

As suggested above, one embodiment of the invention includes receiving and extracting power from the test communication from the tester (or other remote source) and using the extracted power for subsequent communications and for conducting at least one test procedure (step 3124). In one embodiment, the method not only includes receiving power from an initial test communication, but also receiving a plurality of subsequent RF transmissions or communications from the tester or other source and extracting power from the RF of the subsequent test communications or transmissions to perform at least one test or communication after receiving the subsequent test communication from the tester. Thus, a tester or associated circuit may operably generate a plurality of test communications for the purpose of enabling the circuitry within the die to extract additional needed power.

In one embodiment of the invention, step 3124 as well as the other steps are performed within a die prior to the die being separated from the die wafer within which the die was formed. Alternatively, the method steps described herein are at least partially performed within a die after the die is separated from the die wafer within which the die was formed but before the die is packaged.

In yet another embodiment, at least a portion of the described method steps including subsequent communications and at least one test procedure are performed within a die during burn-in test procedures. Burn in test procedures typically are test procedures performed upon a packaged integrated circuit or upon a bare die while the die is subjected to extreme conditions (e.g., elevated temperatures within an oven).

FIG. 52 is a functional schematic diagram that illustrates a system and method for performing tests according to one embodiment of the invention. A printed circuit board 3150 formed of a substrate material includes a plurality of integrated circuits 3154, 3158 and 3162 that are operable to communicate by way of local intra-device wireless transceivers and substrate transceivers. At least one of the integrated circuits includes a remote transceiver for wireless communications with a remote device such as a tester. For exemplary purposes, integrated circuit 3154 includes such a remote transceiver in addition to a local intra-device wireless transceiver for wireless communications through space in addition to an associated wireless substrate transceiver 3166 supporting transmission and reception of electromagnetic signals through a dielectric substrate.

Integrated circuit 3158 also includes an associated transceiver 3170 operable to support substrate communications though a dielectric substrate. Similarly, integrated circuit 3162 includes an associated transceiver 3174 operable to support substrate communications through a dielectric substrate.

In operation, integrated circuit 3154 engages in test communications with a remote transceiver and, based upon such communications, is operable to generate or initiate test procedures and/or communications with other transceivers in support of test operations. Thus, for example, integrated circuit 3154 is operable to generate a test to test component which is operably coupled to integrated circuit 3154. Integrated circuit 3154 is also operable to generate test communications, test commands, transmit test or configuration vectors, etc. with/to integrated circuits 3158 and 3162 by way of transceivers 3166, 3170 and 3174 through dielectric substrate layers 3182 and 3186, respectively.

Figure 53:
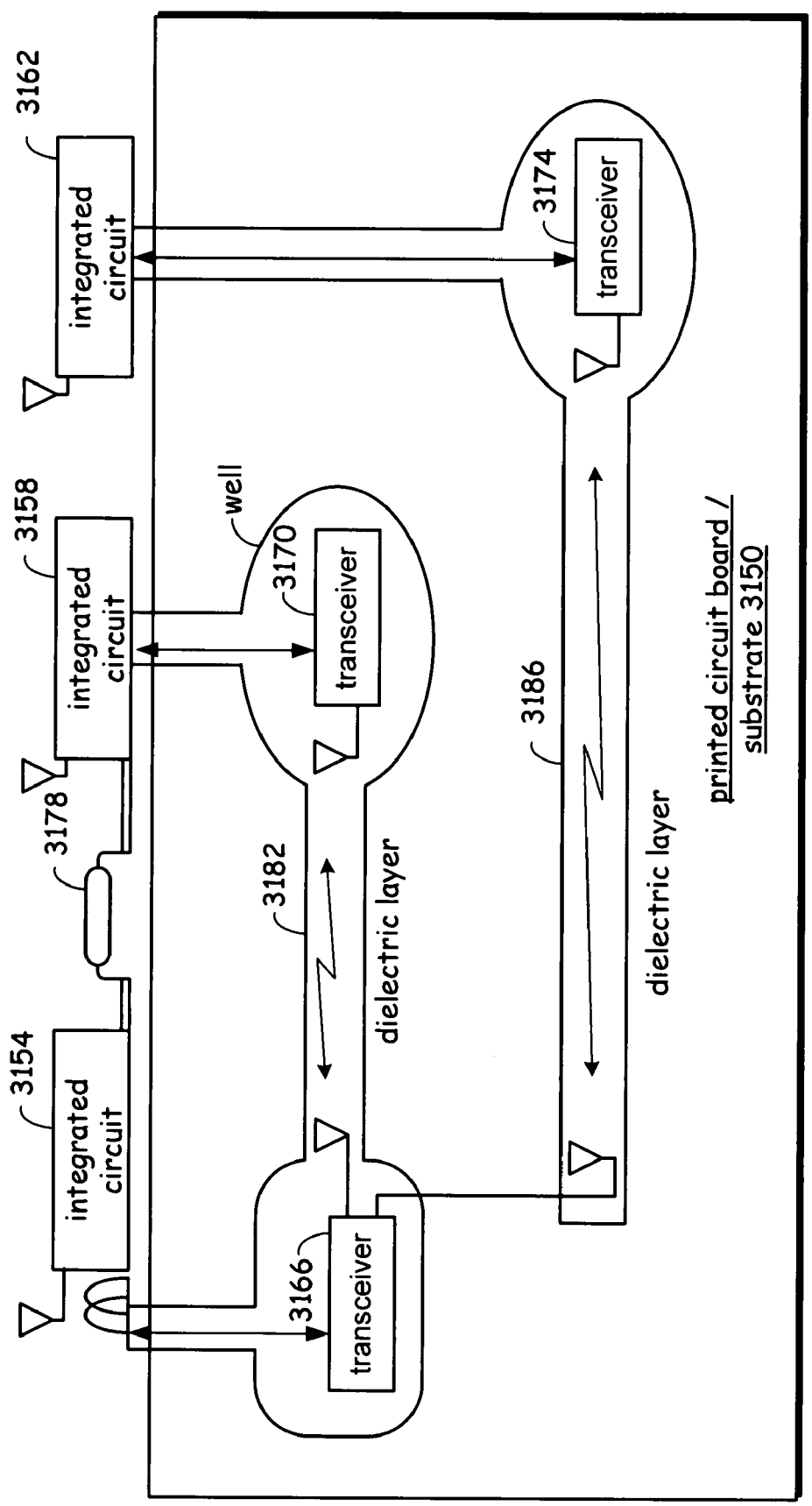
FIG. 53 is a functional block diagram that illustrates test communications transmitted through a dielectric substrate according to one embodiment of the invention in which a plurality of dielectric wave guides or layers are used to conduct the communications.

One aspect of the embodiment of FIG. 53 is that test communications are transmitted through different dielectric layers according to the target receiver for a particular test or configuration communication. Thus, for example, integrated circuit 3154 may generate a test command to integrated circuit 3158 by way of transceivers 3166 and 3170 through dielectric substrate layer 3182 and may receive test results through the same communication pathway. Alternatively, local intra-device wireless transceivers may be used to support very short range wireless test and configuration communications in place of the substrate transceivers 3166, 3170 and 3174.

As another aspect and embodiment of the present invention, each integrated circuit (or other circuitry) 3154, 3158 and 3162 operably disposed to sense RF signals transmitted by a remote transmitter is operable to extract power from the RF signals to support test and configuration operations and further to produce extracted power to the associated transceivers 3166-3174, respectively in support of communications therefor. As such, for example, transceiver 3170 is operable to receive power extracted from sensed RF by integrated circuit 3158 for communications with integrated circuit 3158 as well as with transceiver 3166. Technology for sensing and extracting such power may be In an alternate embodiment, transceiver 3166 may communicate with a plurality of transceivers for test and configuration communications using wavelength, frequency, phase or angular differentiation to control communications or to direct communications. Finally, it should be noted that FIG. 53 illustrates a printed circuit board, but that a mere substrate board may be used without the quantity of lead lines and traces of a printed circuit board. Moreover, it should be understood that the circuitry shown in FIG. 53 may be replaced by other logic and or circuitry without departing from the teachings of the present invention.

Figure 54:
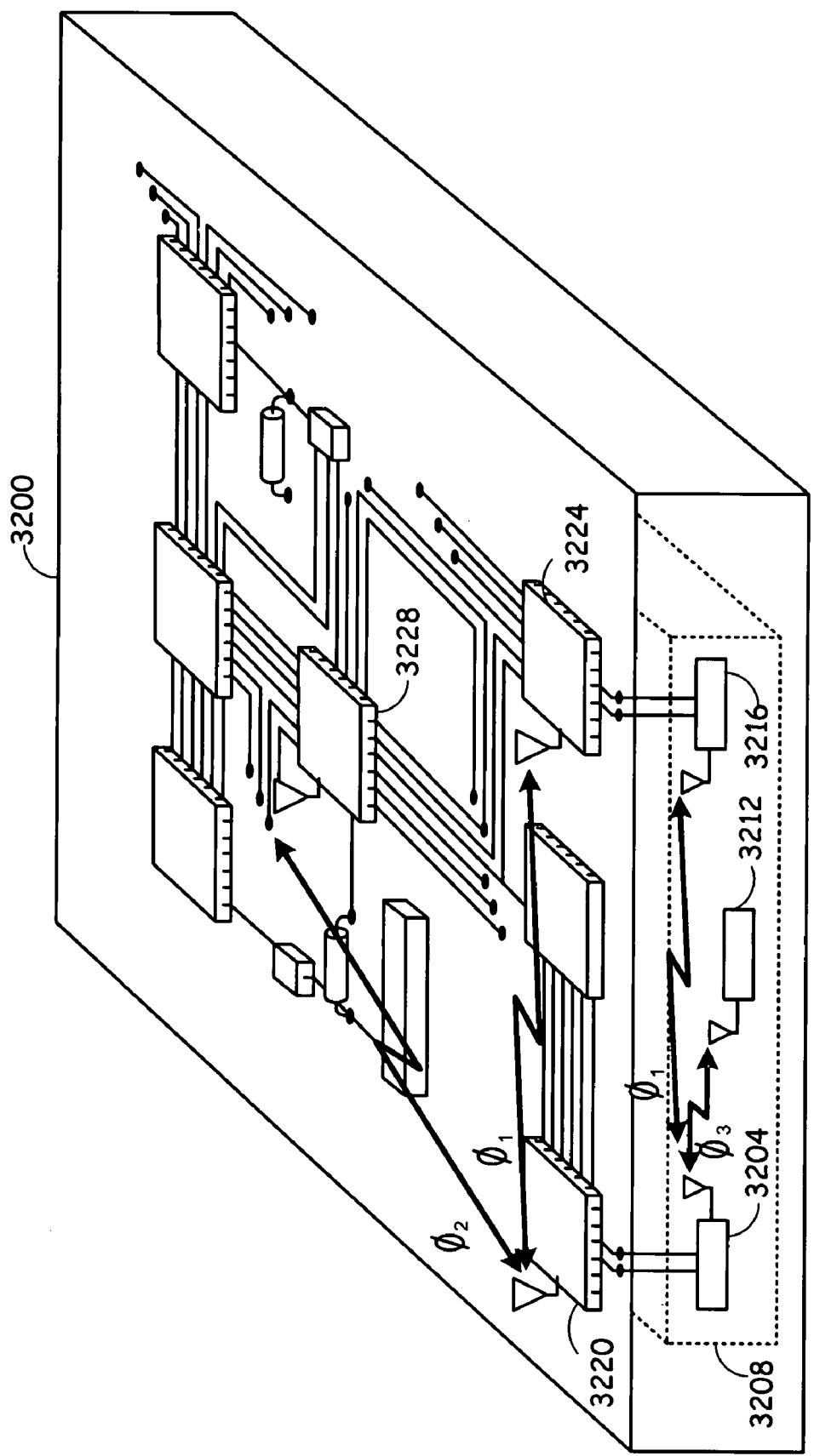
FIG. 54 is a functional block diagram of a radio transceiver module that includes a plurality of local intra-device transceivers (over the air transmitters and substrate transmitters) operable to conduct directional transmissions according to one embodiment of the invention.

FIG. 54 is a functional block diagram of a radio transceiver module that includes a plurality of local intra-device transceivers (over the air transmitters and substrate transmitters) operable to conduct directional transmissions according to one embodiment of the invention. As may be seen, a radio transceiver module 3200 includes a substrate transmitter 3204 that is operable to transmit a directed radio frequency electromagnetic beam through substrate 3208 to receivers 3212 and 3216 at angles $\Phi_1$ and $\Phi_2$ using beam forming techniques. More specifically, transmitter 3208 includes logic and circuitry operable to create constructive and destructive interference patterns to direct a transmission at a specified angle to a target receiver. Here, the target receivers for the directed transmissions are receivers 3212 and 3216.

While only one antenna is shown for transmitter 3204, the described embodiment includes two orthogonal dipole antennas that each produce an outgoing transmission whose electromagnetic radiations constructively or destructively add to create a pattern of peaks and nulls in specified locations to beam form an outgoing signal to a target receiver. In the described embodiment, each receiver also has a pair of orthogonal dipole antennas to help with receiving a signal and for transmissions for transmitter operations from transmitter circuitry that is not shown here in FIG. 54.

Similar to the transmissions shown within substrate 3208, a transmitter 3220 is operable to direct transmissions in air to receivers 3224 and 3228. The antennas of transmitter 3220 and receivers 3224-3228 are each a pair of dipole antennas orthogonal to each other in the described embodiment of the invention. In the example shown, transmitter 3220 is operable to generate constructive electromagnetic radiations towards receiver 3224 and angle $\Phi_1$ and to receiver 3228 and angle $\Phi_3$. Such operations that result in constructive and destructive signal combining at specified points is generally referred to herein as beamforming.

In operation, transmitters 3204 and 3220 are operable to use beam forming techniques to focus an outgoing RF signal to a given point and to diffuse the RF signal at a different point. As such, the beam forming techniques may be utilized to avoid communication collisions for transmissions overlapping in time at frequencies that may interfere with each other. For example, transmitter 3220 may use the same frequency for communications with receivers 3224 and 3228 by spatially diversifying the transmissions using beam forming techniques.

Figure 55:
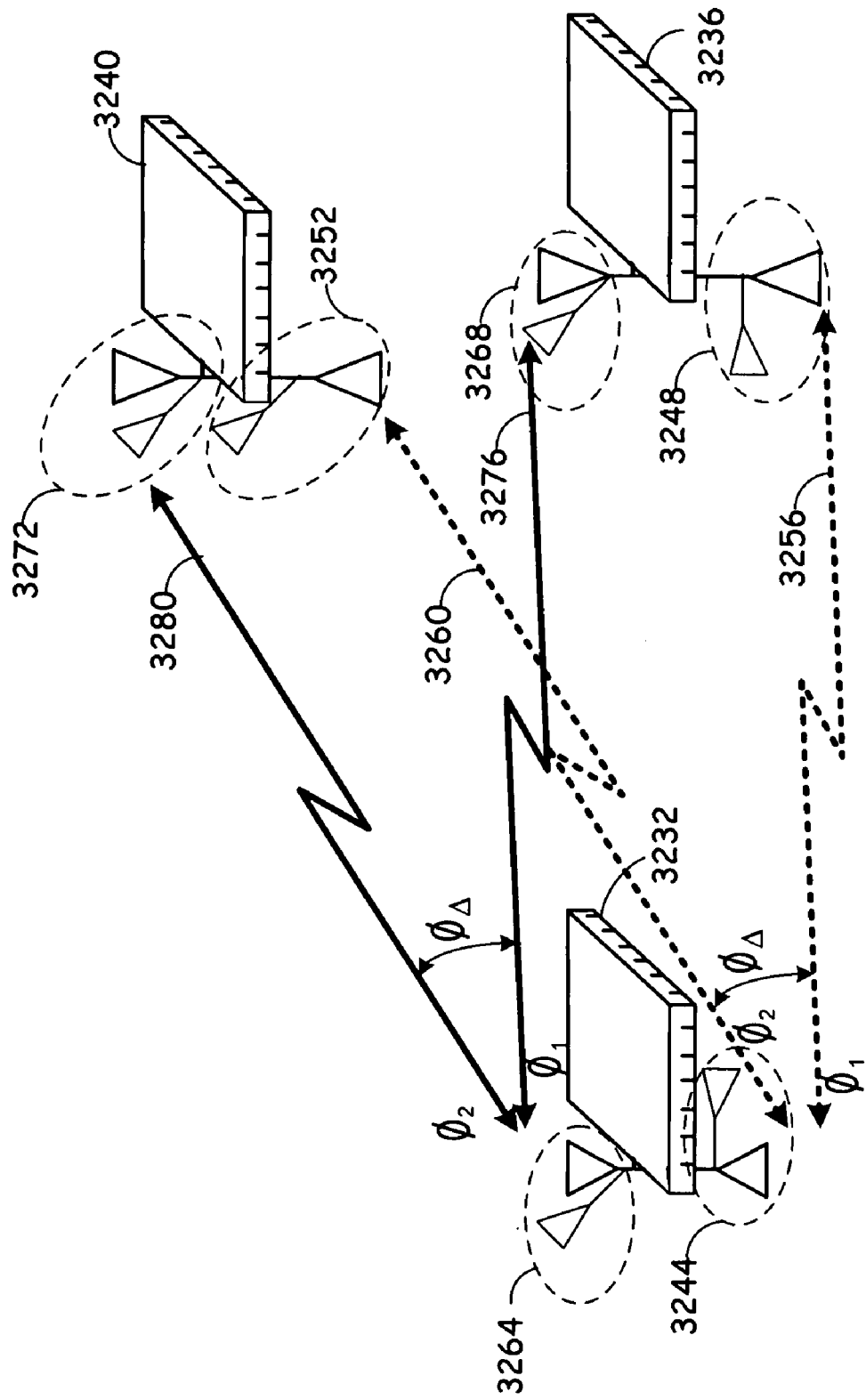
FIG. 55 is a functional block diagram of an alternate embodiment of the transceivers of FIG. 54 in which the substrate and other components thereon are not shown for the purpose of clarifying the alternate embodiment structure.

FIG. 55 is a functional block diagram of an alternate embodiment of the transceivers of FIG. 54 in which the substrate and other components thereon are not shown for the purpose of clarifying the alternate embodiment structure. Here, local intra-device transceivers 3232, 3236 and 3240 are shown wherein each transceiver is operable coupled to a pair of antennas for substrate communications and to a pair of antennas for in-air communications. More specifically, transceivers 3232-3240 are coupled to multi-component antenna 3244-3252, respectively for substrate communications. Each multi-component antenna 3244-3252 comprises two orthogonal dipole antennas in one embodiment of the invention to provide orthogonal radiation patterns. As such, by controlling the phase of the signals transmitted from each multi-component antenna 3244-3252, a constructive/destructive interference pattern may be created to effective direct a transmission beam at a specified angle (e.g., relative to boresight) to a targeted receiver antenna.

For example, if a first signal component transmitted by a first dipole antenna of multi-component antenna 3244-3252 is characterized by $\cos(\omega_{RF}(t)-\theta_1)$ while the second component transmitted by a second dipole antenna of multi-component antenna 3244-3252 is characterized by $\sin(\omega_{RF}(t)+\theta_2)$, a combined or beam formed signal would be represented by the sum of these two signal components, namely, $\cos(\omega_{RF}(t)-\theta_1)+\sin(\omega_{RF}(t)+\theta_2)$. In this characterization, $\omega_{RF}(t)$, $\theta_1$ and $\theta_2$ represent the frequency of the first and second components of the transmission signal and the phases of the first and second components, respectively, of the multi-component signal.

The values of $\omega_{RF}(t)$, $\theta_1$ and $\theta_2$ therefore affect the constructive and destructive interference pattern (i.e., the beam formed transmission signal angle). Stated differently, these parameters change the angles of the nulls and peaks in a transmission pattern. As such, referring back to FIG. 55, $\Phi_1$, $\Phi_2$ and $\Delta\Phi$ are based upon the combined directional signal resulting from the sum of the components of the multi-component transmission signal as described above.

In operation, each transceiver such as transceiver 3232, for example, is operable to produce multi-component signals to each dipole antenna of multi-component antenna 3244 wherein each component is characterized by a specified phase. A resulting constructive radiation pattern then results in a radiation beam directed to a target transceiver antenna operating as a receiver. For example, specified phases are selected to generate a beam 3256 from antenna 3244 and an angle $\Phi_1$ or beam 3260 and angle $\Phi_2$.

The structure and operation for in-air transmissions is similar. Transceivers 3232-3240 are also operable to communicate by way of multi-component antennas 3264-3272, respectively. For example, transceiver 3232 is operable to generate a beam formed transmission 3276 at angle $\Phi_1$ and beam formed transmission 3280 at angle $\Phi_2$ to transceivers 3236 and 3240, respectively.

Figure 56:
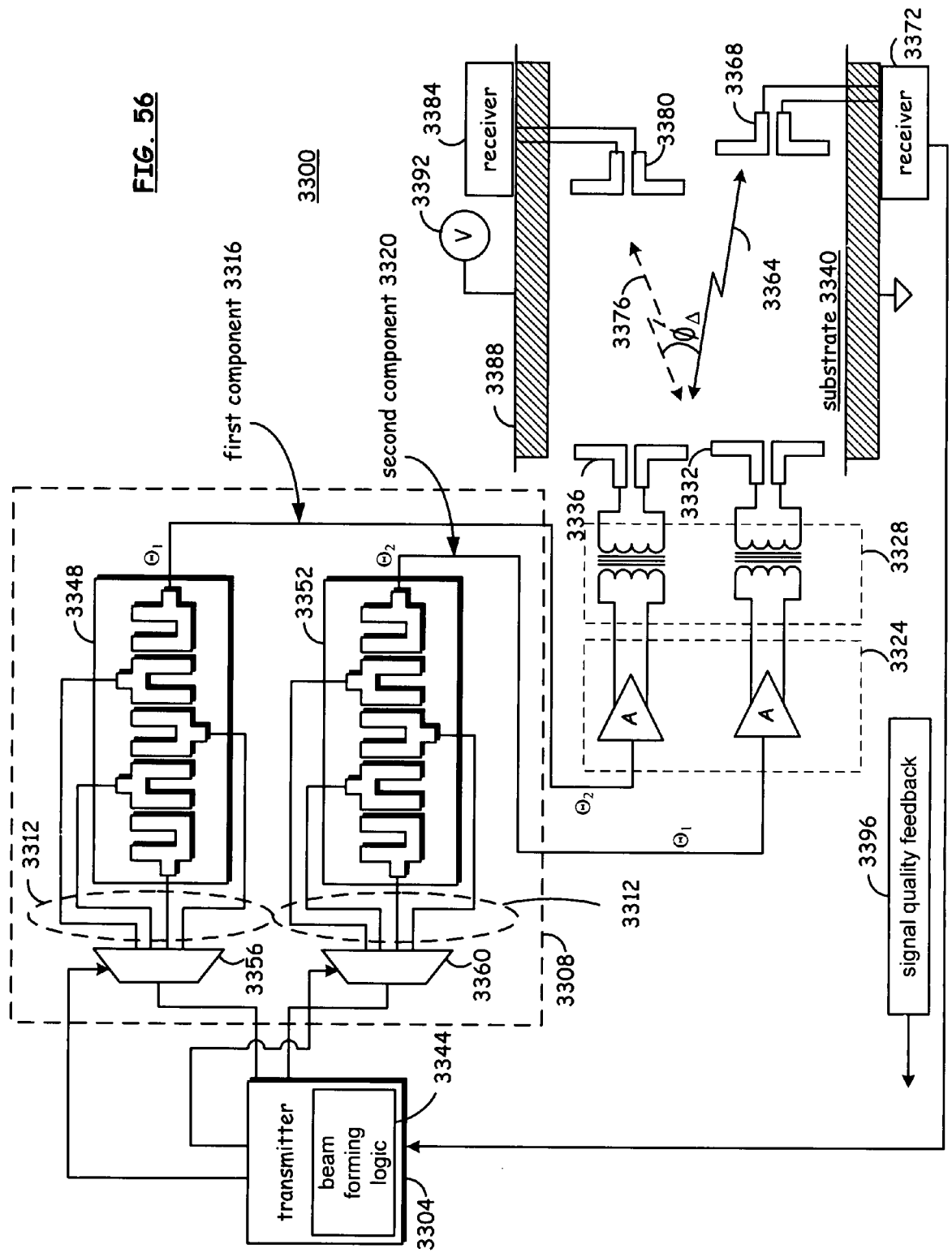
FIG. 56 is a functional schematic block diagram of a transceiver module according to one embodiment of the invention that illustrates use of multi-tap point micro-filters for a multi-component signal to create desired constructive and destructive interference patterns.

FIG. 56 is a functional schematic block diagram of a transceiver module according to one embodiment of the invention that illustrates use of multi-tap point micro-filters for a multi-component signal to create desired constructive and destructive interference patterns. A first substrate transmitter is operable to produce a multi-component outgoing signal for transmission through a dielectric substrate. The transceiver module 3300 of FIG. 56 includes a substrate transmitter 3304 that is operably disposed to produce the outgoing signal on a plurality of outgoing circuit paths to a micro-strip resonator filter module 3308. The micro-strip resonator filter module 3308 is operable to produce a filtered signal having a first phase based upon a selected tap point of a plurality of selectable tap points 3312. Generally, filter module 3308 comprises plurality of resonators arranged to be electrically and magnetically coupled. As discussed previously, the arrangement and sizing of the micro-strips within module 3308 affects whether a response for a selected tap point is more electrical or electromagnetic.

Filter module 3308 produces first filtered component 3316 of an outgoing signal having a first phase value (shown as $\Theta_1$ in FIG. 56). When transmitted with the second component 3320 having a second phase value (shown as $\Theta_2$), a combined outgoing signal including first and second electromagnetic signal components defines a pattern of constructive and destructive interference that further forms a constructive or combined peak at a desired receiver. The pattern is based upon phase differences in the first and second filtered components 3316-3320 of the outgoing signal. In the described embodiment, the first and second filtered components are transmitted from orthogonal antennas.

An amplifier module 3324 is operably disposed to receive the filtered first and second components 3316 and 3320 produced by the micro-strip filter module 3308 to a transformer module 3328 which is operable to deliver an isolated outgoing radio frequency multi-component signal to a first substrate antenna 3328. First substrate antenna is a multi-component antenna comprising antennas 3332 and 3336 wherein each component antenna is a dipole antenna. In one embodiment, antennas 3332 and 3336 are each arranged to be orthogonal in orientation in relation to each other. Each antenna, in one embodiment, is a dipole antenna operably sized to radiate the amplifier output through the dielectric substrate. The first and second substrate receivers are communicatively coupled to second and third substrate antennas that have similar structure and are operably disposed to receive radio frequency communication signals through the dielectric substrate 3340.

The transceiver module of FIG. 56 further includes beam forming logic 3344 operable to control the phase and relative amplitude of the signal radiated from the first substrate antenna 3328 (orthogonal antennas 3332 and 3336) by selecting a specified tap point of a first micro-strip resonator filter 3348 of micro-strip filter module 3308 to create a pattern of constructive and destructive interference to operably direct a signal to a specified receiver antenna.

The radio transceiver module of claim 1 further includes a second micro-strip resonator filter 3352 operable to produce a signal having a second phase based upon the second component to the second input of the amplifier module 3324. A phase combined output signal transmitted by the multi-component first substrate antenna 3328 (comprising antennas 3332 and 3336) has a magnitude at a specified phase based upon the first and second phases of the signals produced by the first and second micro-strip resonator filters 3348 and 3352 of filter module 3308.

The resonant frequency of the first and second micro-strip resonator filters 3348 and 3352 is approximately equal to a desired transmission frequency for transmissions through the wave guide and is at least 20 GHz. In one embodiment, the resonant frequency of the micro-strip resonator filters 3348 and 3352 is in the range of 25-30 GHz or 55-65 GHz.

A standing wave for transmissions between the first substrate antenna and the second substrate antenna (antenna of targeted receiver) is generated at least in part by the first multi-component component being produced to a first selectable tap point of the first micro-strip resonator filter 3328 to provide a band pass filtered response for RF transmissions having a first frequency. A beam formed output signal produced by the amplifier and radiated by the first substrate antenna 3328 therefore results in the combined output signal being directed towards the second substrate antenna based upon the constructive radiation patterns of the signals produced by antennas 3332 and 3336.

The effective beam angle created by the summation of the constructive radiation patterns is a based upon the phases of the components of the multi-components signal which, in turn, is based upon the selected tap points of the micro-strip filter module 3308. Generally, a standing wave for transmissions between the first substrate antenna and a third substrate antenna, for example, may be generated at least in part by the first and/or second multi-component components being produced to a second and/or a third selectable tap point of the micro-strip resonator filter 3348 or 3352 or both to provide a filtered response for first and second components with specified phase shifts to create a combined signal that creates a constructive interference pattern directed towards the third substrate antenna.

In the described embodiment, the first, second and third substrate antennas are operably sized to communicatively couple with the substrate region. The micro-strip resonator filter module comprises a plurality of resonators arranged to be electrically and magnetically coupled wherein selection of corresponding tap points operably changes at least one of a resonant frequency of the micro-strip resonator filter and a phase of a signal being propagated through the first micro-strip resonator filter.

The micro-strip resonator filter comprises a plurality of resonator elements that have a defined filter response based upon separation distances between the plurality of resonators operably coupled between a selected tap point and an output of the micro-strip resonator filter. The defined filter response is also based upon width, length and shape of the resonators. Thus, the selected tap point is one that selects a specified combination of resonator elements that correspond to whether transmissions are intended to be received by the second or third substrate transceivers within the dielectric substrate wave guide.

The radio transceiver module includes, in one embodiment, a digital processor operable to generate digital data and a radio front end transmitter operable to generate continuous waveform transmission signals characterized by a frequency that is at least 20 GHz and that is substantially equal to a resonant frequency of the micro-strip resonator filter and having a wave length that creates a standing wave between the first and second antennas. The transceiver module, for example, one similar to that shown in FIG. 2, includes switching logic 3356 and 3360 as shown in FIG. 56, that is operably disposed to couple the plurality of selectable tap points 3312 to an associated radio front end. For example, the switching logic 3356/3360 may be coupled to the transceiver of FIG. 2 that is formed, for example, within transmitter 3304 in FIG. 56. In the described embodiment, the transmitter module 3304 (based upon logic 3344) is operable to produce control signals to the switching logic 3356 and/or 3360 to select a band pass filter response within the micro-strip resonant filter that will pass the continuous waveform transmission signals at the frequency of the continuous waveform transmission signals produced by the radio front end with the peak magnitude at the first phase.

In operation, transmitter 3304 generates control signals to switching logic 3356 and 3360 as necessary to select tap points of micro-filter module 3308 to result in a beam formed transmission 3364 from antennas 3332 and 3336 towards antenna 3368 operably coupled to receiver 3372. By selecting at least one new (different) tap point, a beam formed transmission 3376 may be directed to antenna 3380 of receiver 3384. By selecting a new tap point, an output signal filter response corresponds to a desired transmission frequency characterized by a peak magnitude and a second phase to create a directed transmission signal from the first antenna (antenna pair comprising dipole antennas 3332 and 3336) to the third antenna 3380. While shown as only one antenna, it should be understood that one embodiment of antenna 3380 comprises a pair of antennas similar to antennas 3332 and 3336.

It should also be understood that antennas 3332 and 3336 are orthogonal to each other though FIG. 56 does illustrate such arrangement. Further, antennas 3332, 3336, 3368 and 3380 comprise ¼ wavelength dipole antennas that are operably sized to communicate through substrate 3340 at a frequency of at least 20 GHz. In one embodiment, substrate 3340 is formed to operate as a dielectric substrate wave guide characterized by a resonant frequency that is substantially similar to a transmission frequency of the electromagnetic signals 3364 and 3376 being transmitted through substrate 3340.

The dielectric substrate 3340 may be formed within an integrated circuit die or within a supporting board. In an embodiment wherein substrate 3340 is formed within a supporting board, the supporting board may be any supporting structure operable to support circuitry including integrated circuits. In one embodiment, the supporting substrate comprises a printed circuit board. In another embodiment, the supporting board may be a board that merely provides a structure to hold a plurality of integrated circuits and to provide a minimal amounts of supporting traces. For example, power may be delivered through a supporting trace within the supporting board.

One additional aspect of the embodiment of FIG. 56 is that the dielectric properties of substrate 3340 may be changed by applying a specified electromagnetic field through substrate 3340 by a field generator 3388 that is controlled by voltage source 3392 as described in various embodiment within this specification. Further, a targeted receiver is operable to transmit a signal quality feedback signal 3396 either through a wired connection or wirelessly (e.g., in a back scatter transmission or in a dedicated signal transmitted within a control channel). The transmitter, e.g., transmitter 3304, then is operable to adjust its transmission frequency, change the relative phases of the components of the multi-component signal or the dielectric properties by changing the field strength of the electromagnetic field transmitted through substrate 3340 in an iterative manner to improve the delivered signal quality of signal 3364 or 3376 to the corresponding antenna 3368 or 3380.

FIG. 57 is a table that illustrates operation according to one embodiment of the invention. As may be seen, the table specifies for a targeted receiver antenna (column 3400), a specified tap point for a first micro-filter (column 3404), a specified tap point for a second micro-filter (column 3408), a transmission frequency (column 3412) and a voltage setting for generating an electro-magnetic filed (column 3416). Thus, the table illustrates the parameters that are controlled and changed by a transmitter according to which receiver is being targeted for a (transmission. The selection of the tap points of columns 3404 and 3408 thus results in constructive and destructive interference patterns that result from transmissions from a pair of antennas (that are orthogonal in the described embodiment) to effectively direct a transmission towards the targeted antenna and associated receiver.

Column 3412 further illustrates an optional aspect of the embodiment of the invention in which a specified frequency of a generated signal is specified. Because the beam formed signal is directional, however, a type of spatial filtering results in which the same frequency may be used for transmissions for two different receivers. Thus, frequency diversity is not necessarily required. Finally, as may be seen, another optional aspect is that an electromagnetic field may be generated to affect the dielectric properties of a substrate (if the transmission is being conducted through a substrate) to change a wavelength of the signal to create a standing wave at the targeted antenna.

Based upon a feedback signal, a transmitter is operable to adjust the transmission frequency, the phase of the transmitted signal, the voltage setting for the electric field or even the selected tap point in an iterative manner based upon the feedback signal to determine settings that produce an acceptable signal quality. Other parameters such a transmission power which are not shown in FIG. 57 may also be adjusted to improve signal quality.

FIG. 58 is a flow chart that illustrates a method for transmitting a beam formed signal according to one embodiment of the invention. The method includes generating a very high frequency radio frequency (RF) signal having a specified frequency of at least 20 GHz (step 3450). In one embodiment, the specified frequency is in the rage of 25 GHz-30 GHz or 55 GHz-65 GHz. Thereafter, the method includes producing the very high RF signal as a differential signal to a dual input micro-filter module (step 3454). The method also includes selecting a tap point having a desired filter response to adjust a phase of the at least one leg of the differential signal to create a beam formed signal in a specified direction (step 3458).

Thereafter, the method includes transmitting the very high RF electromagnetic signals though a dielectric substrate from each of two portions of a dipole antenna to create a beam formed signal aimed to a target receiver antenna (step 3462). Finally, the method includes creating a standing wave within the wave guide at a substrate antenna operably coupled to a receiver for which a signal is being transmitted (step 3466). This step may include adjusting selectable transmission characteristics and/or dielectric properties to create the standing wave at the targeted antenna.

Figure 59:
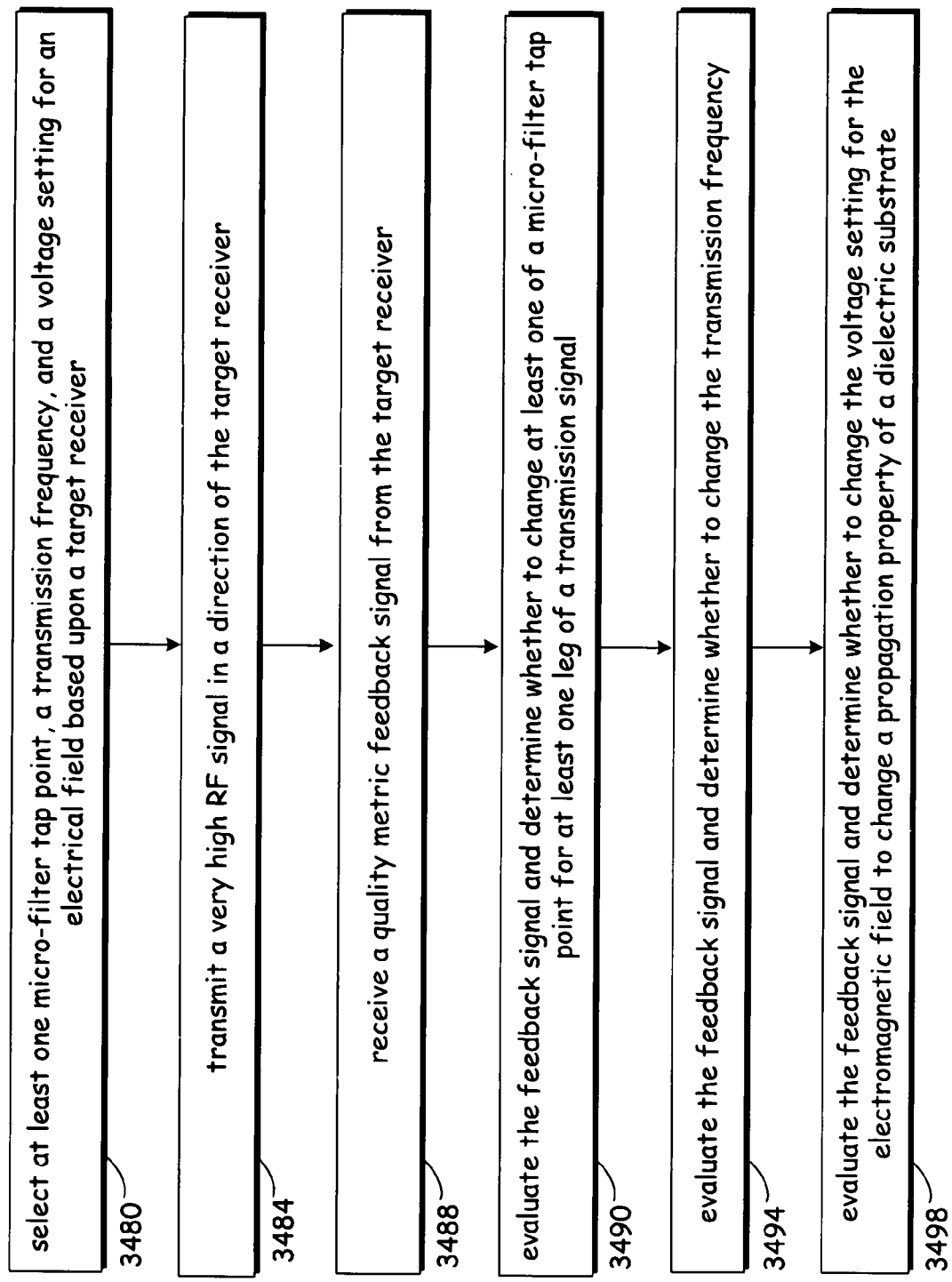
FIG. 59 is a flow chart illustrating a method of beam forming according to an alternate embodiment of the invention.

FIG. 59 is a flow chart illustrating a method of beam forming according to an alternate embodiment of the invention. The method includes initially selecting at least one micro-filter tap point, a transmission frequency, and a voltage setting for an electrical field based upon a target receiver (step 3480). The method further includes transmitting a very high RF signal in a direction of the target receiver (step 3484) and receiving a quality metric feedback signal from the target receiver (step 3488). The quality metric can be any known metric. In one embodiment, one of a bit error rate, a signal-to-noise ratio, or a signal quality rating are used.

The feedback signal is transmitted in a dedicated control signal on a control channel in one embodiment. More generally, the feedback signal is transmitted in a specified time slot from the receiver to the transmitter. Alternatively, the feedback signal may be transmitted using Rx channel backscatter transmission techniques. Generally, a received signal may be reflected back to the transmitter in a specified manner to provide an indication of signal quality. In yet another embodiment in which the transmission is through a dielectric substrate wave guide, the transmitter is operable to evaluate a signal naturally reflected within the wave guide instead of receiving and evaluating a feedback signal to determine whether adjustments to the transmitted signal are necessary.

The method also includes evaluating the feedback signal and determine whether to change at least one of a micro-filter tap point for at least one leg of a transmission signal (step 3490), the transmission frequency (step 3494), or the voltage setting for the electromagnetic field to change a propagation property of a dielectric substrate (step 3498). Each of these changes are optional and are not all necessarily required. Other changes such as changing a phase of the transmission signal produced by the transmitter or a transmission power level may be made to improve signal quality for the targeted receiver.

Figure 60:
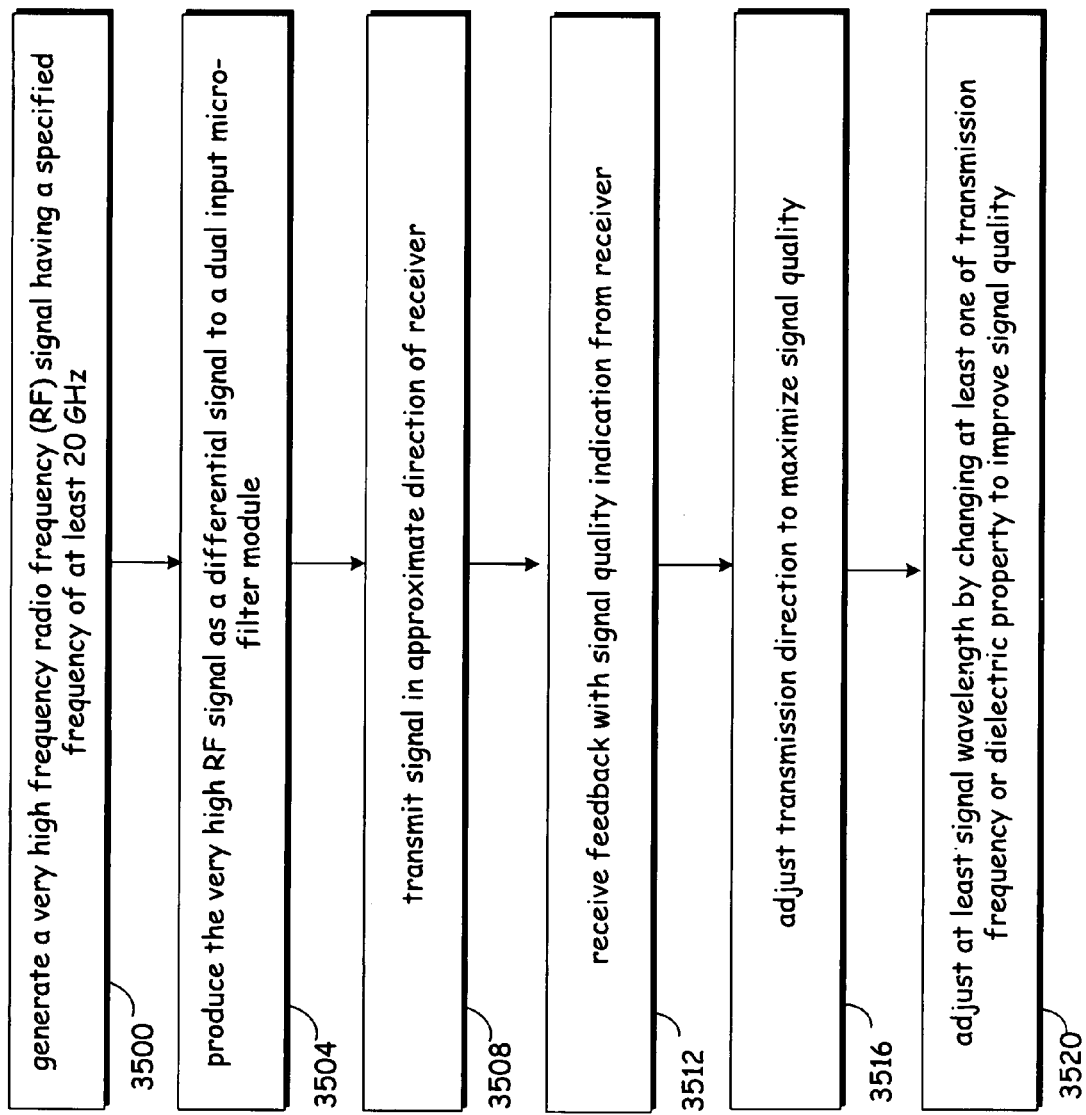
FIG. 60 is a flow chart that illustrates aspects transmitting a beam formed signal according to one embodiment of the invention.

FIG. 60 is a flow chart that illustrates aspects transmitting a beam formed signal according to one embodiment of the invention. As described in relation to FIGS. 58 and 59, the method includes generating (step 3500) and producing (step 3504) a very high RF signal to a dual input micro-filter module to create a beam formed signal that is transmitted in an approximate direction of a targeted antenna of a receiver (step 3508) and receiving feedback from the receiver (step 3512). Thereafter, the method includes adjusting the transmission direction to maximize signal quality (step 3516). The transmission direction may be adjusted by selecting a new tap point or by changing a transmission signal phase produced from the transmitter of a least one component of the multi-component signal. The signal quality may also be improved by adjusting the signal wavelength by changing at least one of the transmission frequency or dielectric property for transmissions through a dielectric substrate (step 3520).

FIGS. 61 and 62 are functional block diagrams of a transmitter operable to generate directional beam formed signals and that illustrate operation according to one embodiment of the invention. Referring to FIG. 61, a transmitter 3550 produces a multi-component signal having a specified frequency and a specified phase $\Theta$ on each of a plurality of signal paths 3554 and 3558. While the frequency of the multi-component signal is required to be the same one each path 3554 and 3558, the phase is not necessary required to be the same. The frequency of the multi-component signal is approximately equal to a center frequency of a filter response of micro-filter module 3562 which is operably disposed to receive the signals produced on paths 3554 and 3558. In an embodiment in which micro-filter module includes a plurality of micro-strip resonators arranged and formed to provide a band pass filter response, the frequency of the signals produced by transmitter 3550 is approximately equal to the resonant frequency of the resonators within micro-filter module 3562.

Based upon a selected path or tap point to which the multi-component signals are produced of micro-filter module 3562, each signal component is produced with a phase shift that is not necessarily equal. More specifically, filter 3562 produces a signal component with a phase shift represented by $\Theta+\Delta_1$ on signal path 3566 and a signal component with a phase shift represented by $\Theta+\Delta_2$ on signal path 3570. Micro-filter module 3562 produces the multi-component signals to amplifier 3574. The amplified components of the multi-component signal are then radiated from multi-component antenna 3578 which, in the described embodiment, comprises orthogonal dipole antennas. Based upon the phase values $\Delta_1$ and $\Delta_2$, a constructive interference pattern is generated that creates a combined beam formed signal that provides a constructive peak in a beam formed signal 3582 in a direction from antenna 3578 to receiver 3586. By changes one or more of the phase values of $\Delta_1$ and $\Delta_2$, a beam formed signal 3590 may be formed in a direction of receiver 3594. As may further be seen, receiver 3586 is operable to provide a signal quality indication on a feedback path 3598. Transmitter 3550 is operable to adjust the signal quality at receiver 3586 in an iterative manner by adjusting at least one of the multi-component signal characteristics including output phase or by adjusting the filter response of micro-filter module 3562 by selecting at least one different tap point based upon the signal quality indication to attempt to improve the signal quality at receiver 3586.

In operation in the described embodiment of FIGS. 61 and 62, transmitter 3550 initially produces a multi-component signal on paths 3554 and 3558 that each have a phase of $\Theta$. Micro-filter module then produces a signal component with a phase shift of $\Theta+\Delta_1$ on signal path 3566 and signal component with a phase shift of $\Theta+\Delta_2$ on signal path 3570. Based upon the signal quality indication received on feedback path 3598, however, transmitter introduces an additional phase shift represented by $\Theta+\Delta_3$ on signal path 3558. Thus, if the tap points are not changed for micro-filter module 3562, module 3562 produces a signal having a phase shift of $\Theta+\Delta_2+\Delta_3$ on signal path 3570. If the tap point is changed for the signal received on signal path 3558, then the output of module 3562 is equal to one of $\Theta+\Delta_2+\Delta_3+\Delta_4$ or $\Theta+\Delta_3+\Delta_5$ on signal path 3570. $\Delta_2$ represents the original phase shift introduced by module 3562 to the signal received on path 3558, $\Delta_3$ represents an additional phase shift subsequently introduced by transmitter 3550, and $\Delta_4$ represents an additional phase shift introduced by producing the signal on path 3558 to a new tap point that creates a signal path that includes the resonator(s) within module 3562 that generated phase shift $\Delta_2$. $\Delta_5$ represents a new phase shift introduced by module 3562 to the signal received on path 3558. $\Delta_5$ may be equal in value or may be different in value from the sum of phase shifts $\Delta_2+\Delta_4$. $\Delta_5$, for example, may result from selection of a tap point that is down stream of the initial tap point that introduced phase shift $\Delta_2$.

As may be seen, signal 3582 in FIG. 61 is not aimed directly at the antenna of receiver 3586 to suggest that a peak value of the constructive interference forming the beam formed signal is aimed at a slightly different direction. By adding a slight phase shift in at least one of the signal components produced by transmitter 3550, however, the direction of the beam formed signal (constructive interference peak direction) is adjusted to result in a peak combined signal being directed to the antenna of receiver 3586 as shown in FIG. 62.

It should be understood that transmitter 3550 may initially produce signal components have different phase values for Θ (e.g., Θ1 and Θ2 for signal paths 3554 and 3558, respectively. The signal components may then have their phases adjusted as described above.

As another aspect of the embodiment of the present invention, the transmitter is operable to transmit the different RF signals through each of the pair of antenna components wherein the transmitter is operable to generate transmission signals and to select tap points to result in each antenna component radiating a signal that is 90 degrees out of phase in relation to the other.

Thus, the transmitter is operable to generate different information to each antenna component to allow each antenna component to radiate a signal to be received by different target receivers with minimal interference. For this approach, however, each receiver antenna is required to be in a location relative to the transmitting antenna that does not require signal combining to form a beam formed signal in a specified direction for the receiver to receive the radiated signal.

Figure 63:
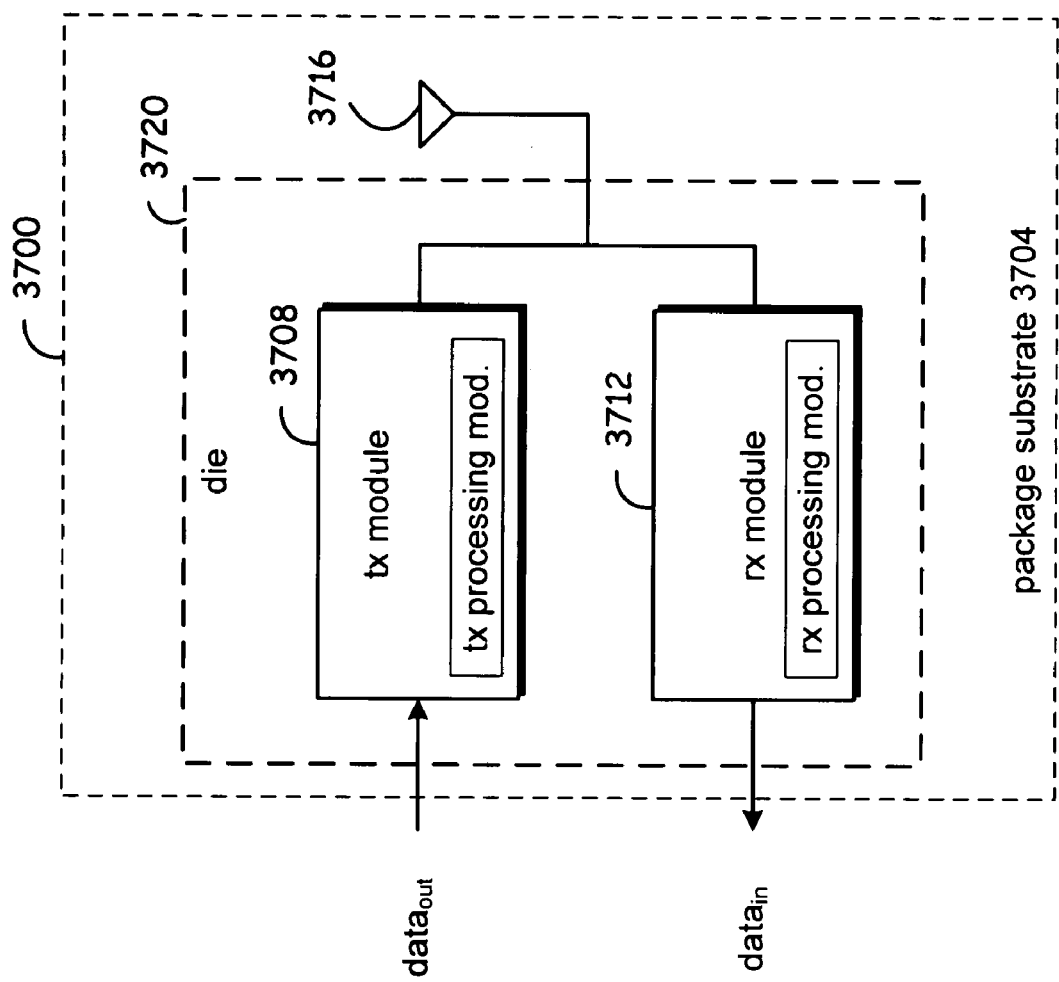
FIG. 63 is a functional block diagram of an integrated circuit transceiver according to one embodiment of the invention.

FIG. 63 is a functional block diagram of an integrated circuit transceiver according to one embodiment of the invention. A transceiver module 3700 includes a package substrate 3704 that further includes a transmit module 3708 for generating outgoing digital signals characterized by a sample rate and a receive module 3712 for receiving wirelessly transmitted ingoing digital signals characterized by the sample rate. The transceiver module 3700 further includes an antenna 3716 operably disposed to receive the ingoing digital signals and to wirelessly transmit the outgoing digital signals. As may further be seen, the transmit module 3708 and the receive module 3712 are formed on the same die 3720 which is formed on substrate 3704. Antenna 3716 also is formed on packaged substrate 3704.

Transmit module 3708 is operable to produce outgoing digital signals that include at least one of error correction, scrambling, interleaving, encoding, and QPSK or higher order constellation mapping for transmissions to specified destinations in which error correction is typically utilized to facilitate successful transmission of the wireless communication signals. For transmissions to local intra-device transceivers including substrate transceivers, in one embodiment of the invention, transmit module 3708 is operable to produce an upsampled digital data stream without error correction for transmission from the antenna. This upsampled digital data stream is upsampled to have a sample rate that substantially matches a frequency for which antenna 3716 was designed to transmit and receive. For example, in one embodiment, the digital data pulses are upsampled to have a sample rate that is equal to or greater than 20 GHz. In one specific embodiment, the digital data is upsampled to have to have a sample rate that is approximately equal to 60 GHz.

In one embodiment, the transmit module 3708 is operable to modulate the phase of the outgoing digital data to increase a data rate. For example, by merely transmitting a signal with one of two phase values, two bits of data may be transmitted with a single upsampled pulse. In another embodiment, the transmit module is operable modulate the phase to one of four or more phase values of the outgoing digital data to increase a data rate. Another embodiment of transceiver module 3700 includes a transmit module 3708 that is operable to modulate an amplitude of the outgoing digital data to increase a data rate.

In summary, FIG. 63 illustrates one aspect of the embodiments of the invention in which a radio transceiver module is fully formed within a single packaged substrate. The transmit and receive modules are further wholly formed on a single die of the packaged substrate. Additionally, the format of the transmitted signals may be any known structure including Cartesian or Polar coordinate systems. Further, depending on destination, the transmitted signals may be continuous waveform (analog) or digital pulses having a very high sample rate. Whether digital data pulses are modified with error correction techniques or merely up-sampled also is based upon the target destination in some embodiments of the invention. For very short distance wireless transmissions within a device or even within the packaged substrate, digital pulses or continuous waveform signals may be transmitted without error correction if the sample rate is sufficiently high to allow transmission from an antenna sized for specified frequency signals (e.g., at least 20 GHz, in the range of 50-60 GHz, etc.).

Figure 64:
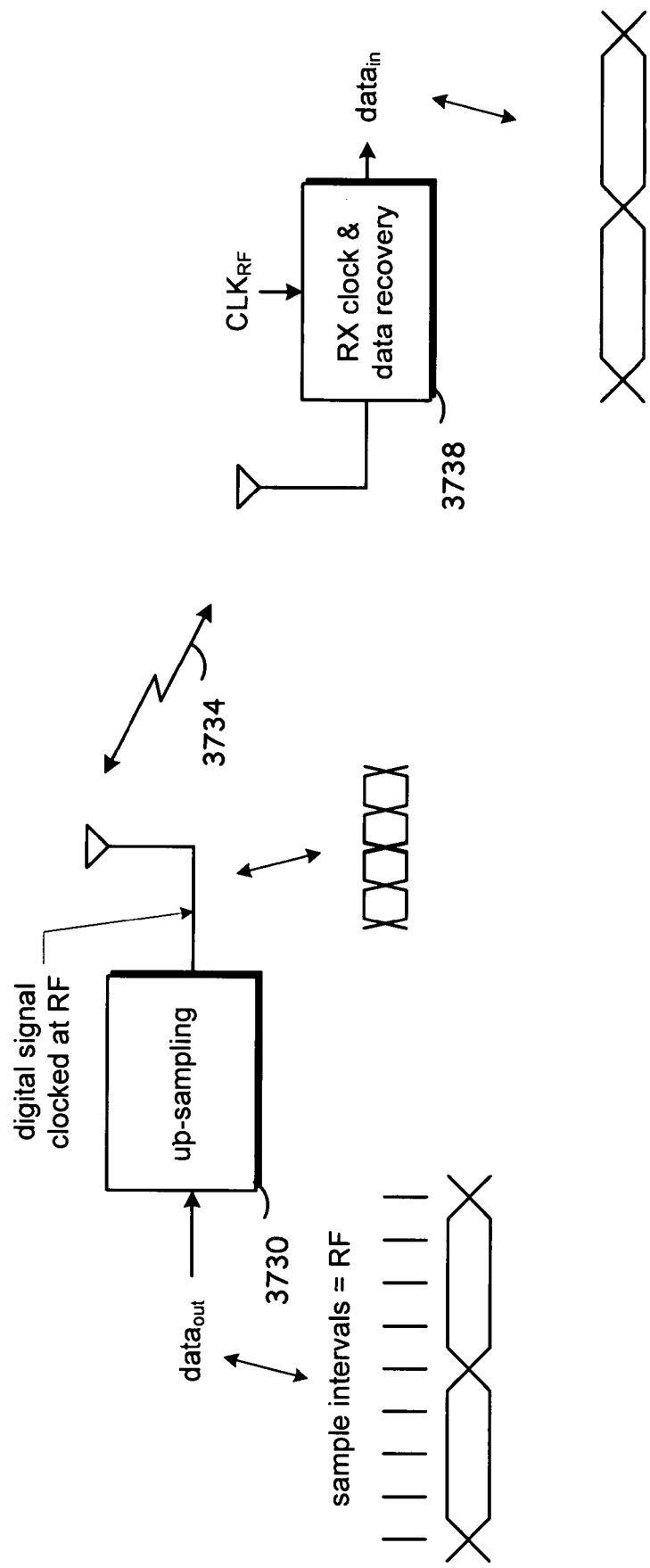
FIG. 64 is a functional block diagram of a transmit processing module in wireless communication with a clock and data receiver module to illustrate operation according to one embodiment of the invention.

FIG. 64 is a functional block diagram of a transmit processing module in wireless communication with a clock and data receiver module to illustrate operation according to one embodiment of the invention. As may be seen, transmit processing module 3730 transmits a signal 3734 to a receive processing module 3738. Transmit process module is operable to receive outgoing digital data and to upsample the outgoing digital data at a clock rate that substantially matches a desired transmission frequency. As may be seen, the sample rate is shown, for exemplary purposes, in relation to the outgoing data pulses. Accordingly, a digital signal clocked at RF is shown being produced directly from transmit processing module 3730 to an antenna for transmission. The antenna is one that is sized according to a specified radio frequency (e.g, one half or one quarter of the wavelength of the signal having a specified radio frequency). A receive module 3738 includes rx clock and data recovery circuitry that is coupled to a similar antenna and is operable to produce extracted data pulses as shown.

The up-sampling may be performed with digital logic including sample and hold logic, sample rate conversion logic, or any other known technique of upsampling a digital signal. Similarly, the receive module 3738 may include any known decimation logic to reduce the sample rate of the received and recovered digital pulses to recreate the ingoing digital data which reflects that information of the outgoing digital data.

Figure 65:
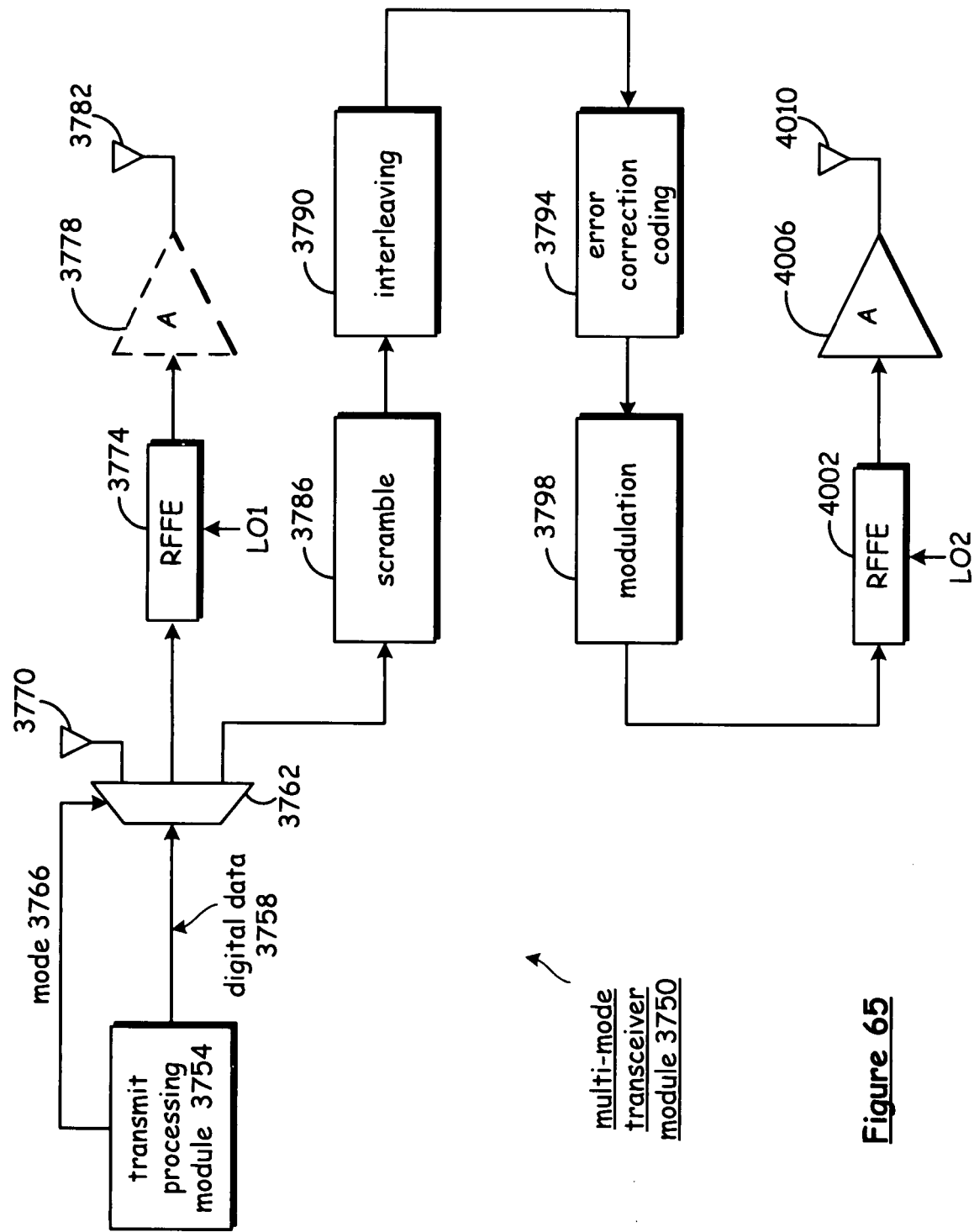
FIG. 65 is a functional block diagram of a multi-mode transceiver according to one embodiment of the invention in which a signal form is based upon a destination.

FIG. 65 is a functional block diagram of a multi-mode transceiver according to one embodiment of the invention in which a signal form is based upon a destination. A multi-mode transceiver module 3750 includes a transmit processing module 3754 that is operable to produce digital data 3758 to switching logic 3762. Transmit processing module 3754 also produces a mode signal to switching logic 3762 to prompt switching logic 2762 to produce the digital data 3758 either directly to antenna 3770 for a first mode, to radio frequency front end 3774 for a second mode, and to scramble module 3786 for a third mode.

Digital data 3758, in the described embodiment, has a specified sample rate that may be adjusted also according to the mode. For example, for first mode transmissions, digital data 3758 has a sample rate that matches a specified radio frequency greater than or equal to 20 GHz. For second mode transmissions, the sample rate of the digital rate may be equal to a data clock rate (one sample per bit of data), a higher intermediate frequency sample rate or a radio frequency sample rate. Radio frequency front end 3774 is further coupled to receive a first local oscillation (LO1) and produces a continuous waveform radio frequency signal at a specified frequency. For example, the output signal may have a frequency in the range of 50-60 GHz in one embodiment. The frequency of the local oscillation LO1 depends upon the specified sample rate that is produced by transmit processing module 3754 for second mode communications so that the final RF frequency is the desired frequency.

As is known by one of average skill in the art, a final output frequency of a typical mixer in a radio frequency front end is based upon the product of two input signals. As such, once digital data is converted to a continuous waveform, the final output frequency will be based upon the frequency of the continuous waveform input signal to the mixer and upon the frequency of the local oscillation LO1. Thus, continuous waveform signal frequency is based upon the sample rate of digital data thereby affecting the frequency required for the local oscillation for a specified output radio frequency.

The radio frequency signal produced by radio frequency front end 3774 is then produced to power amplifier 3778 which produces a power amplified outgoing radio frequency signal to antenna 3782. In the described embodiment, power amplifier 3778 is optional and its inclusion and use depends upon a transmission distance. For specified intra-device transmissions, a power amplifier may not be required.

In a third mode, digital data 3758 is produced without upsampling to scramble module 3786 which block scrambles the outgoing digital data. The scrambled output is then produced to interleaving module 3790 that interleaves an outgoing bit stream in a specified manner. The interleaved bits are then produced to error correction coding module 3794 which is operable to perform any one of a plurality of known error correction coding techniques. Error coded bits are then produced to modulation block 3798 which produces constellation encoded digital signals to radio frequency front end 4002. Radio frequency front end 4002 then produces a radio frequency continuous waveform signal for transmission to power amplifier 4006 for power amplifying prior to radiation from antenna 4010. The radio frequency of the outgoing signal is based upon a frequency of a continuous waveform signal produced from the constellation encoded digital signals produced by modulation block 3798 and upon a frequency of oscillation of local oscillation signal LO2 received by front end 4002. In the described embodiment, the radio frequency signal has a frequency that is less than or equal to 20 GHz and is intended for inter-device transmissions to remote transceivers.

In operation, the transmission mode depends upon the destination. Thus, mode 1 transmissions may be, for example, to substrate transceivers through a dielectric substrate, mode 2 transmissions may be to an intra-device over the air wireless transmission to a transceiver formed on the same die or upon a different die within the same device, and mode 3 transmissions may be to a remote device. As such, error protection is required for the mode 3 transmissions but may not be required for mode 1 or mode 2 transmissions.

Figure 66:
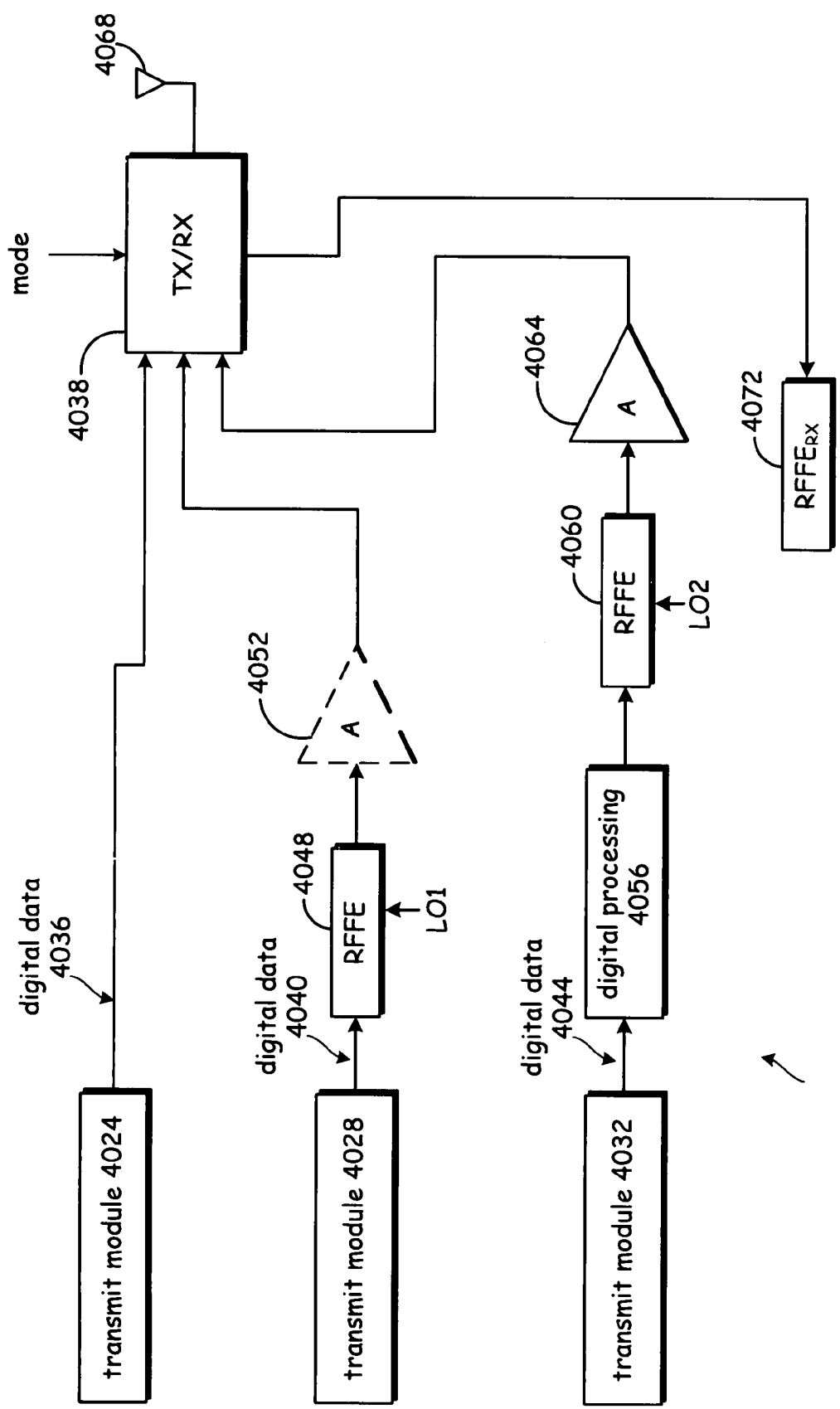
FIG. 66 is a functional block diagram of a multi-mode transmission module according to one embodiment of the invention.

FIG. 66 is a functional block diagram of a multi-mode transmission module according to one embodiment of the invention. A multi-mode transmission module 4020 includes a plurality of transmit modules 4024-4032 that produce digital data 4036-4044, respectively. A sample rate of digital data 4036-4044 depends upon the corresponding transmission destination as discussed in relation to FIG. 65. Digital data 4036 is produced at a radio frequency sample rate to transmit receive switch 4038. Transmit receive switch 4038 is formed on the same substrate, and in one embodiment, same die as transmit module 4024.

Digital data 4044 is produced at a digital data clock rate (not upsampled). Digital data 4040 is produced either at a digital data clock rate or at an upsampled data rate to match a specified intermediate frequency, or at any rate in between. Digital data 4040 is produced to radio frequency front end 4048 that produces a radio frequency continuous waveform signal having a frequency that is at least 20 GHz to an optional power amplifier 4052. Digital data 4044 is produced to digital processing block 4056 which produces error protected and constellation encoded digital signals to radio frequency front end 4060. Radio frequency front end 4060 produces a radio frequency continuous waveform signal having a frequency of 20 GHz or less to power amplifier 4064 which produces a power amplified signal for wireless transmission from antenna 4068 by way of transmit-receive switch 4038.

Transmit-receive switch 4038 is operable to select to couple any one of the three shown output transmission paths to antenna 4068 based upon a transmission mode and/or a transmission destination. For example, transmissions from transmit modules 4024 and 4028 are intra-device and perhaps within a substrate and the transmit path coupled to antenna 4068 will depend on what processing is necessary for the target destination. For example, if a digital pulse stream with a specified radio frequency sample may be used, digital data 4036 is coupled to antenna 4068. For other intra-device communications, the output of radio frequency front end 4048 or amplifier 4052 may be selected for coupling to antenna 4068. Additionally, for receive operations, ingoing RF signals may be produced from transmit-receive switch 4038 by coupling antenna 4068 to radio frequency front end 4072 of a receive module.

In the described embodiment, all shown modules and elements of multi-mode transceiver module 4020 are formed on the same substrate and, in one embodiment, on the same die. One final aspect to mention of the embodiment of FIG. 66, a radio transceiver may include only one or two of the three transmit paths shown. Further, the receive path circuitry is formed to properly decipher and recover data regardless of the transmitted form. Generally, the receive path circuitry corresponds to the transmit path circuitry.

Figure 67:
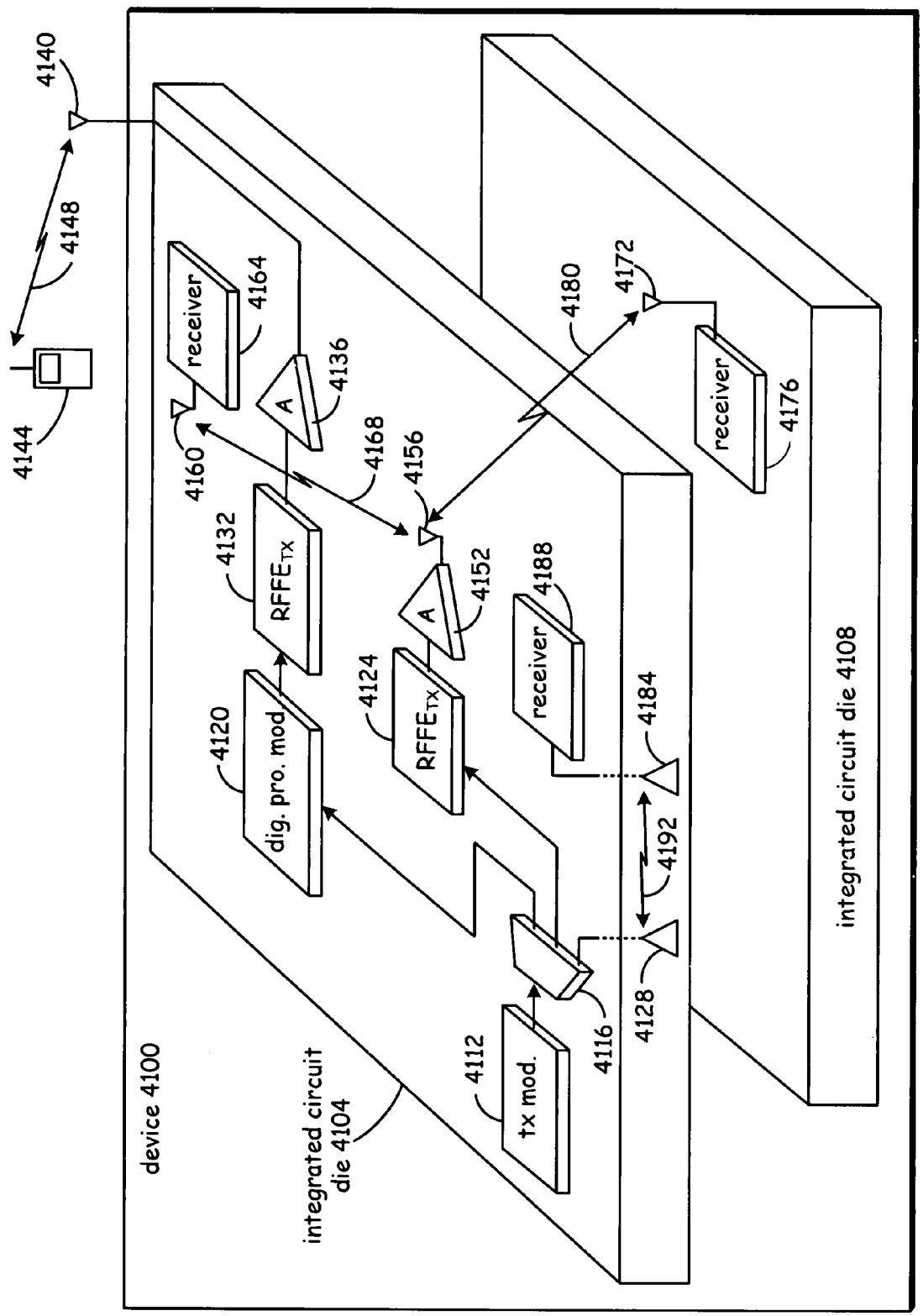
FIG. 67 is a functional block diagram that illustrates operation of a transceiver module according to one embodiment of the invention.

FIG. 67 is a functional block diagram that illustrates operation of a transceiver module according to one embodiment of the invention. A device 4100 includes integrated circuit die 4104 and 4108. Die 4104 includes a transmit processing module 4112 that produces outgoing digital data to a switch 4116 for delivery to digital processing module 4120, to radio frequency front end 4124 (optional) or to antenna 4128. As described in relation to FIG. 65, digital processing module 4120 provides error protection for digital signals that are converted to analog by radio frequency front end 4132 for power amplification by amplifier 4136 for transmission from antenna 4140 to remote transceiver 4144 by communication link 4148.

Digital data is also produced radio frequency front end 4124 which produces an analog radio frequency signal to power amplifier 4152 (optional) for transmission from antenna 4156 to antenna 4160 of receiver 4164 by way of wireless communication link 4168. Radio frequency signals may also be transmitted from antenna 4156 to antenna 4172 of receiver 4176 by way of wireless communication link 4180. As may be seen, receiver 4176 is formed on integrated circuit die 4108.

The exemplary transmissions of FIG. 67 illustrate potential communication modes that require different signal forms and power levels according to one embodiment of the invention. Communication link 4192 may comprises upsampled digital data without amplification. Communication link 4168 may require a continuous waveform radio frequency signal that has been power amplified but does not require error protection since the communication link is within a common device and is presumably substantially interference free. Alternatively, communication link 4168 may require neither power amplification or conversion to continuous waveform and may be similar to communication link 4192 which comprises unamplified digital pulses having a sample rate that is substantially equal to a specified radio frequency. In yet another embodiment, communication link may comprise an unamplified continuous waveform signal or an amplified digital signal having an upsampled pulse rate that is substantially equal to a specified radio frequency.

Communication link 4180 is similar to 4168. Because, however, communication link 4180 may comprise a greater transmission distance, the form of the signal may be different may be different than 4168 (either continuous or power amplified or both). Error protection is not required, however, for communication link 4180 since it is relative protected by being within the same device 4100. Thus, FIG. 67 illustrates a multi-mode transceiver module formed all within a common substrate (and even with a common die) to support inter-device and intra-device wireless communications over air or through a substrate material.

Figure 68:
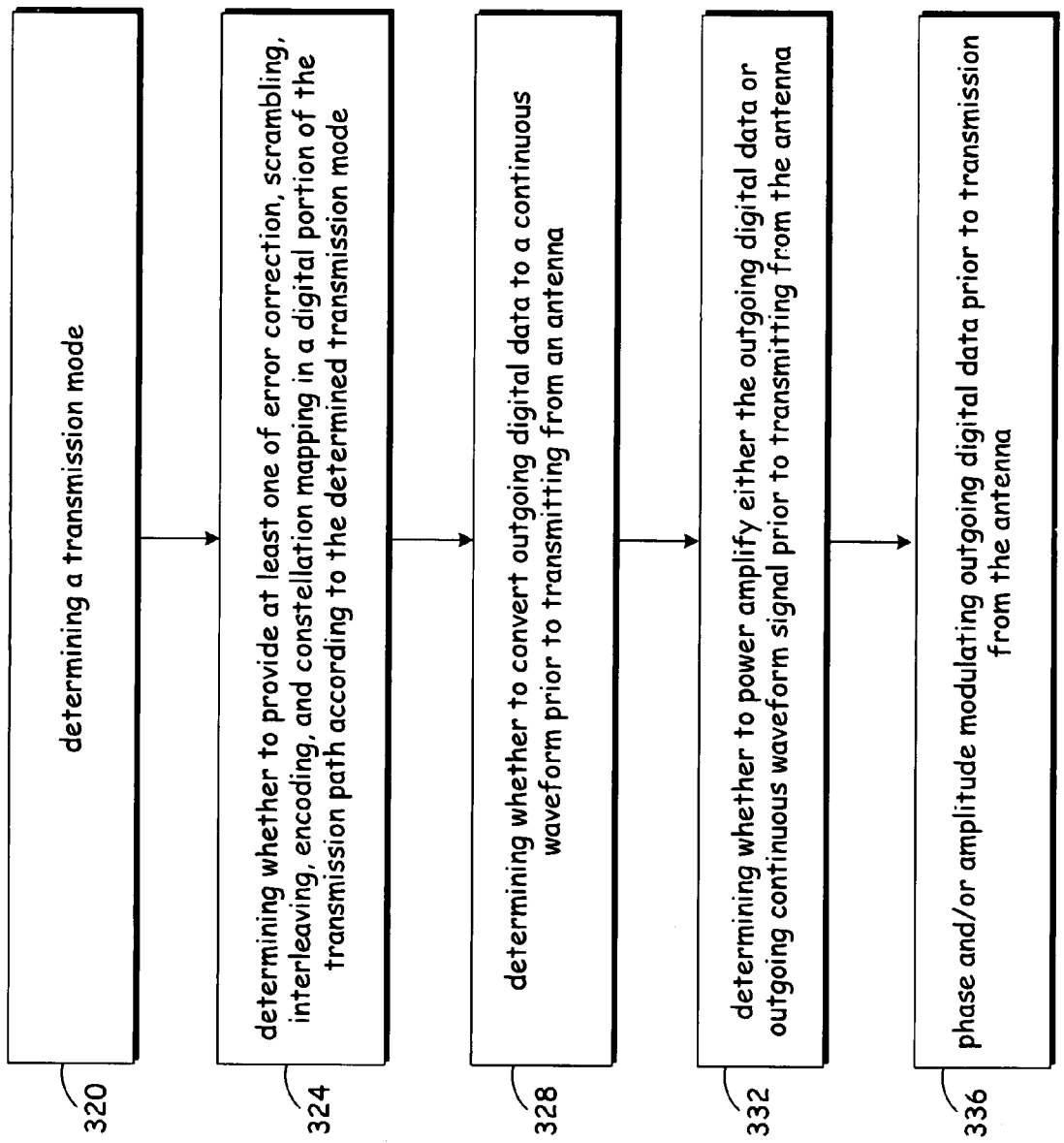
FIG. 68 is a flow chart illustrating a method for transmitting a wireless communication signal according to one embodiment of the invention.

FIG. 68 is a flow chart illustrating a method for transmitting a wireless communication signal according to one embodiment of the invention. The method includes initially determining a transmission mode (step 320) and determining whether to provide at least one of error correction, scrambling, interleaving, encoding, and constellation mapping in a digital portion of the transmission path according to the determined transmission mode (step 324). If so, the method includes traditional digital and analog signal processing to produce a power amplified radio frequency signal for transmission.

Thereafter, the method includes determining whether to convert outgoing digital data to a continuous waveform prior to transmitting from an antenna (step 328) and determining whether to power amplify either the outgoing digital data or outgoing continuous waveform signal prior to transmitting from the antenna (step 332). The logic for making these determinations is based upon a transmission distance for a specified receiver and whether necessary for the specified receiver based upon the expected distance and interference level for transmissions to the receiver. Generally, such analysis results in determination of a transmission mode as described herein. Additionally, the method optionally includes phase and/or amplitude modulating outgoing digital data and transmitting the phase and/or amplitude modulated digital data from the antenna (step 336). Such modulation may be implemented to include data rates of digital data being wirelessly transmitted over air or through a substrate.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. Moreover, the various embodiments illustrated in the Figures may be partially combined to create embodiments not specifically described but considered to be part of the invention. For example, specific aspects of any one embodiment may be combined with another aspect of another embodiment or even with another embodiment in its entirety to create a new embodiment that is a part of the inventive concepts disclosed herein this specification. As may be seen, the described embodiments may be modified in many different ways without departing from the scope or teachings of the invention.

The invention claimed is:

1. A multi-mode transceiver, comprising:
a substrate in a package;
a bare die formed on the substrate, the bare die including a transmit module operably disposed to receive outgoing pulses that represent digital data and a receive module operable to produce ingoing data pulses, wherein the transmit and receive modules are formed on the bare die;
at least one antenna formed on the packaged substrate and sized to transmit and receive very high radio frequency signals having a frequency that is at least 20 GHz wherein both the transmit and receive modules are both operably coupled to the at least one antenna; and
a transmit processing module operable to provide routine digital signal processing for inter-device transmissions to a remote device wherein the routine signal processing includes at least one of scrambling, interleaving, forward error correction coding, and QPSK or higher order modulation encoding, wherein the transmit processing module is operable generate a radio frequency signal characterized by a frequency of greater than or equal to 20 GHz and a transmission power level adequate for transmissions through a dielectric substrate to reach a substrate receiver, and wherein the transmit processing module is operable to produce upsampled digital signals and further wherein the upsampled digital signals are phase shifted to one of two phase values based upon a data value of a data bit being transmitted.

2. The multi-mode transceiver of claim 1 further including a transmit-receive switch operably disposed to select between an output of the transmit module and an input of the receive module wherein the transmit-receive switch is formed on the substrate that includes the bare die.

3. The multi-mode transceiver of claim 1 wherein the transmit module includes a transmit processing module and wherein the receive module comprises a receive processing module wherein the transmit processing module is operable to receive and upsample the outgoing digital pulses to produce outgoing digital pulses having a sample rate that substantially matches the transmit frequency of the antenna formed to transmit the very high radio frequency signals and wherein the receive processing module is operable to receive wirelessly transmitted upsampled digital pulses and is operable to recover and decimate the upsampled digital pulses to produce digital pulses that represent the digital data.

4. The multi-mode transceiver of claim 3 wherein the transmit processing module is configurable based upon a transmission mode wherein:
in a first transmission mode, the transmit processing module operably couples logic to provide at least one of error correction, scrambling, interleaving, encoding, and constellation mapping in a digital portion of a transmission path; and
in a second transmission mode, the transmit processing module operably couples logic to receive outgoing digital pulses to upsample the outgoing digital pulses to produce outgoing digital pulses having a sample rate that substantially matches the transmit frequency of the antenna formed to transmit the very high radio frequency signals, wherein the transmit processing module produces the upsampled outgoing digital pulses for transmission from the at least one antenna.

5. The multi-mode transceiver of claim 4 wherein the outgoing digital pulses are produced directly from the transmit processing module to the antenna in the second-transmission mode.

6. The multi-mode transceiver of claim 4 further including a transmit-receive switch operably disposed between the antenna and the and the transmit processing module wherein, in the second transmission mode, the outgoing digital pulses are produced directly from the transmit processing module to the transmit-receive switch in the second transmission mode and from the transmit-receive switch to the antenna.

7. The multi-mode transceiver of claim 4 further including a power amplifier wherein the upsampled outgoing digital pulses are produced, in the second transmission mode, from the transmit processing module in the second transmission mode to the power amplifier and from the power amplifier to the antenna.

8. The multi-mode transceiver of claim 4 further including a transmit-receive switch coupled to the antenna and a power amplifier operably disposed between the transmit-receive switch and the transmit processing module wherein the outgoing digital pulses are produced, in the second transmission mode, from the transmit processing module to the power amplifier and from the power amplifier to the transmit-receive switch coupled to the antenna.

9. The multi-mode transceiver of claim 1 wherein the transmit processing module generates an outgoing radio frequency signal characterized by a frequency of less than or equal to 20 GHz and a transmission power level adequate to reach the remote device and wherein the at least one antenna is operably sized to wirelessly transmit the outgoing radio frequency signal.

10. The multi-mode transceiver of claim 1 wherein the transmit processing module operable to generate a radio frequency signal characterized by a frequency of greater than or equal to 20 GHz and a transmission power level adequate reach the local intra-device receiver.

11. The multi-mode transceiver of claim 1 wherein the transmit processing module is operable to produce an upsampled digital signals and further wherein the upsampled digital signals are amplitude shifted to one of plurality of levels based upon a data value being transmitted.

12. The multi-mode transceiver of claim 1 further comprising multi-mode radio frequency front end circuitry operable to convert an outgoing digital signal to a continuous waveform and to produce an outgoing radio frequency signal for transmissions to remote devices at a frequency that is less than or equal to 20 GHz and to local intra-device receivers at a frequency that is greater than or equal 20 GHz.

13. The multi-mode transceiver of claim 1 further comprising transmit processing logic operable to provide at least one of scrambling, interleaving, error correction coding, and QPSK or higher order modulation encoding for transmissions to remote inter-device receivers at a frequency that is less than or equal 20 GHz.

14. The multi-mode transceiver of claim 1 wherein the transmit module is operable to produce an upsampled digital signal to the at least one antenna for wireless transmissions to a first destination and radio frequency signals for wireless transmissions to a second destination.

15. The multi-mode transceiver of claim 14 wherein the transmit module operably couples transmit processing logic according to destination wherein error protection logic is coupled to manipulate outgoing digital signals only for transmissions to the second destination.

16. A multi-mode transceiver, comprising:
a substrate in a package;
a bare die formed on the substrate, the bare die including a transmit module operably disposed to receive outgoing pulses that represent digital data and a receive module operable to produce ingoing data pulses, wherein the transmit and receive modules are formed on the bare die;
at least one antenna formed on the packaged substrate and sized to transmit and receive very high radio frequency signals having a frequency that is at least 20 GHz, wherein both the transmit and receive modules are both operably coupled to the at least one antenna; and
a transmit processing module operable to provide routine digital signal processing for inter-device transmissions to a remote device wherein the routine signal processing includes at least one of scrambling, interleaving, forward error correction coding, and QPSK or higher order modulation encoding, wherein the transmit processing module is operable generate a radio frequency signal characterized by a frequency of greater than or equal to 20 GHz and a transmission power level adequate for transmissions through a dielectric substrate to reach a substrate receiver, and wherein the transmit processing module is operable to produce upsampled digital signals and further wherein the upsampled digital signals are phase shifted to at least four phase values based upon a data value of a data bit being transmitted.

17. The multi-mode transceiver of claim 16 further including a transmit-receive switch operably disposed to select between an output of the transmit module and an input of the receive module wherein the transmit-receive switch is formed on the substrate that includes the bare die.

18. The multi-mode transceiver of claim 16 wherein the transmit module includes a transmit processing module and wherein the receive module comprises a receive processing module wherein the transmit processing module is operable to receive and upsample the outgoing digital pulses to produce outgoing digital pulses having a sample rate that substantially matches the transmit frequency of the antenna formed to transmit the very high radio frequency signals and wherein the receive processing module is operable to receive wirelessly transmitted upsampled digital pulses and is operable to recover and decimate the upsampled digital pulses to produce digital pulses that represent the digital data.

19. The multi-mode transceiver of claim 18 wherein the transmit processing module is configurable based upon a transmission mode wherein:
in a first transmission mode, the transmit processing module operably couples logic to provide at least one of error correction, scrambling, interleaving, encoding, and constellation mapping in a digital portion of a transmission path; and
in a second transmission mode, the transmit processing module operably couples logic to receive outgoing digital pulses to upsample the outgoing digital pulses to produce outgoing digital pulses having a sample rate that substantially matches the transmit frequency of the antenna formed to transmit the very high radio frequency signals, wherein the transmit processing module produces the upsampled outgoing digital pulses for transmission from the at least one antenna.

20. The multi-mode transceiver of claim 18 wherein the outgoing digital pulses are produced directly from the transmit processing module to the antenna in the second-transmission mode.

21. The multi-mode transceiver of claim 18 further including a transmit-receive switch operably disposed between the antenna and the and the transmit processing module wherein, in the second transmission mode, the outgoing digital pulses are produced directly from the transmit processing module to the transmit-receive switch in the second transmission mode and from the transmit-receive switch to the antenna.

22. The multi-mode transceiver of claim 18 further including a power amplifier wherein the upsampled outgoing digital pulses are produced, in the second transmission mode, from the transmit processing module in the second transmission mode to the power amplifier and from the power amplifier to the antenna.

23. The multi-mode transceiver of claim 18 further including a transmit-receive switch coupled to the antenna and a power amplifier operably disposed between the transmit-receive switch and the transmit processing module wherein the outgoing digital pulses are produced, in the second transmission mode, from the transmit processing module to the power amplifier and from the power amplifier to the transmit-receive switch coupled to the antenna.

24. The multi-mode transceiver of claim 16 wherein the transmit processing module generates an outgoing radio frequency signal characterized by a frequency of less than or equal to 20 GHz and a transmission power level adequate to reach the remote device and wherein the at least one antenna is operably sized to wirelessly transmit the outgoing radio frequency signal.

25. The multi-mode transceiver of claim 16 wherein the transmit processing module operable to generate a radio frequency signal characterized by a frequency of greater than or equal to 20 GHz and a transmission power level adequate reach the local intra-device receiver.

26. The multi-mode transceiver of claim 16 wherein the transmit processing module is operable to produce an upsampled digital signals and further wherein the upsampled digital signals are amplitude shifted to one of plurality of levels based upon a data value being transmitted.

27. The multi-mode transceiver of claim 16 further comprising multi-mode radio frequency front end circuitry operable to convert an outgoing digital signal to a continuous waveform and to produce an outgoing radio frequency signal for transmissions to remote devices at a frequency that is less than or equal to 20 GHz and to local intra-device receivers at a frequency that is greater than or equal 20 GHz.

28. The multi-mode transceiver of claim 16 further comprising transmit processing logic operable to provide at least one of scrambling, interleaving, error correction coding, and QPSK or higher order modulation encoding for transmissions to remote inter-device receivers at a frequency that is less than or equal 20 GHz.

29. The multi-mode transceiver of claim 16 wherein the transmit module is operable to produce an upsampled digital signal to the at least one antenna for wireless transmissions to a first destination and radio frequency signals for wireless transmissions to a second destination.

30. The multi-mode transceiver of claim 29 wherein the transmit module operably couples transmit processing logic according to destination wherein error protection logic is coupled to manipulate outgoing digital signals only for transmissions to the second destination.

31. A multi-mode transceiver, comprising:
a substrate in a package;
a bare die formed on the substrate, the bare die including a transmit module operably disposed to receive outgoing pulses that represent digital data and a receive module operable to produce ingoing data pulses, wherein the transmit and receive modules are formed on the bare die;
at least one antenna formed on the packaged substrate and sized to transmit and receive very high radio frequency signals having a frequency that is at least 20 GHz, wherein both the transmit and receive modules are both operably coupled to the at least one antenna; and
a transmit processing module operable to provide routine digital signal processing for inter-device transmissions to a remote device wherein the routine signal processing includes at least one of scrambling, interleaving, forward error correction coding, and QPSK or higher order modulation encoding, wherein the transmit processing module is operable generate a radio frequency signal characterized by a frequency of greater than or equal to 20 GHz and a transmission power level adequate for transmissions through a dielectric substrate to reach a substrate receiver, and wherein the transmit processing module is operable to produce an upsampled digital signals and further wherein the upsampled digital signals are amplitude shifted to one of plurality of levels based upon a data value being transmitted.

* * * * *

UNITED STATES PATENT AND TRADEMARK OFFICE
CERTIFICATE OF CORRECTION

PATENT NO. : 8,351,982 B2  
APPLICATION NO. : 11/805563  
DATED : January 8, 2013  
INVENTOR(S) : Ahmadreza Rofougaran Page 1 of 1

It is certified that error appears in the above-identified patent and that said Letters Patent is hereby corrected as shown below:

In the Claims  
Col. 64, line 54, in claim 1: after "module is operable" insert --to--  
Col. 65, line 37, in claim 6: after "antenna" delete the first occurrence of "and the"  
Col. 65, line 64, in claim 10: after "processing module" insert --is--  
Col. 66, line 2, in claim 11: after "to produce" delete "an"  
Col. 66, line 4, in claim 11: after "shifted to one of" insert --a--  
Col. 66, line 12, in claim 12: after "greater than or equal" insert --to--  
Col. 66, line 18, in claim 13: after "or equal" insert --to--  
Col. 66, line 47, in claim 16: after "module is operable" insert --to--  
Col. 67, line 30, in claim 21: after "antenna" delete the first occurrence of "and the"  
Col. 67, line 57, in claim 25: after "module" insert --is--  
Col. 68, line 1, in claim 25: after "adequate" insert --to--  
Col. 68, line 4, in claim 26: after "to produce" delete "an"  
Col. 68, line 6, in claim 26: after "shifted to one of" insert --a--  
Col. 68, line 14, in claim 27: after "greater than or equal" insert --to--  
Col. 68, line 20, in claim 28: after "or equal" insert --to--  
Col. 68, line 49, in claim 31: after "module is operable" insert --to--  
Col. 68, line 54, in claim 31: after "to produce" delete "an"  
Col. 68, line 56, in claim 31: after "shifted to one of" insert --a--

Signed and Sealed this  
Fourteenth Day of January, 2014

Michelle K. Lee  
*Deputy Director of the United States Patent and Trademark Office*